(12) United States Patent
Takahara et al.

(10) Patent No.: US 11,432,437 B2
(45) Date of Patent: Aug. 30, 2022

(54) POWER CONVERTER

(71) Applicant: Mitsubishi Electric Corporation, Chiyoda-ku (JP)

(72) Inventors: Takaaki Takahara, Chiyoda-ku (JP);
Satoshi Murakami, Chiyoda-ku (JP);
Ryota Kondo, Chiyoda-ku (JP);
Hiroyasu Iwabuki, Chiyoda-ku (JP);
Hiroyuki Higashino, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 861 days.

(21) Appl. No.: 16/316,126

(22) PCT Filed: Jun. 21, 2017

(86) PCT No.: PCT/JP2017/022780
§ 371 (c)(1),
(2) Date: Jan. 8, 2019

(87) PCT Pub. No.: WO2018/037690
PCT Pub. Date: Mar. 1, 2018

(65) Prior Publication Data
US 2020/0267871 A1    Aug. 20, 2020

(30) Foreign Application Priority Data

Aug. 22, 2016   (JP) .............................. JP2016-162040

(51) Int. Cl.
*H05K 7/20*    (2006.01)
*H01F 27/22*   (2006.01)
(Continued)

(52) U.S. Cl.
CPC ............. *H05K 7/209* (2013.01); *H01F 27/22* (2013.01); *H01F 27/24* (2013.01);
(Continued)

(58) Field of Classification Search
CPC ...... H05K 1/0204; H05K 1/165; H05K 7/209; H01F 27/22; H01F 27/24; H01F 27/2804; H01F 2027/2809
See application file for complete search history.

(56) References Cited

U.S. PATENT DOCUMENTS 6,313,598 B1   11/2001  Tamba et al.
9,101,082 B1    8/2015  Dorenkamp et al.
(Continued)

FOREIGN PATENT DOCUMENTS

EP    1342305       6/2002
JP    2008-60111 A  3/2008
(Continued)

OTHER PUBLICATIONS

Chinese Office Action dated Apr. 23, 2020 in Chinese Patent Application No. 201780049928.0.
(Continued)

*Primary Examiner* — Jacob R Crum
(74) *Attorney, Agent, or Firm* — Xsensus LLP

(57) ABSTRACT

A power conversion device includes: a main body including a substrate to which a power conversion unit and a coil are provided; and a first heat dissipation portion which holds the substrate and dissipates heat of the substrate, wherein the substrate is formed by one sheet, the coil is formed integrally with the substrate, the first heat dissipation portion is fixed to a substrate first surface of the substrate, a heat dissipation second surface of the first heat dissipation portion has a coil cooling portion opposed to and abutting on a part where the coil is formed, of the substrate.

19 Claims, 40 Drawing Sheets

(51) Int. Cl.
    *H01F 27/24*     (2006.01)
    *H01F 27/28*     (2006.01)
    *H02M 3/158*     (2006.01)
    *H02M 3/335*     (2006.01)
    *H05K 1/02*     (2006.01)
    *H05K 1/16*     (2006.01)

(52) U.S. Cl.
    CPC ........ *H01F 27/2804* (2013.01); *H02M 3/158* (2013.01); *H02M 3/33584* (2013.01); *H05K 1/0204* (2013.01); *H05K 1/165* (2013.01); *H01F 2027/2809* (2013.01)

(56) References Cited

U.S. PATENT DOCUMENTS

| | | | | |
|---|---|---|---|---|
| 9,484,145 | B2* | 11/2016 | Liu | H01F 27/346 |
| 9,608,528 | B2* | 3/2017 | Nakazawa | H02M 1/44 |
| 2007/0053157 | A1* | 3/2007 | Huang | H05K 9/005 |
| | | | | 361/688 |
| 2010/0164670 | A1 | 7/2010 | Nakahori et al. | |
| 2011/0234196 | A1* | 9/2011 | Chiba | H05K 1/0215 |
| | | | | 323/311 |
| 2013/0301312 | A1 | 11/2013 | Konishi et al. | |
| 2015/0048917 | A1* | 2/2015 | Uchiyama | H01F 27/2804 |
| | | | | 336/200 |
| 2015/0357923 | A1 | 12/2015 | Nakazawa et al. | |
| 2016/0035481 | A1* | 2/2016 | Hachiya | H01F 37/00 |
| | | | | 336/61 |

FOREIGN PATENT DOCUMENTS

| | | |
|---|---|---|
| JP | 2010-153724 A | 7/2010 |
| JP | WO 2012/108221 A1 | 8/2012 |
| JP | 2013-118308 A | 6/2013 |
| JP | 2013-215053 A | 10/2013 |
| WO | WO 00/16398 A1 | 3/2000 |
| WO | WO 2015/107769 A1 | 7/2015 |

OTHER PUBLICATIONS

Extended European Search Report dated Mar. 16, 2020 in European Application No. 17843178.9.
International Search Report dated Jul. 25, 2017 in PCT/JP2017/022780 filed on Jun. 21, 2017.

* cited by examiner

POWER CONVERTER

TECHNICAL FIELD

The present invention relates to a power conversion device such as a bidirectional DC-DC converter.

BACKGROUND ART

As a conventional power conversion device, there is known an insulated switching power supply device in which a first circuit substrate having a primary winding formed as a coil pattern by patterning with a conductive film, and a second circuit substrate having a secondary winding which is also formed as a coil pattern by patterning with a conductive film, are provided so as to be laminated, a core is provided which penetrates the first circuit substrate and the second circuit substrate such that both of the primary winding and the secondary winding are wound around the core, and a heat dissipation member for dissipating heat from a transformer T (core) is provided (see, for example, Patent Document 1).

In addition, the following heat dissipation substrate used for a power supply unit as a power conversion device is disclosed. On a metal plate, a sheet-like heat conductive resin portion is fixed in which a lead frame is embedded in a wiring pattern. Using, as a wiring pattern, the lead frame embedded in the sheet-like heat conductive resin portion, a power device, a capacitor, and the like are mounted on a surface of the lead frame. Semicircular ferrite cores are respectively provided on the upper and lower sides of the metal plate and the sheet-like heat conductive resin portion (see, for example, Patent Document 2).

CITATION LIST

Patent Document

Patent Document 1: International Publication No. WO2012/108221
Patent Document 2: Japanese Laid-Open Patent Publication No. 2008-60111

SUMMARY OF THE INVENTION

Problems to be Solved by the Invention

The insulated switching power supply device as a conventional power conversion device, described in Patent Document 1, is configured as described above and performs heat dissipation by the heat dissipation member in contact with the core. However, since the heat dissipation member is merely in contact with the core, heat generated at the first circuit substrate and the second circuit substrate is not effectively transferred to the heat dissipation member. Therefore, there is a problem that, for example, in a power conversion device using comparatively large power such as an on-vehicle charger for charging an on-vehicle high-voltage battery used in an electric car or an on-vehicle step-down converter for charging an on-vehicle lead battery, it is difficult to effectively dissipate heat generated at a coil pattern as a winding formed on a substrate.

In addition, there is a problem that the size of the power conversion device is enlarged in the height direction because two substrates, i.e., the first circuit substrate and the second circuit substrate, are provided so as to be laminated.

The heat dissipation substrate used in the power supply unit as a conventional power conversion device, described in Patent Document 2, is configured with ferrite cores provided on the upper and lower sides of the metal plate. Therefore, in the case of mounting such a heat dissipation substrate to another electric apparatus, it is necessary to store the heat dissipation substrate in a housing for protecting the ferrite cores, before mounting the heat dissipation substrate to the electric apparatus. In this case, silicone grease or the like is applied between the housing and the metal plate of the heat dissipation substrate in order to ensure adhesion and thermal conductivity between the metal plate and the housing. Heat generated at the heat dissipation substrate is dissipated by being transferred to the housing from the metal plate of the heat dissipation substrate. However, since the thermal resistance of the silicone grease is higher than that of the metal plate, there is a problem that heat dissipation property is deteriorated due to presence of the silicone grease.

The present invention has been made to solve the above problems, and an object of the present invention is to obtain a thin power conversion device that enables effective dissipation of heat generated at a coil of the power conversion device which is formed at a substrate.

Solution to the Problems

A power conversion device according to the present invention is a power conversion device including: a main body including a substrate to which a power conversion unit and a coil are provided; and a first heat dissipation portion which holds the substrate and dissipates heat of the substrate. The substrate is formed by one sheet. The coil is formed integrally with the substrate and connected to the power conversion unit. The first heat dissipation portion is fixed to a substrate first surface, of the substrate, which is on a first direction side in a thickness direction of the substrate. A heat dissipation second surface, of the first heat dissipation portion, which is on a second direction side opposite to the first direction side has a coil cooling portion opposed to and abutting on a part where the coil is formed, of the substrate. A heat dissipation first surface on the first direction side of the first heat dissipation portion is formed to be an outermost peripheral surface on the first direction side of the power conversion device.

Effect of the Invention

In the power conversion device according to the present invention, the substrate used for the main body of the power conversion device is formed by one sheet, and the first heat dissipation portion having the coil cooling portion is provided. Therefore, a thin power conversion device that enables effective dissipation of heat generated at the coil can be obtained.

BRIEF DESCRIPTION OF THE DRAWINGS

FIG. 35 is a sectional view showing the structure of a major part of a power conversion device according to embodiment 23 of the present invention.

FIG. 36 is a sectional view showing the structure of a major part of the power conversion device according to embodiment 23 of the present invention.

DESCRIPTION OF EMBODIMENTS

Embodiment 1

Figure 1:
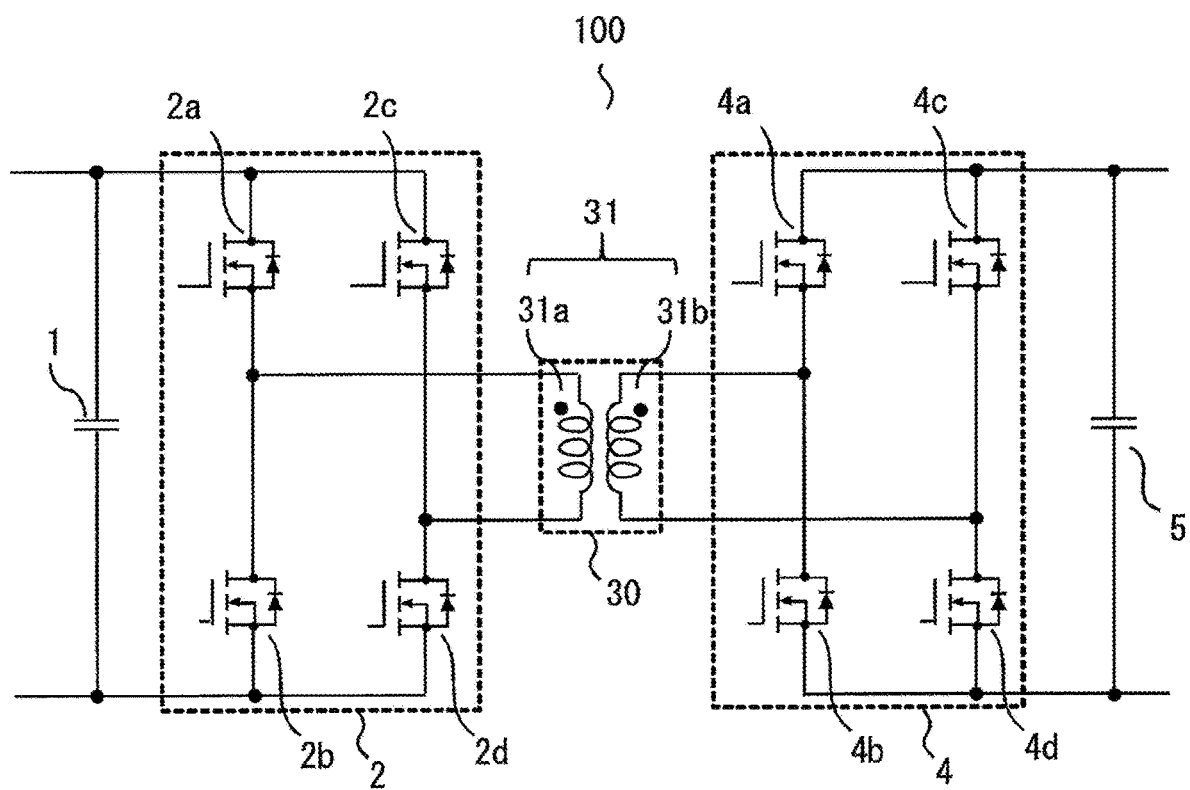
FIG. 1 is a circuit diagram showing a circuit configuration of a power conversion device according to embodiment 1 of the present invention.
Figure 2:
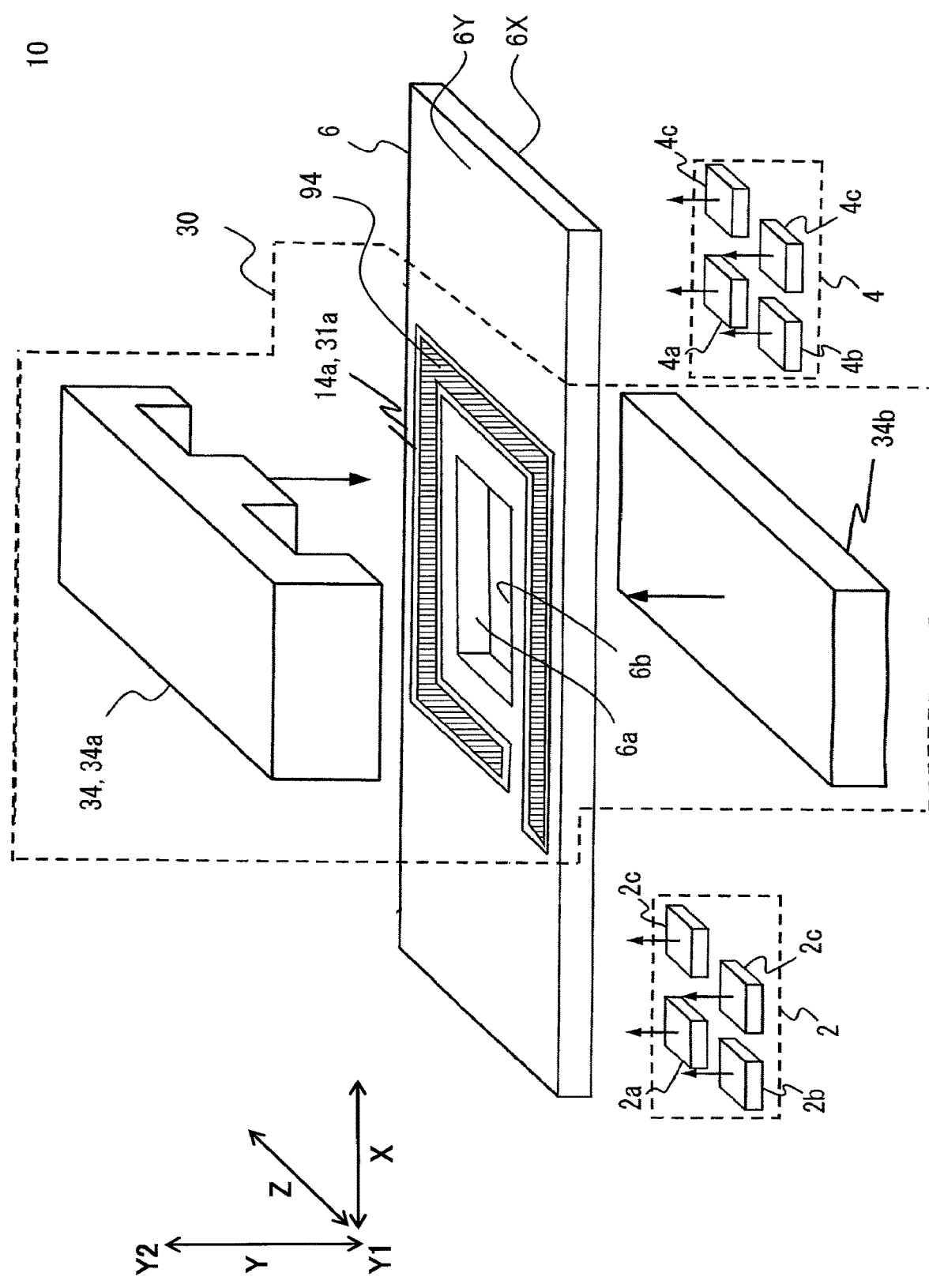
FIG. 2 is a perspective view showing a main body of the power conversion device according to embodiment 1 of the present invention.
Figure 3:
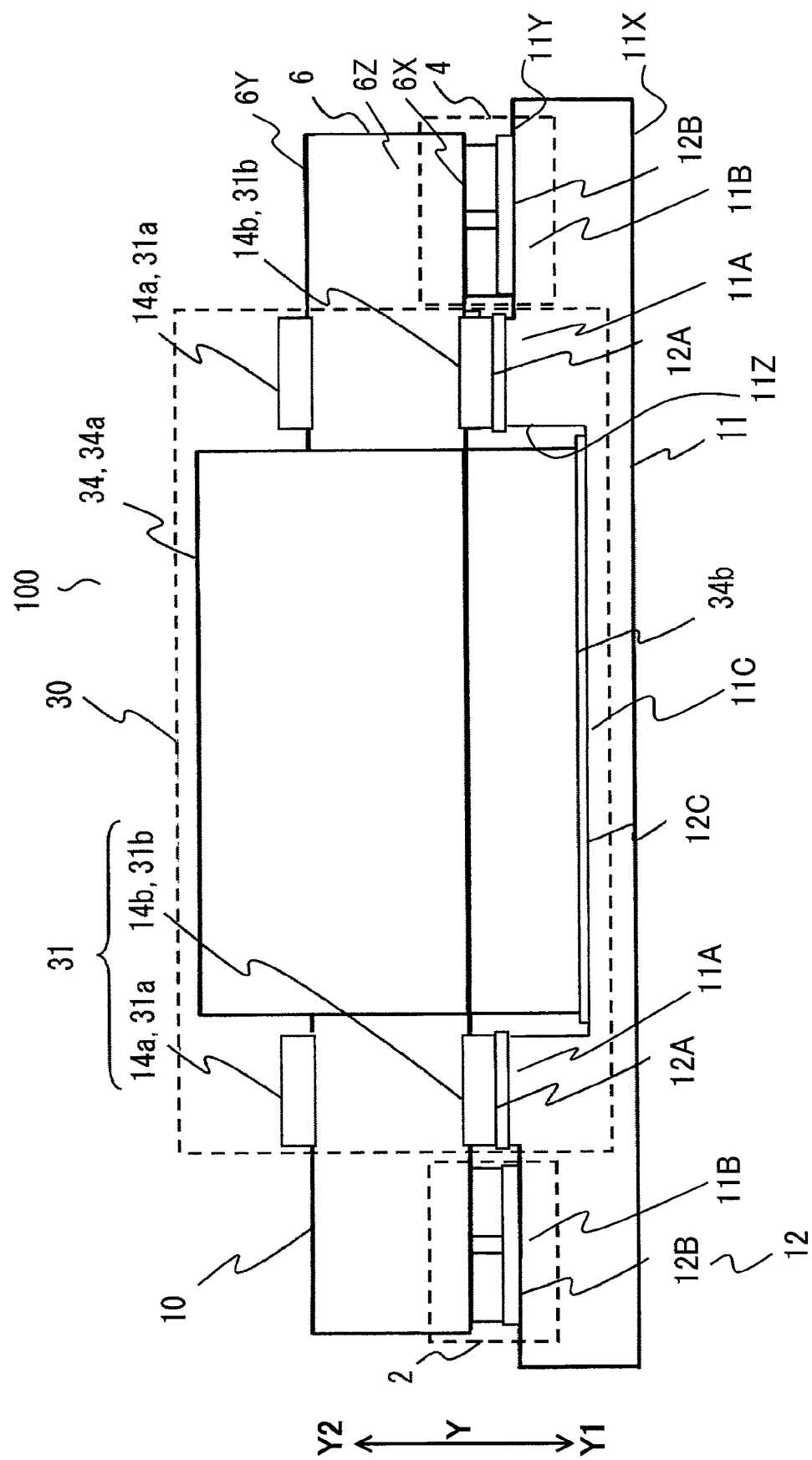
FIG. 3 is a sectional view showing the structure of the power conversion device according to embodiment 1 of the present invention.

FIG. 1 to FIG. 3 show embodiment 1 for carrying out the present invention.

FIG. 1 is a circuit diagram showing a circuit of a power conversion device.

FIG. 2 is a perspective view showing a main body 10 forming the power conversion device.

FIG. 3 is a sectional view showing the structure of the power conversion device.

First, the circuit configuration of a power conversion device 100 will be described with reference to FIG. 1.

In FIG. 1, the power conversion device 100 is an insulated DC-DC converter and is configured by connecting a capacitor 1, a first power conversion unit 2 as a power conversion unit, a transformer 30, a second power conversion unit 4 as a power conversion unit, and a capacitor 5.

A switching element 2a and a switching element 2b as power conversion elements are connected in series to form a first leg. A switching element 2c and a switching element 2d as power conversion elements are connected in series to form a second leg. The first power conversion unit 2 is formed by connecting the first leg and the second leg in parallel.

A switching element 4a and a switching element 4b as power conversion elements are connected in series to form a third leg. A switching element 4c and a switching element 4d as power conversion elements are connected in series to form a fourth leg. The second power conversion unit 4 is formed by connecting the third leg and the fourth leg in parallel.

The switching elements 2a to 2d and the switching elements 4a to 4d each have a switching element main body and a feedback diode. More specifically, in the present embodiment, as the switching elements 2a to 2d and the switching elements 4a to 4d, a MOSFET (Metal Oxide Semiconductor Field Effect Transistor) in which a diode is included is used. It is noted that the switching elements are not limited to a MOSFET, but may be semiconductor elements using an IGBT (Insulated Gate Bipolar Transistor) with a diode connected in antiparallel between the collector and the emitter.

The transformer 30 is a single-phase transformer and has a transformer coil 31 as a coil. The transformer coil 31 includes a first transformer coil 31a and a second transformer coil 31b.

The first leg and the second leg of the first power conversion unit 2 are connected in parallel to the capacitor 1. One end of the first transformer coil 31a which is a primary-side transformer coil of the transformer 30 is connected to the connection point between the switching element 2a and the switching element 2b, and the other end thereof is connected to the connection point between the switching element 2c and the switching element 2d. One end of the second transformer coil 31b which is a secondary-side transformer coil of the transformer 30 is connected to the connection point between the switching element 4a and the switching element 4b of the second power conversion unit 4, and the other end thereof is connected to the connection point between the switching element 4c and the switching element 4d. The capacitor 5 is connected in parallel to the third leg and the fourth leg which compose the second power conversion unit 4 and are connected in parallel.

The first power conversion unit 2 converts DC power supplied from a DC power supply (not shown) to the capacitor 1, to high-frequency AC power. Then, the first power conversion unit 2 applies the converted high-frequency AC power, between both ends of the first transformer coil 31a of the transformer 30. That is, DC-to-AC power conversion is performed. Between both ends of the second transformer coil 31b, AC voltage according to the turns ratio of the first transformer coil 31a and the second transformer coil 31b is induced. In the present embodiment, the turns ratio is 1:1, and the primary side and the secondary side are insulated from each other. The second power conversion unit 4 rectifies the AC voltage induced between both ends of the second transformer coil 31b, and outputs the resultant voltage to the capacitor 5. That is, AC-to-DC power conversion is performed. A load such as a battery (not shown) is connected in parallel to the capacitor 5, and DC power with converted voltage is supplied from the DC power supply to the load.

Next, the structure of the main body 10 of the power conversion device 100 in a state in which the first power conversion unit 2, the transformer 30, and the second power conversion unit 4 which are components constituting the circuit of the power conversion device 100 shown in FIG. 1 are mounted on a substrate, will be described with reference to FIG. 2.

The main body 10 of the power conversion device 100 includes: a plate-shaped substrate 6 having a single-sheet structure and made of an insulating material; the transformer 30; the first power conversion unit 2; and the second power conversion unit 4.

The transformer 30 has a transformer core 34 as a core.

A downward side in a thickness direction Y of the substrate 6 is defined as a first direction side Y1. An upward side in the thickness direction Y of the substrate 6, i.e., a side opposite to the first direction side Y1, is defined as a second direction side Y2.

A surface on the first direction side Y1 of the substrate 6 is defined as a substrate first surface 6X. A surface on the second direction side Y2 of the substrate 6 is defined as a substrate second surface 6Y. The thickness direction Y of the substrate 6 is the same direction as the height direction of the power conversion device 100.

A direction perpendicular to the thickness direction Y of the substrate 6 is defined as a width direction X. The width direction X is the same direction as the width direction of the power conversion device 100.

A direction perpendicular to the thickness direction Y and the width direction X of the substrate 6 is defined as a depth direction Z. The depth direction Z is the same direction as the depth direction of the power conversion device 100.

In the descriptions of the embodiments subsequent to the present embodiment 1, the same directions as the respective directions of the power conversion device 100 shown above are represented by the thickness direction Y, the width direction X, and the depth direction Z, respectively, in the same manner.

The substrate first surface 6X and the substrate second surface 6Y of the substrate 6 have wiring layers where conductor patterns are formed, and an insulating layer 6Z is provided between the substrate first surface 6X and the substrate second surface 6Y.

The substrate 6 has a through hole 6b as an opening which opens in the thickness direction Y of the substrate 6. The through hole 6b has a rectangular shape and is formed by a hole forming portion 6a.

On the substrate second surface 6Y side of the substrate 6, a transformer coil pattern 14a serving as the first transformer coil 31a wound by one turn is formed in a spiral shape by a conductor pattern concentrically with the hole forming portion 6a. As shown in FIG. 2, the through hole 6b is provided at the center of the transformer coil pattern 14a.

Although not shown in FIG. 2, on the substrate first surface 6X side of the substrate 6, a transformer coil pattern 14b serving as the second transformer coil 31b wound by one turn is formed in a spiral shape by a conductor pattern. The transformer coil pattern 14b is formed concentrically with the hole forming portion 6a, i.e., concentrically with the transformer coil pattern 14a, and so as to be opposed to the first transformer coil 31a in the thickness direction Y via the substrate 6. Thus, the transformer coil 31 of the transformer 30 is formed integrally with the substrate 6 by the transformer coil pattern 14a and the transformer coil pattern 14b.

The transformer core 34 of the transformer 30 is a single-phase three-leg transformer core, and includes a first transformer core member 34a having an E-shaped cross section in the depth direction Z of the substrate 6, and a second transformer core member 34b having a flat plate shape. The first transformer core member 34a and the second transformer core member 34b are formed by molding soft magnetic ferrite. As shown in FIG. 2, the transformer core 34 is mounted to the substrate 6 such that the center leg of the first transformer core member 34a penetrates the through hole 6b and both side legs thereof are located on outer sides of the substrate 6. That is, the center leg of the first transformer core member 34a penetrates through the center of the transformer coil pattern 14a and the center of the transformer coil pattern 14b.

As described above, the transformer core 34 is provided to the through hole 6b, to form a magnetic core for the transformer coil 31 (first transformer coil 31a, second transformer coil 31b).

At the left in FIG. 2 on the substrate first surface 6X side of the substrate 6, the switching elements 2a to 2d are mounted (fixed) so as to be distributed in a rectangular form as a whole. At the right on the substrate first surface 6X side of the substrate 6, the switching elements 4a to 4d are mounted so as to be distributed in a rectangular form as a whole. Although not shown, via the conductor pattern formed on the substrate first surface 6X side, the switching elements 2a to 2d are connected so as to form the first power conversion unit 2 shown in FIG. 1. In this way, the first power conversion unit 2 and the first transformer coil 31a are connected to each other.

Similarly, although not shown, via the conductor pattern formed on the substrate second surface 6Y side, the switching elements 4a to 4d are connected so as to form the second power conversion unit 4 shown in FIG. 1. In this way, the second power conversion unit 4 and the second transformer coil 31b are connected to each other.

In the present embodiment, the capacitor 1 and the capacitor 5 are not mounted on the substrate 6 but are provided separately.

Hereinafter, the configuration of the structure of the power conversion device 100 including the main body 10 configured as described above will be described with reference to FIG. 3.

In FIG. 3 which is a sectional view, hatching for the cross section is omitted. Not only in the present embodiment but also in all the sectional views, hatching for the cross sections is omitted.

The power conversion device 100 includes the main body 10 shown in FIG. 2, a first heat dissipation portion 11, a first thermal resistance reduction portion 12A, a second thermal resistance reduction portion 12B, and a third thermal resistance reduction portion 12C.

Hereinafter, the first thermal resistance reduction portion 12A, the second thermal resistance reduction portion 12B, and the third thermal resistance reduction portion 12C are referred to as a thermal resistance reduction portion 12 unless they need to be discriminated from each other.

First, the first heat dissipation portion 11 will be described.

A surface on the first direction side Y1 of the first heat dissipation portion 11 is defined as a heat dissipation first surface 11X. A surface on the second direction side Y2 of the first heat dissipation portion 11 is defined as a heat dissipation second surface 11Y.

The first heat dissipation portion 11 is a metallic plate-shaped member fixed on the substrate first surface 6X side of the substrate 6. The first heat dissipation portion 11 holds the substrate 6 from the first direction side Y1 and dissipates heat generated at the substrate 6 (main body 10), from the surface to the air.

As described above, the first heat dissipation portion 11 dissipates heat of the substrate 6 and serves as a housing for holding the main body 10. Therefore, the heat dissipation first surface 11X of the first heat dissipation portion 11 is formed to be an outermost peripheral surface on the first direction side Y1 of the power conversion device 100. Owing to such a structure, when the power conversion device 100 is mounted to another electric apparatus, the heat dissipation first surface 11X which is the outermost peripheral surface can be used as a mounting surface for fixation to the other electric apparatus.

The heat dissipation second surface 11Y of the first heat dissipation portion 11 has a coil cooling portion 11A formed so as to be opposed to the part where the transformer coil patterns 14a, 14b are formed on the substrate 6. The part where the transformer coil patterns 14a, 14b are formed on the substrate 6, and the coil cooling portion 11A, abut on each other with the first thermal resistance reduction portion 12A therebetween.

Further, the heat dissipation second surface 11Y has an element cooling portion 11B formed so as to be opposed to each of the switching elements 2a to 2d and 4a to 4d fixed to the substrate first surface 6X. Each of the switching elements 2a to 2d and 4a to 4d, and the element cooling portion 11B, abut on each other with the second thermal resistance reduction portion 12B therebetween.

The heat dissipation second surface 11Y has a first recessed portion 11Z recessed toward the first direction side Y1 and storing the first direction side Y1 of the transformer core 34. The heat dissipation second surface 11Y has, in the first recessed portion 11Z, a core cooling portion 11C formed so as to be opposed to an end on the first direction side Y1 of the transformer core 34. The transformer core 34 and the core cooling portion 11C abut on each other with the third thermal resistance reduction portion 12C therebetween.

As described above, the first heat dissipation portion 11 is formed in a multistage shape so that the dimension thereof in the thickness direction Y varies in accordance with protrusion and recess of the main body 10.

In the drawing, the heat dissipation first surface 11X of the first heat dissipation portion 11 is shown as a flat shape. However, the heat dissipation first surface 11X may be a protrusion/recess shape. The first heat dissipation portion 11 may have a cooling water channel through which cooling water flows in order to improve heat dissipation property.

As described above, the thermal resistance reduction portion 12 is provided between the main body 10 and the first heat dissipation portion 11. The thermal resistance reduction portion 12 has insulation property, elasticity, and heat transfer property, reduces thermal resistance between the main body 10 and the first heat dissipation portion 11, and ensures adhesion therebetween.

The first thermal resistance reduction portion 12A provided between the coil cooling portion 11A and the part where the transformer coil patterns 14a, 14b are formed on the substrate 6 reduces thermal resistance therebetween and ensures adhesion therebetween.

The second thermal resistance reduction portion 12B provided between the element cooling portion 11B and each of the switching elements 2a to 2d and the switching elements 4a to 4d reduces thermal resistance therebetween and ensures adhesion therebetween.

The third thermal resistance reduction portion 12C provided between the first direction side of the transformer core 34 and the core cooling portion 11C reduces thermal resistance therebetween and ensures adhesion therebetween.

The thermal resistance reduction portion 12 is formed as a thin sheet-like member made from a synthetic resin material having high insulation property, high elasticity, and high thermal conductivity, e.g., silicone rubber. It is noted that the thermal resistance reduction portion 12 is not limited to a thin sheet-like member made of silicone rubber. For example, the thermal resistance reduction portion 12 may be made from a thin insulating material that is elastically deformable and has high thermal conductivity, e.g., a sheet in which high-thermal-conductivity graphite particles are oriented in a film thickness direction in an acrylic polymer and penetrate therethrough, a gelatinous insulating material such as silicone grease, or the like.

In the present embodiment, as the thermal resistance reduction portion 12, only the first thermal resistance reduction portion 12A, the second thermal resistance reduction portion 12B, and the third thermal resistance reduction portion 12C provided between the main body 10 and each of the coil cooling portion 11A, the element cooling portion 11B, and the core cooling portion 11C, are shown. However, without limitation to such a structure, the thermal resistance reduction portion 12 may be provided over the entire area between the heat dissipation second surface 11Y and the main body 10.

In the power conversion device 100 of the present embodiment configured as described above, the first heat dissipation portion 11 has the coil cooling portion 11A opposed to and abutting on the part where the transformer coil patterns 14a, 14b are formed on the substrate 6. Thus, heat generated at the transformer coil patterns 14a, 14b during operation of the power conversion device 100 is dissipated by being directly transferred to the coil cooling portion 11A abutting on the part where the transformer coil patterns 14a, 14b are formed on the substrate 6. In this way, heat generated from the transformer coil 31 of the main body 10 is effectively dissipated, whereby increase in the temperature of the power conversion device 100 can be suppressed.

The heat dissipation first surface 11X of the first heat dissipation portion 11 is formed to be an outermost peripheral surface on the first direction side Y1 of the power conversion device 100, and thus can be used as a mounting surface for fixing the power conversion device 100 to another electric apparatus. Also, the shape of the heat dissipation first surface 11X can be formed to be a shape corresponding to a protrusion/recess shape of an electric apparatus to which the power conversion device 100 is mounted. Therefore, when the power conversion device 100 is mounted to another electric apparatus, it is not necessary to use a separate housing for storing the power conversion device 100. As a result, it is not necessary to use silicone grease or the like which has high thermal resistance and which is to be applied between such a separate housing and the first heat dissipation portion 11 of the power conversion device 100. Thus, heat dissipation property of the power conversion device 100 can be improved.

Since the substrate 6 on which the first power conversion unit 2 and the transformer 30 are mounted is formed as a single-sheet-structure substrate, the height of the power conversion device 100 is reduced, whereby a thin power conversion device 100 can be provided.

The heat dissipation second surface 11Y has the element cooling portion 11B opposed to and abutting on each of the switching elements 2a to 2d and 4a to 4d fixed to the substrate first surface 6X.

Thus, heat generated at each of the switching elements 2a to 2d and 4a to 4d during operation of the power conversion device 100 is dissipated by being directly transferred to the element cooling portion 11B abutting on each of the switching elements 2a to 2d and 4a to 4d. In this way, heat generated at each of the switching elements 2a to 2d and 4a to 4d of the main body 10 is effectively dissipated, whereby increase in the temperature of the power conversion device 100 can be further suppressed.

The heat dissipation second surface 11Y has the core cooling portion 11C opposed to and abutting on an end of the transformer core 34. Thus, heat generated at the transformer core 34 during operation of the power conversion device 100 is dissipated by being directly transferred to the core cooling portion 11C abutting on the transformer core 34. In this way, heat generated at the transformer core 34 of the main body 10 is effectively dissipated, whereby increase in the temperature of the power conversion device 100 can be further suppressed.

The thermal resistance reduction portion 12 is provided between the main body 10 and the first heat dissipation portion 11, thereby reducing thermal resistance between the main body 10 and the first heat dissipation portion 11 and ensuring adhesion therebetween. Thus, heat generated at the transformer coil patterns 14a, 14b, the switching elements 2a to 2d and 4a to 4d, and the transformer core 34 can be effectively transferred to the first heat dissipation portion 11 via the first thermal resistance reduction portion 12A, the second thermal resistance reduction portion 12B, and the third thermal resistance reduction portion 12C.

In addition, providing the thermal resistance reduction portion 12 obtains an effect of protecting the main body 10 from friction with the first heat dissipation portion 11.

It is noted that the second thermal resistance reduction portion 12B may be provided to only a switching element in which switching loss is great and temperature increase is great, among the switching elements 2a to 2d and 4a to 4d. Thus, the usage amount of the second thermal resistance reduction portion 12B is decreased, whereby cost reduction can be achieved.

The first transformer coil 31a and the second transformer coil 31b of the transformer coil 31 are formed integrally with the substrate 6 by the transformer coil pattern 14a and the transformer coil pattern 14b. That is, on the substrate second surface 6Y of the substrate 6, the transformer coil 31 does not protrude toward the second direction side Y. Thus, the height of the power conversion device 100 is reduced, whereby a thin power conversion device 100 can be provided.

The transformer coil 31 is not limited to a structure formed integrally with the substrate 6 by conductor patterns. For example, a longer side of the cross section of a conductor may be bonded on the substrate second surface 6Y, whereby the conductor and the substrate 6 may be formed integrally. Also in this case, a structure in which the transformer coil 31 does not protrude toward the second direction side Y on the substrate second surface 6Y can be obtained.

In addition, as described above, since the transformer coil 31 and the substrate 6 are formed integrally and the transformer coil 31 does not protrude, unevenness on the substrate 6 is reduced. Thus, adhesion between the end of the coil cooling portion 11A that is on the second direction side Y1 and abuts on the substrate 6, and the part where the transformer coil 31 is formed on the substrate 6, can be improved, whereby heat dissipation property is improved.

In addition, the shape of the end of the coil cooling portion 11A that is on the second direction side Y1 and abuts on the substrate 6, can be simplified.

The first heat dissipation portion 11 has the first recessed portion 11Z which stores the first direction side Y1 of the transformer core 34. Thus, the height on the second direction side Y2 of the transformer core 34 from the heat dissipation second surface 11Y can be reduced. As a result, the height of the power conversion device 100 is reduced, whereby a further thin power conversion device 100 can be provided.

In the case where low-power-loss switching elements are used as the switching elements 2a to 2d and 4a to 4d composing the first power conversion unit 2 and the second power conversion unit 4, the element cooling portion 11B may not be provided to the first heat dissipation portion 11. Thus, the structure of the first heat dissipation portion 11 can be simplified.

Instead of the switching elements 4a to 4d composing the second power conversion unit 4, diode elements as unidirectional conduction elements may be used. In this case, heat increase due to switching loss of switching elements is prevented, whereby increase in the temperature of the power conversion device 100 can be further suppressed.

In the above description, the transformer 30 having the transformer core 34 has been shown. However, the transformer core 34 may not be provided. In this case, the first heat dissipation portion 11 can be configured such that the first recessed portion 11Z for storing the first direction side Y1 of the transformer core 34, and the core cooling portion 11C, are not provided, and the substrate 6 can be configured such that the through hole 6b is not provided. Thus, the structures of the first heat dissipation portion 11 and the substrate 6 can be further simplified.

For example, in the case where a solder resist having insulation property is applied to the substrate first surface 6X and the substrate second surface 6Y, resist-absent regions 94 on which no solder resist is applied as shown in FIG. 2 may be provided on the conductor patterns forming the transformer coil patterns 14a, 14b. In general, thermal resistance of a solder resist is high. Therefore, if the resist-absent regions on which no solder resist is applied are provided on the transformer coil patterns 14a, 14b as described above, deterioration in thermal resistance due to the solder resist can be suppressed. Thus, providing the resist-absent regions allows heat generated at the transformer coil patterns 14a, 14b to be effectively transferred to the coil cooling portion 11A and dissipated.

Thus, heat generated at the switching elements 2a to 2d, the transformer coil patterns 14a, 14b (first transformer coil 31a, second transformer coil 31b), and the switching elements 4a to 4d, which are major heat generation parts of the main body 10 of the power conversion device 100, can be transferred to the first heat dissipation portion 11 and effectively dissipated.

Thus, it becomes possible to provide a large-power and thin power conversion device.

Embodiment 2

Hereinafter, with reference to the drawings, embodiment 2 of the present invention will be described, focusing on difference from the above embodiment 1. The same parts as those in the above embodiment 1 are denoted by the same reference characters and the description thereof is omitted.

Figure 4:
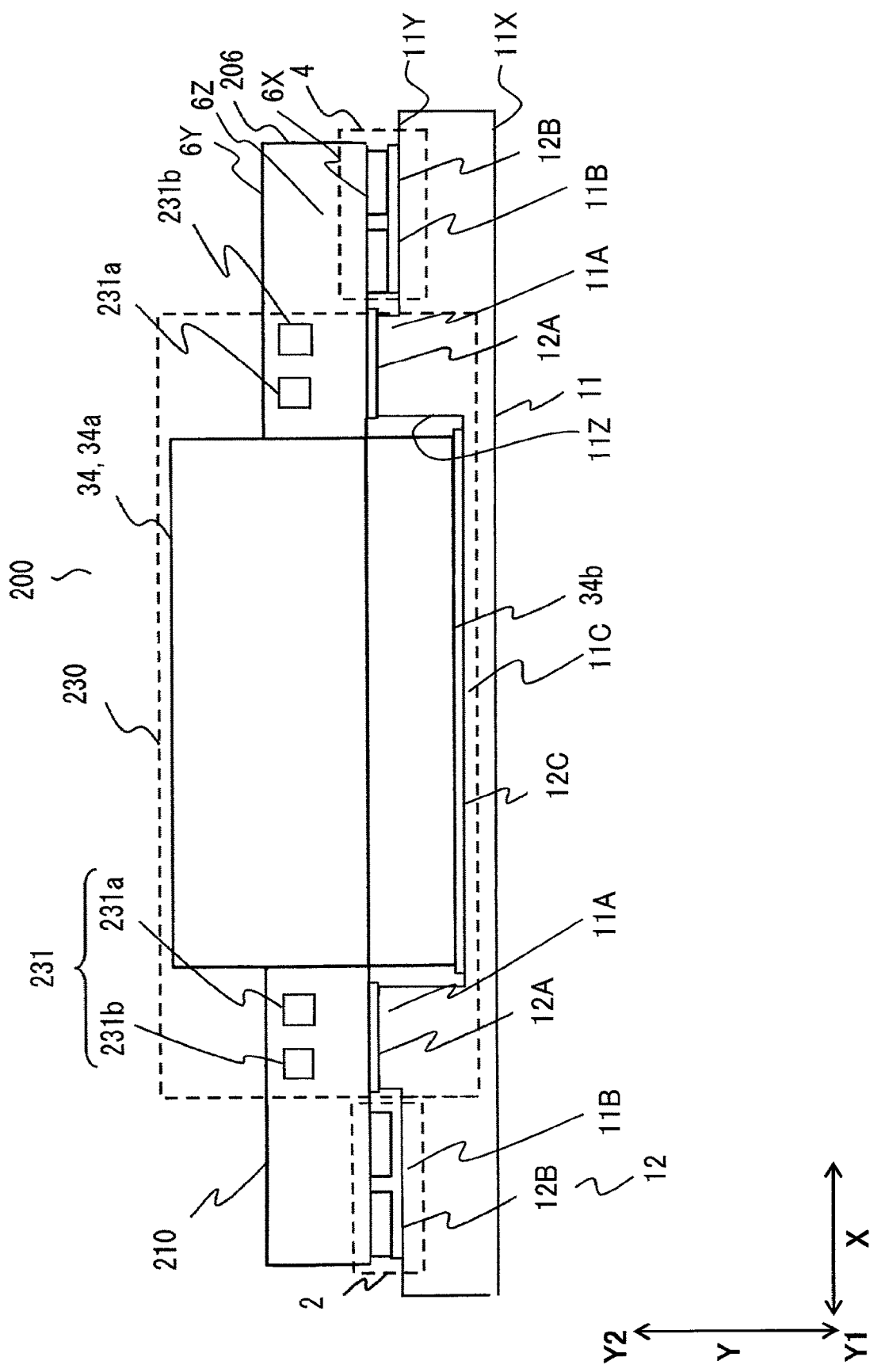
FIG. 4 is a sectional view showing the structure of a power conversion device according to embodiment 2 of the present invention.

FIG. 4 is a sectional view showing the structure of a power conversion device according to embodiment 2.

A power conversion device 200 includes: a main body 210; and the first heat dissipation portion 11 and the thermal resistance reduction portion 12 having the same configurations as in embodiment 1. The main body 210 includes: a substrate 206; a transformer 230; and the first power conversion unit 2 and the second power conversion unit 4 having the same configurations as in embodiment 1.

The transformer 230 has a transformer coil 231 as a coil. The transformer coil 231 includes a first transformer coil 231a and a second transformer coil 231b.

The first transformer coil 231a and the second transformer coil 231b are formed by conductor patterns in the same manner as in embodiment 1, but the arrangement structure thereof in the substrate 206 is different from that in embodiment 1.

In embodiment 1, the first transformer coil 31a and the second transformer coil 31b are formed so as to be opposed to each other in the thickness direction Y of the substrate 6. In the present embodiment, the first transformer coil 231a and the second transformer coil 231b are formed concentrically in a spiral shape so as to be arranged in the width direction X perpendicular to the thickness direction Y of the substrate 206.

The coil cooling portion 11A of the first heat dissipation portion 11 abuts on the part where the first transformer coil 231a and the second transformer coil 231b are formed in the substrate 6.

Such an arrangement structure of the first transformer coil 231a and the second transformer coil 231b also enables effective heat dissipation as in embodiment 1.

Embodiment 3

Hereinafter, with reference to the drawings, embodiment 3 of the present invention will be described, focusing on difference from the above embodiment 1. The same parts as those in the above embodiment 1 are denoted by the same reference characters and the description thereof is omitted.

Figure 5:
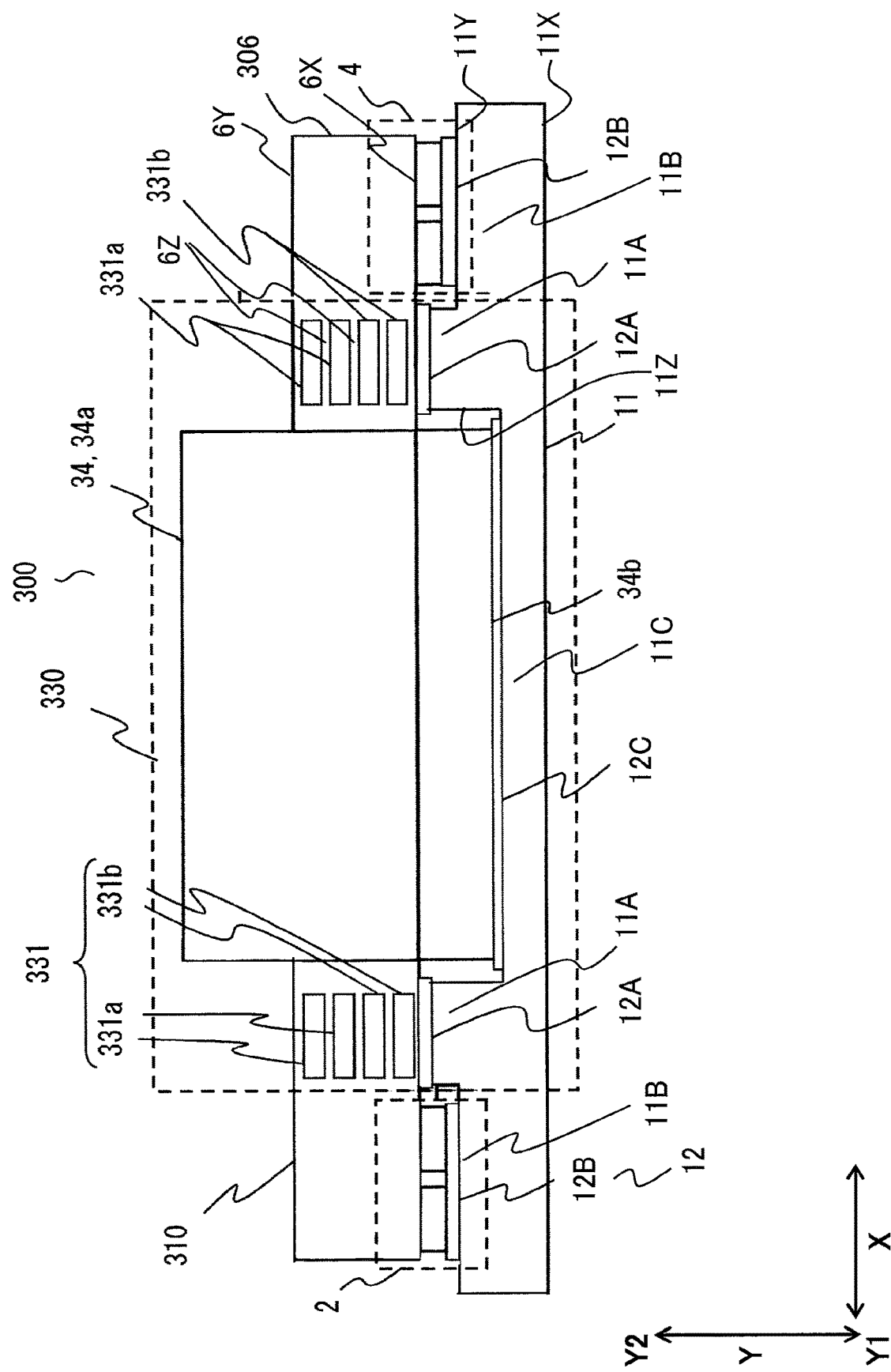
FIG. 5 is a sectional view showing the structure of a power conversion device according to embodiment 3 of the present invention.

FIG. 5 is a sectional view showing the structure of a power conversion device according to embodiment 3.

A power conversion device 300 includes: a main body 310; and the first heat dissipation portion 11 and the thermal resistance reduction portion 12 having the same configurations as in embodiment 1. The main body 310 includes: a substrate 306; a transformer 330; and the first power conversion unit 2 and the second power conversion unit 4 having the same configurations as in embodiment 1. The transformer 330 has a transformer coil 331 as a coil. The transformer coil 331 includes a first transformer coil 331a and a second transformer coil 331b.

The substrate 306 is a four-layer substrate having four wiring layers laminated with insulating layers 6Z therebetween.

The first transformer coil 331a and the second transformer coil 331b are formed by conductor patterns in the same manner as in embodiment 1, but the arrangement structure thereof in the substrate 306 is different from that in embodiment 1.

In the present embodiment, the first transformer coil 331a and the second transformer coil 331b are each wound by two turns, and these turns are respectively formed in different wiring layers. The first transformer coil 331a and the second transformer coil 331b are formed concentrically in a spiral shape so as to be opposed to each other in the thickness direction Y of the substrate 306.

The coil cooling portion 11A of the first heat dissipation portion 11 abuts on the part where the first transformer coil 331a and the second transformer coil 331b are formed in the substrate 306.

Such an arrangement structure of the first transformer coil 331a and the second transformer coil 331b also enables effective heat dissipation as in embodiment 1.

In the present embodiment, the four-layer substrate having four wiring layers has been shown, but the substrate is not limited thereto. For example, a six-layer substrate having six wiring layers may be used. In this case, each of the first transformer coil 331a and the second transformer coil 331b can be wound by three turns.

Embodiment 4

Hereinafter, with reference to the drawings, embodiment 4 of the present invention will be described, focusing on difference from the above embodiment 1. The same parts as those in the above embodiment 1 are denoted by the same reference characters and the description thereof is omitted.

Figure 6:
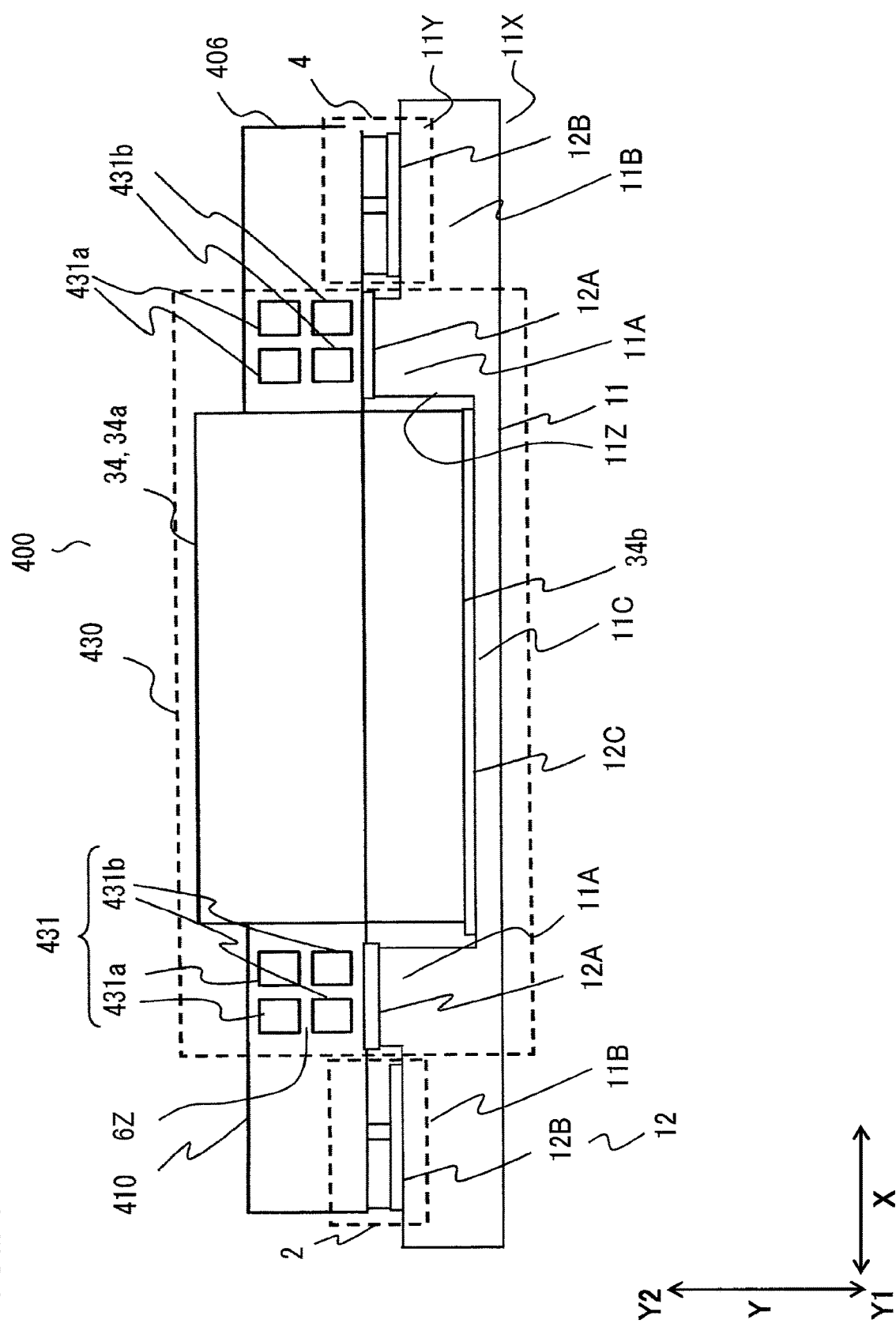
FIG. 6 is a sectional view showing the structure of a power conversion device according to embodiment 4 of the present invention.

FIG. 6 is a sectional view showing the structure of a power conversion device according to embodiment 4.

A power conversion device 400 includes: a main body 410; and the first heat dissipation portion 11 and the thermal resistance reduction portion 12 having the same configurations as in embodiment 1. The main body 410 includes: a substrate 406; a transformer 430; and the first power conversion unit 2 and the second power conversion unit 4 having the same configurations as in embodiment 1.

The transformer 430 has a transformer coil 431 as a coil. The transformer coil 431 includes a first transformer coil 431a and a second transformer coil 431b.

The first transformer coil 431a and the second transformer coil 431b are formed by conductor patterns in the same manner as in embodiment 1, but the arrangement structure thereof in the substrate 406 is different from that in embodiment 1.

In the present embodiment, the first transformer coil 431a and the second transformer coil 431b are each wound by two turns.

The turns of the first transformer coil 431a are formed concentrically in a spiral shape in an identical wiring layer so as to be arranged in the width direction X. The turns of the second transformer coil 431b are formed concentrically in a spiral shape in an identical wiring layer so as to be arranged in the width direction X. The first transformer coil 431a and the second transformer coil 431b are formed concentrically so as to be opposed to each other in the thickness direction Y of the substrate 406.

Such an arrangement structure of the first transformer coil 431a and the second transformer coil 431b also enables effective heat dissipation as in embodiment 1.

Embodiment 5

Hereinafter, with reference to the drawings, embodiment 5 of the present invention will be described, focusing on difference from the above embodiment 1. The same parts as those in the above embodiment 1 are denoted by the same reference characters and the description thereof is omitted.

Figure 7:
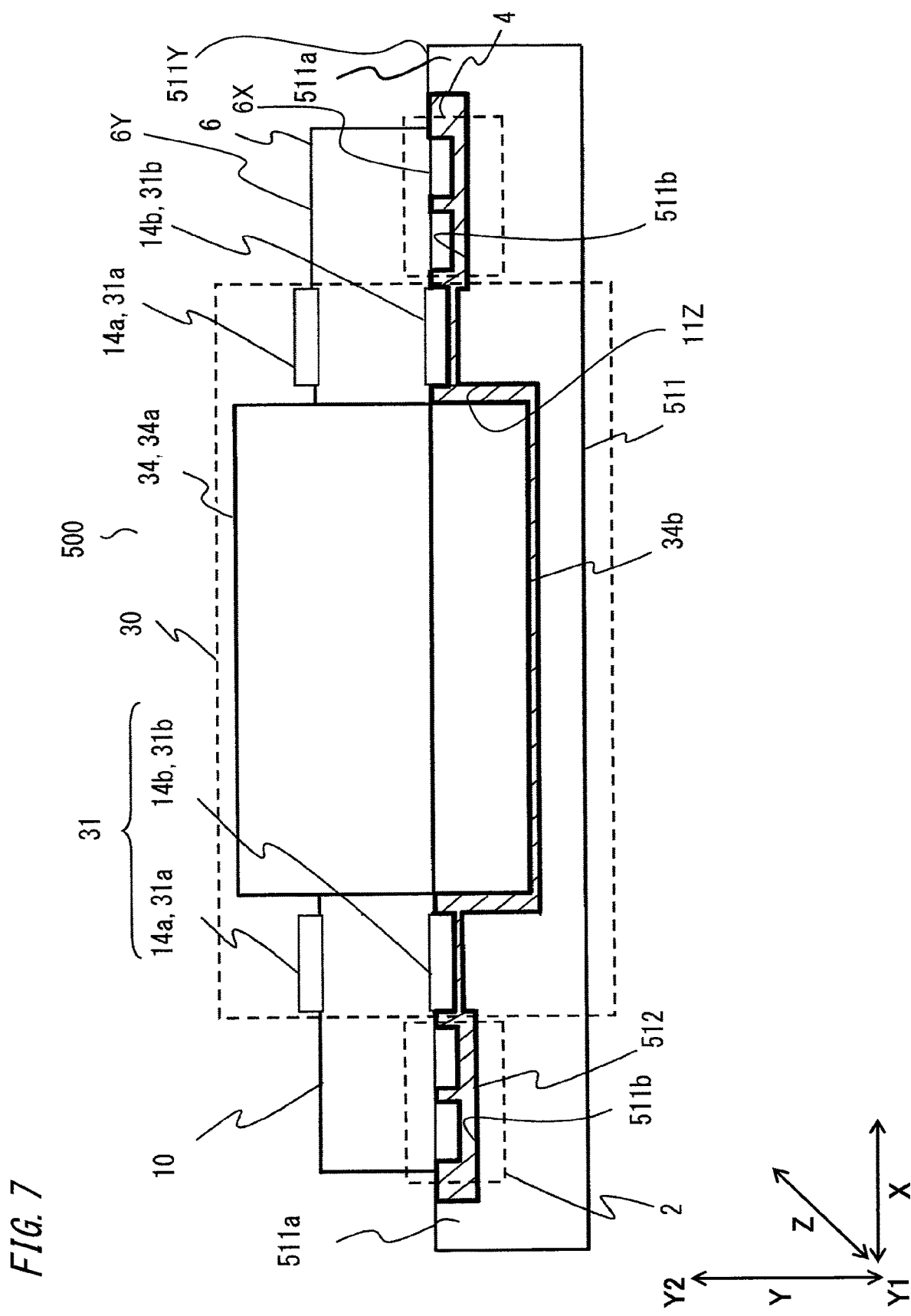
FIG. 7 is a sectional view showing the structure of a power conversion device according to embodiment 5 of the present invention.

FIG. 7 is a sectional view showing the structure of a power conversion device according to embodiment 5.

The power conversion device 500 includes: a first heat dissipation portion 511; a thermal resistance reduction portion 512; and the main body 10 having the same configuration as in embodiment 1.

The first heat dissipation portion 511 has protruding portions 511a protruding toward the second direction side Y2 and formed at end portions on four sides in the width direction X and the depth direction Z on a heat dissipation second surface 511Y on the second direction side Y2. Thus, a storage portion 511b surrounded by the protruding portions 511a is formed. The storage portion 511b includes the first recessed portion 11Z storing the first direction side Y1 of the transformer core 34.

The first direction side Y1 of the main body 10 of the power conversion device 500 is stored in the storage portion 511b of the first heat dissipation portion 511.

Resin as a thermal resistance reduction member is filled between the main body 10 and the first heat dissipation portion 511.

As the resin, for example, a thermosetting potting material having high thermal conductivity and high insulation property is used. The filled resin forms the thermal resistance reduction portion 512.

In FIG. 7, the area of the thermal resistance reduction portion 512 is indicated by hatching with oblique lines. As shown in FIG. 7, the thermal resistance reduction portion 512 is formed over the entire area between the first heat dissipation portion 511 and the main body 10.

Thus, filling the storage portion 511b with the resin as the thermal resistance reduction member obtains the thermal resistance reduction portion 512 in which the first thermal resistance reduction portion 12A, the second thermal resistance reduction portion 12B, and the third thermal resistance reduction portion 12C as shown in embodiment 1 are integrally formed.

In the power conversion device 500 of the present embodiment configured as described above, the thermal resistance reduction portion 512 of the present embodiment 5 can be obtained in which the first thermal resistance reduction portion 12A, the second thermal resistance reduction portion 12B, and the third thermal resistance reduction portion 12C shown in embodiment 1 are integrally formed. Thus, it is not necessary to provide thermal resistance reduction portions individually, the structure of the power conversion device 500 can be simplified, and the manufacturing process can be simplified.

In addition, the contact area between the main body 10 and the first heat dissipation portion 511 increases, whereby heat generated at the main body 10 can be effectively transferred to the first heat dissipation portion 511.

Embodiment 6

Hereinafter, with reference to the drawings, embodiment 6 of the present invention will be described, focusing on difference from the above embodiment 5. The same parts as those in the above embodiments 1, 5 are denoted by the same reference characters and the description thereof is omitted.

Figure 8:
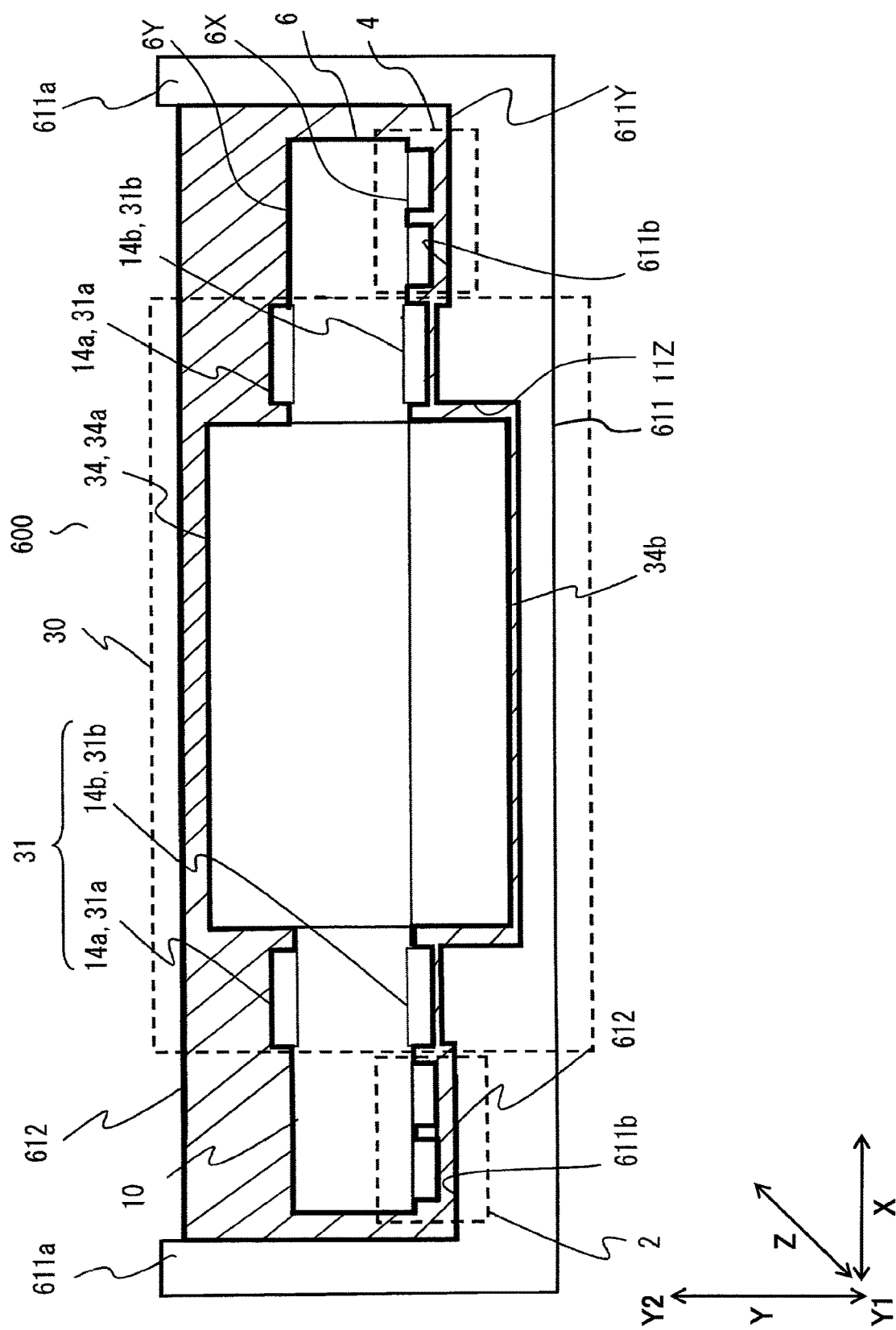
FIG. 8 is a sectional view showing the structure of a power conversion device according to embodiment 6 of the present invention.

FIG. 8 is a sectional view showing the structure of a power conversion device according to embodiment 6.

A power conversion device 600 includes: a first heat dissipation portion 611; a thermal resistance reduction portion 612; and the main body 10 having the same configuration as in embodiment 1.

The first heat dissipation portion 611 has protruding portions 611a which protrude toward the second direction side Y2 so as to be higher than the main body 10 by a predetermined dimension and which are formed at end portions on four sides in the width direction X and the depth direction Z in FIG. 8 on a heat dissipation second surface 611Y on the second direction side Y2. Thus, a storage portion 611b surrounded by the protruding portions 611a is formed. The storage portion 611b includes the first recessed portion 11Z storing the first direction side Y1 of the transformer core 34.

The first heat dissipation portion 611 of the present embodiment is formed such that the height on the second direction side Y2 of the protruding portions 611a is greater than the height of the protruding portions 511a of embodiment 5. The other configurations of the first heat dissipation portion 611 are the same as those of the first heat dissipation portion 511 of embodiment 5.

The entire main body 10 of the power conversion device 600 is stored in the storage portion 611b.

Resin as a thermal resistance reduction member is filled between the main body 10 and the first heat dissipation portion 611.

As the resin, for example, a thermosetting potting material having high thermal conductivity and high insulation property is used. The filled resin forms the thermal resistance reduction portion 612.

In FIG. 8, the area of the thermal resistance reduction portion 612 is indicated by hatching with oblique lines. As shown in FIG. 8, the thermal resistance reduction portion 612 is formed over the entire area between the first heat dissipation portion 611 and the main body 10. Further, the thermal resistance reduction portion 612 is formed to such a height as to cover the first transformer core member 34a which is the upper end on the second direction side Y2 of the main body 10, thus sealing the entire main body 10.

The power conversion device 600 of the present embodiment configured as described above provides the same effects as in embodiment 5. Further, in the power conversion device 600, the thermal resistance reduction portion 612 formed by filling the thermal resistance reduction member in the storage portion 611b seals the entire main body 10. Thus, for example, a heat dissipation route is formed through which heat generated at the substrate 6 is transferred from the substrate second surface 6Y side to the protruding portions 611a of the first heat dissipation portion 611 via the thermal resistance reduction portion 612. In this way, more heat dissipation routes in multiple directions are ensured, whereby heat generated at the main body 10 can be further effectively transferred to the first heat dissipation portion 611.

Thus, increase in the temperature of the power conversion device 600 can be further suppressed.

In addition, the first power conversion unit 2, the transformer 30, the second power conversion unit 4, and the like are molded with the thermal resistance reduction portion 612, whereby vibration resistance and dust resistance can be improved.

Embodiment 7

Hereinafter, with reference to the drawings, embodiment 7 of the present invention will be described, focusing on difference from the above embodiment 1. The same parts as those in the above embodiment 1 are denoted by the same reference characters and the description thereof is omitted.

Figure 9:
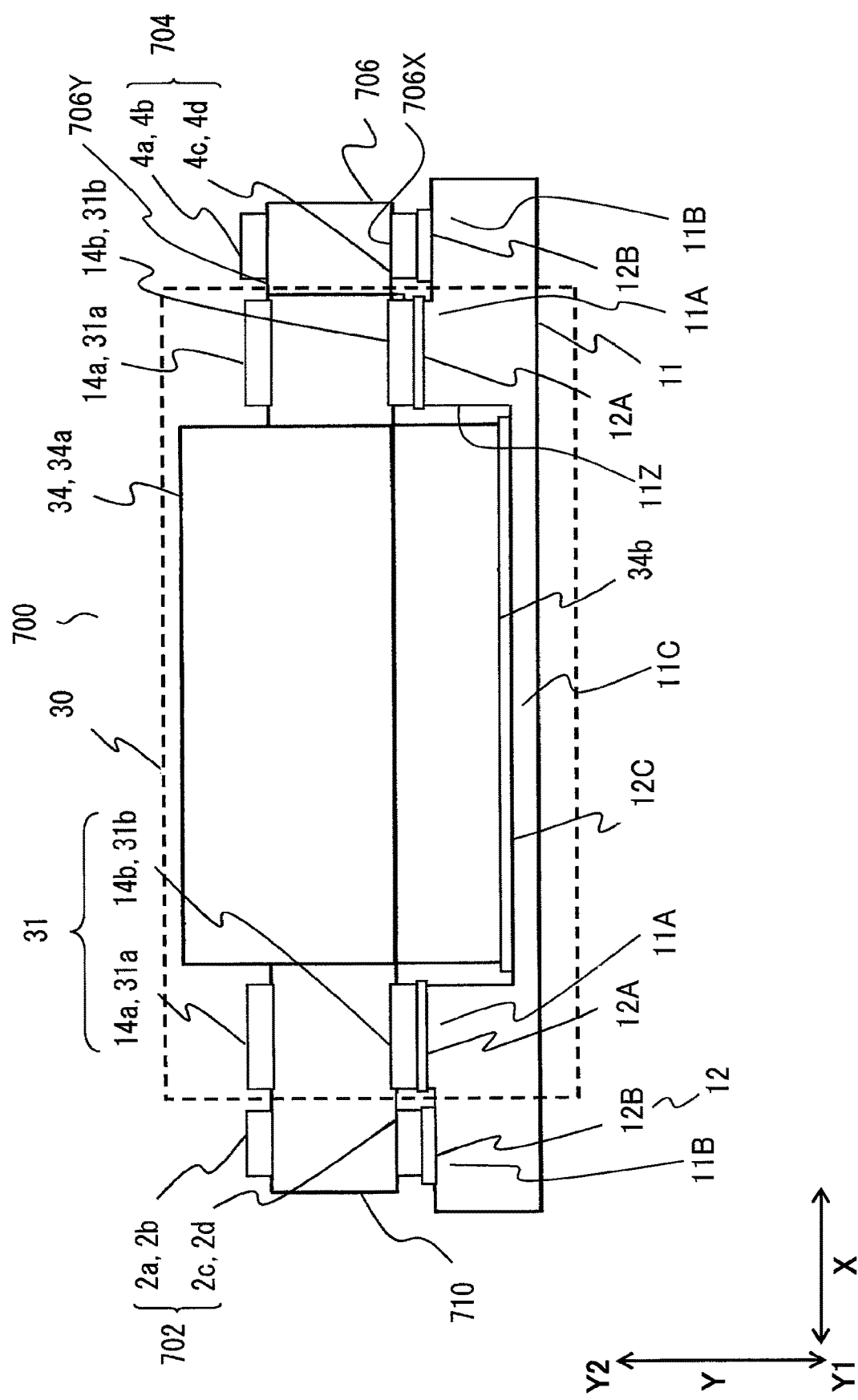
FIG. 9 is a sectional view showing the structure of a power conversion device according to embodiment 7 of the present invention.

FIG. 9 is a sectional view showing the structure of a power conversion device according to embodiment 7.

A power conversion device 700 includes: a main body 710; and the first heat dissipation portion 11 and the thermal resistance reduction portion 12 having the same configurations as in embodiment 1. The main body 710 includes: a first power conversion unit 702; a second power conversion unit 704; a substrate 706; and the transformer 30 having the same configuration as in embodiment 1.

In the first power conversion unit 702, the switching element 2a and the switching element 2b are mounted on the substrate second surface 706Y side of the substrate 706, and the switching element 2c and the switching element 2d are mounted on the substrate first surface 706X side.

In the second power conversion unit 704, the switching element 4a and the switching element 4b are mounted on the substrate second surface 706Y side, and the switching element 4c and the switching element 4d are mounted on the substrate first surface 706X side.

In embodiment 1, the switching elements 2a to 2d and the switching elements 4a to 4d are all fixed on the substrate first surface 6X side. In the present embodiment 7, as described above, the switching elements of the first power conversion unit 702 and the second power conversion unit 704 are fixed separately on the substrate first surface 706X side and the substrate second surface 706Y side. Thus, of the switching elements composing the first power conversion unit 702 and the second power conversion unit 704, at least one switching element is fixed on the substrate first surface 706X side and the other switching elements are fixed on the substrate second surface 706Y side, whereby the length in the width direction X of the power conversion device 700 can be shortened. Therefore, the power conversion device 700 can be downsized.

It is noted that the element cooling portion 11B of the first heat dissipation portion 11 does not abut on the switching elements fixed on the substrate second surface 706Y side. Therefore, of the switching elements 2a to 2d and 4a to 4d, switching elements that cause smaller switching loss and less increase in temperature may be provided as the switching elements fixed on the substrate second surface 706Y side.

Embodiment 8

Hereinafter, with reference to the drawings, embodiment 8 of the present invention will be described, focusing on difference from the above embodiment 1. The same parts as those in the above embodiment 1 are denoted by the same reference characters and the description thereof is omitted.

Figure 10:
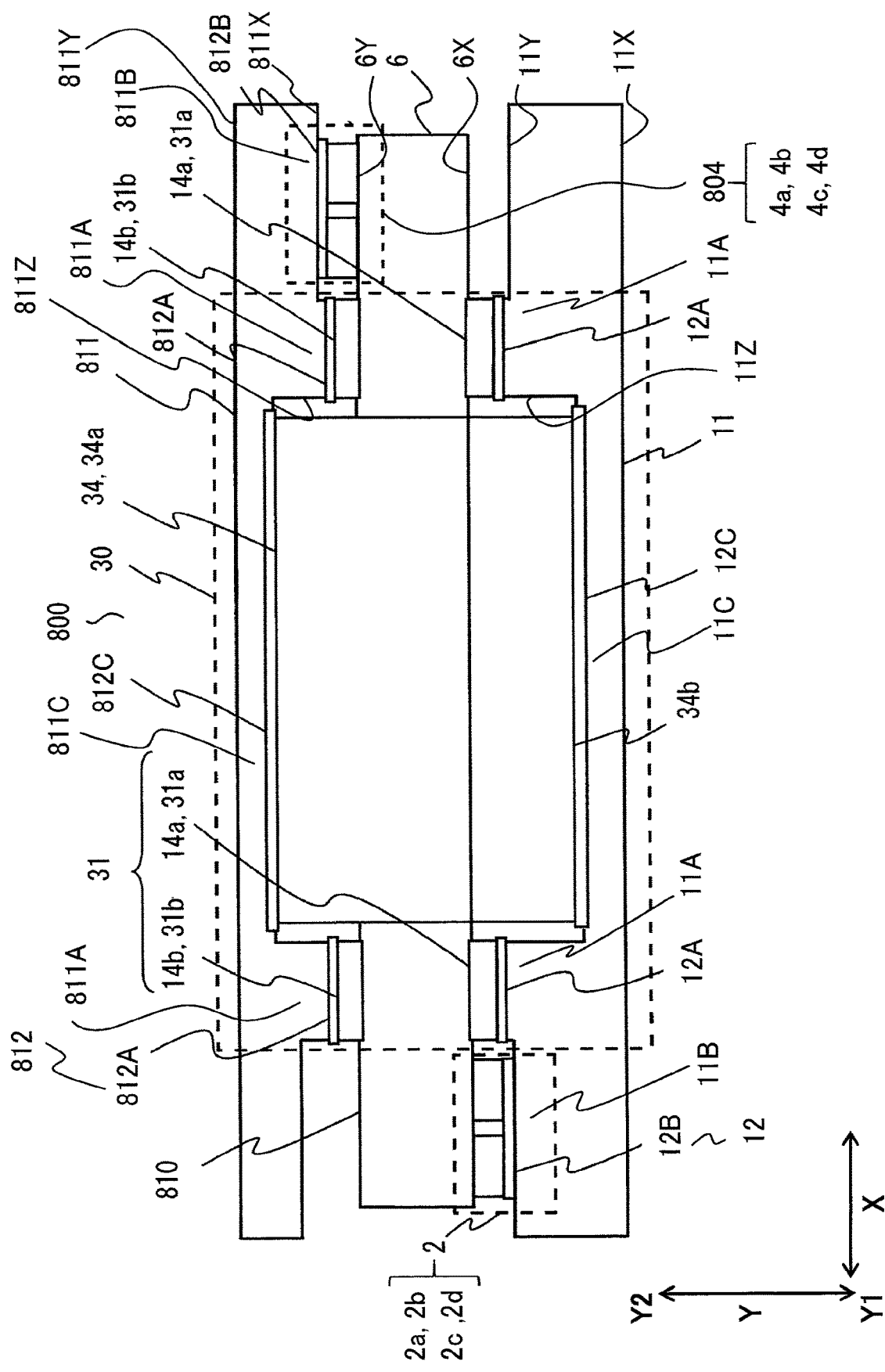
FIG. 10 is a sectional view showing the structure of a power conversion device according to embodiment 8 of the present invention.

FIG. 10 is a sectional view showing the structure of a power conversion device according to embodiment 8.

A power conversion device 800 includes: a main body 810; a second heat dissipation portion 811; a thermal resistance reduction portion 812; and the first heat dissipation portion 11 and the thermal resistance reduction portion 12 having the same configuration as in embodiment 1.

In embodiment 1, the second power conversion unit 4 of the main body 10 is provided on the substrate first surface 6X side of the substrate 6. In the present embodiment, a second power conversion unit 804 of the main body 810 is provided on the substrate second surface 6Y side of the substrate 6. The second power conversion unit 804 is the same as the second power conversion unit 4 in FIG. 1, except that the second power conversion unit 804 is provided on the substrate second surface 6Y side.

In addition, in the present embodiment, for the purpose of facilitating mutual connections, the first power conversion unit 2 and the first transformer coil 31a are provided on the substrate first surface 6X side, and the second transformer coil 31b and the second power conversion unit 4 are provided on the substrate second surface 6Y side.

The second heat dissipation portion 811 is the same as the first heat dissipation portion 11 shown in embodiment 1, and holds the substrate 6 and dissipates heat generated at the substrate 6 (main body 810), from the surface to the air. The second heat dissipation portion 811 is fixed on the substrate second surface 6Y side of the substrate 6. Thus, the second heat dissipation portion 811 is located to be plane-symmetric with the first heat dissipation portion 11, on the second direction side Y2 of the main body 810.

The second heat dissipation portion 811 serves as a housing holding the main body 810, as in the first heat dissipation portion 11. Therefore, a heat dissipation second surface 811Y of the second heat dissipation portion 811 is formed to be an outermost peripheral surface on the second direction side Y2 of the power conversion device 800.

In the drawing, the heat dissipation second surface 811Y of the second heat dissipation portion 811 is shown as a flat shape. However, the heat dissipation second surface 811Y may be a protrusion/recess shape. The second heat dissipation portion 811 may have a cooling water channel through which cooling water flows in order to improve heat dissipation property.

A heat dissipation first surface 811X on the first direction side Y1 of the second heat dissipation portion 811 has a coil cooling portion 811A formed so as to be opposed to the part where the transformer coil patterns 14a, 14b are formed on the substrate 6. The part where the transformer coil patterns 14a, 14b are formed on the substrate 6, and the coil cooling portion 811A, abut on each other with a first thermal resistance reduction portion 812A therebetween.

Thus, the part where the transformer coil patterns 14a, 14b are formed on the substrate 6 abuts on the coil cooling portion 11A of the first heat dissipation portion 11, at the substrate first surface 6X, and abuts on the coil cooling portion 811A of the second heat dissipation portion 811, at the substrate second surface 6Y.

Further, the heat dissipation first surface 811X of the second heat dissipation portion 811 has an element cooling portion 811B formed so as to be opposed to each of the switching elements 4a to 4d of the second power conversion unit 804 fixed to the substrate second surface 6Y. Each of the switching elements 4a to 4d of the second power conversion unit 804, and the element cooling portion 811B of the second heat dissipation portion 811, abut on each other with a second thermal resistance reduction portion 812B therebetween.

The heat dissipation first surface 811X of the second heat dissipation portion 811 has a first recessed portion 8112 recessed toward the second direction side Y2 and storing the second direction side Y2 of the transformer core 34. The heat dissipation first surface 811X of the second heat dissipation portion 811 has, in the first recessed portion 8112, a core cooling portion 811C formed so as to be opposed to an end on the second direction side Y2 of the transformer core 34. The transformer core 34 and the core cooling portion 811C of the second heat dissipation portion 811 abut on each other with a third thermal resistance reduction portion 812C therebetween.

Thus, of the transformer core 34, an end on the first direction side Y1 abuts on the core cooling portion 11C of the first heat dissipation portion 11, and an end on the second direction side Y2 abuts on the core cooling portion 811C of the second heat dissipation portion 811.

In the power conversion device 800 of the present embodiment configured as described above, the part where the transformer coil patterns 14a, 14b are formed on the substrate 6 abuts on the coil cooling portion 11A of the first heat dissipation portion 11, at the substrate first surface 6X, and abuts on the coil cooling portion 811A of the second heat dissipation portion 811, at the substrate second surface 6Y. Thus, during operation of the power conversion device 800, heat generated at the transformer coil patterns 14a, 14b is dissipated from both of the substrate first surface 6X and the substrate second surface 6Y via the first heat dissipation portion 11 and the second heat dissipation portion 811. Therefore, the heat dissipation volume with respect to the part where the transformer coil patterns 14a, 14b are formed increases, whereby increase in the temperature of the power conversion device 800 can be further suppressed.

The heat dissipation second surface 811Y of the second heat dissipation portion 811 is formed to be an outermost peripheral surface on the second direction side Y2 of the power conversion device 800, and thus can be used as a mounting surface for fixing the power conversion device 800 to another electric apparatus. Also, the shape of the heat dissipation second surface 811Y can be formed to be a shape corresponding to a protrusion/recess shape of an electric apparatus to which the power conversion device 800 is mounted. Thus, both of the heat dissipation first surface 11X of the first heat dissipation portion 11 and the heat dissipation second surface 811Y of the second heat dissipation portion 811 can be used as mounting surfaces, and therefore it becomes possible to adapt to various shapes of electric apparatuses to which the power conversion device 800 is mounted.

When the power conversion device 800 is mounted to another electric apparatus, it is not necessary to use a separate housing for storing the second direction side Y2 of the power conversion device 800. As a result, it is not necessary to use silicone grease or the like which has high thermal resistance and which is to be applied between such a separate housing and the second heat dissipation portion 81 of the power conversion device 800. Thus, heat dissipation property of the power conversion device 800 can be improved.

Each of the switching elements 4a to 4d of the second power conversion unit 804 fixed on the substrate second surface 6Y side abuts on the element cooling portion 811B of the second heat dissipation portion 811. Thus, heat generated at the switching elements 2a to 2d of the first power conversion unit 2 is dissipated via the first heat dissipation portion 11, and heat generated at the switching elements 4a to 4d of the second power conversion unit 804 is dissipated via the second heat dissipation portion 811. Thus, the heat dissipation volume with respect to the switching elements 2a to 2d and 4a to 4d increases, whereby increase in the temperature of the power conversion device 800 can be further suppressed.

Of the transformer core 34, an end on the first direction side Y1 of the first heat dissipation portion 11 abuts on the core cooling portion 11C, and an end on the second direction side Y2 abuts on the core cooling portion 811C of the second heat dissipation portion 811. Thus, heat generated at the transformer core 34 is dissipated from both of the end on the first direction side Y1 and the end on the second direction side Y2 of the transformer core 34, via the first heat dissipation portion 11 and the second heat dissipation portion 811. Thus, the heat dissipation volume with respect to the transformer core 34 increases, whereby increase in the temperature of the power conversion device 800 can be further suppressed.

Further, the second heat dissipation portion 11 has the first recessed portion 8112 storing the second direction side Y2 of the transformer core 34. Thus, the height of the power conversion device 800 is reduced, whereby a further thin power conversion device 800 can be provided.

In the present embodiment, the first heat dissipation portion 11 and the second heat dissipation portion 811 are provided on the first direction side Y1 and the second direction side Y2 of the main body 810, and the thermal resistance reduction portion 12 and the thermal resistance reduction portion 812 having high thermal conductivity and high insulation property are provided therebetween. Thus, heat generated at the main body 810 is transferred to the first heat dissipation portion 11 and the second heat dissipation portion 811 via the thermal resistance reduction portion 12 and the thermal resistance reduction portion 812 so as to be dissipated, whereby effective cooling can be performed.

Embodiment 9

Hereinafter, with reference to the drawings, embodiment 9 of the present invention will be described, focusing on difference from the above embodiments 1, 5, 8. The same parts as those in the above embodiments 1, 5, 8 are denoted by the same reference characters and the description thereof is omitted.

Figure 11:
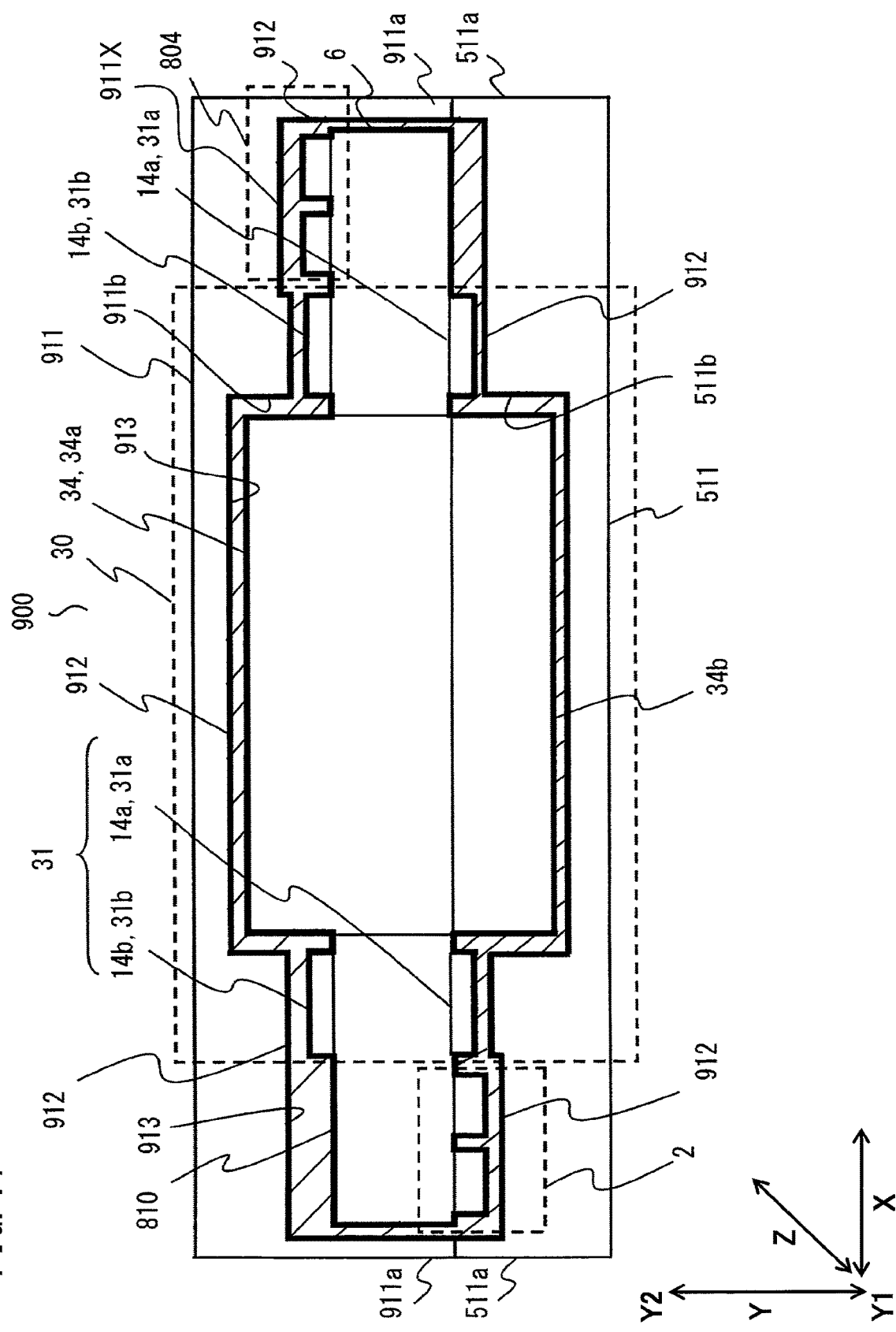
FIG. 11 is a sectional view showing the structure of a power conversion device according to embodiment 9 of the present invention.

FIG. 11 is a sectional view showing the structure of a power conversion device according to embodiment 9. A power conversion device 900 includes: a second heat dissipation portion 911; a thermal resistance reduction portion 912; the first heat dissipation portion 511 having the same configuration as in embodiment 5; and the main body 810 having the same configuration as in embodiment 8.

The second heat dissipation portion 911 has protruding portions 911a protruding toward the first direction side Y1 and formed at end portions on four sides in the width direction X and the depth direction Z on a heat dissipation first surface 911X on the first direction side Y1. Thus, a storage portion 911b is formed which is surrounded by the protruding portions 911a and opens toward the first direction side Y1. The second heat dissipation portion 911 has the same configuration as the first heat dissipation portion 511 shown in FIG. 7, except for the above configuration.

As shown in FIG. 11, the protruding portions 511a of the first heat dissipation portion 511 and the protruding portions 911a of the second heat dissipation portion 911 abut on each other so as to be opposed to each other in the thickness direction Y. Thus, the storage portion 511b of the first heat dissipation portion 511 and the storage portion 911b of the second heat dissipation portion 911 form a storage portion 913.

The main body 810 of the power conversion device 900 is stored in the storage portion 913.

Resin as a thermal resistance reduction member, which has high thermal conductivity and high insulation property, is filled between the main body 810 and the first heat dissipation portion 511, and between the main body 810 and the second heat dissipation portion 911. The filled resin forms the thermal resistance reduction portion 912.

In FIG. 11, the area of the thermal resistance reduction portion 912 is indicated by hatching with oblique lines.

As shown in the drawing, the entire main body 810 is sealed by the thermal resistance reduction portion 612.

In the power conversion device 900 of the present embodiment configured as described above, the first heat dissipation portion 511 and the second heat dissipation portion 911 are provided on the first direction side Y1 and the second direction side Y2 of the main body 910, and the thermal resistance reduction portion 912 having high thermal conductivity and high insulation property is provided therebetween.

Thus, the same effects as in embodiments 1, 5, 8 are provided, and further, it is possible to ensure a great heat dissipation volume and many heat dissipation routes in multiple directions. Therefore, the structure of the power conversion device 900 can be simplified and increase in the temperature of the power conversion device 900 can be further suppressed.

Embodiment 10

Hereinafter, with reference to the drawings, embodiment 10 of the present invention will be described, focusing on difference from the above embodiment 1. The same parts as those in the above embodiment 1 are denoted by the same reference characters and the description thereof is omitted.

Figure 12:
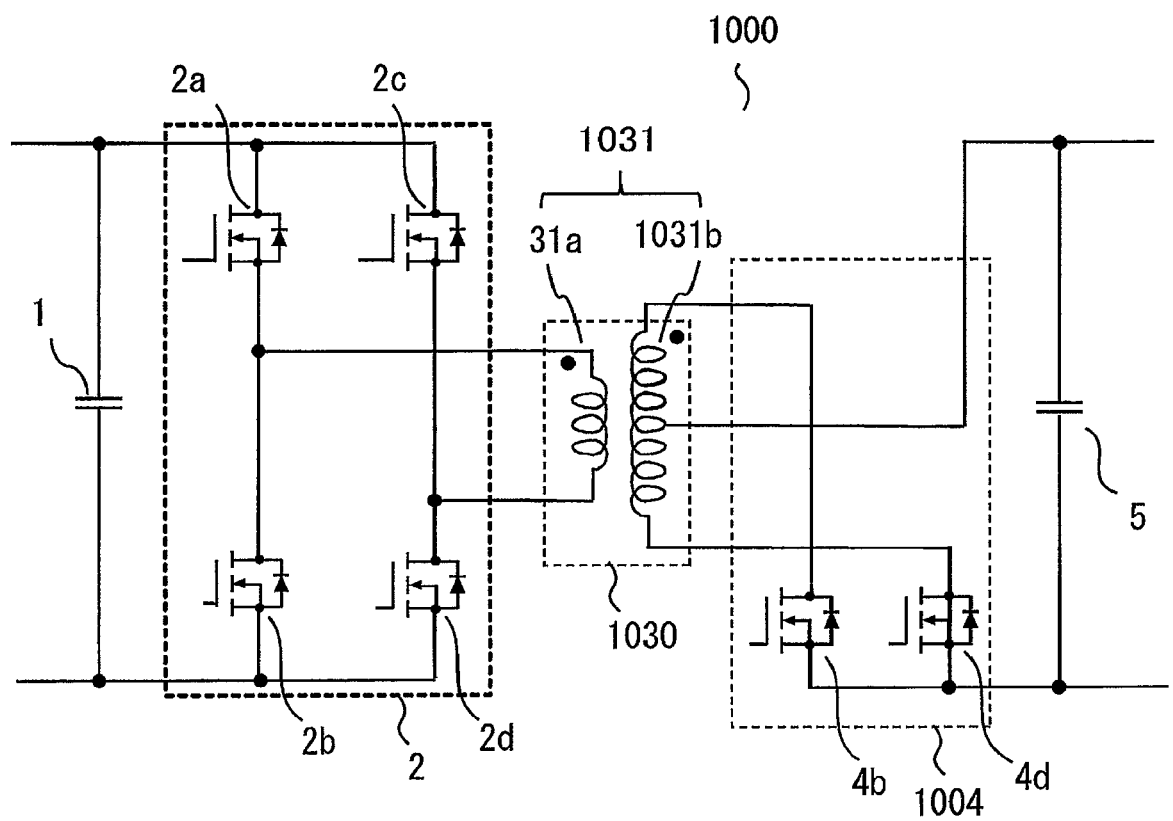
FIG. 12 is a circuit diagram showing a circuit configuration of a power conversion device according to embodiment 10 of the present invention.

FIG. 12 is a circuit diagram showing the configuration of a circuit of a power conversion device according to embodiment 10.

A power conversion device 1000 includes: a transformer 1030; a second power conversion unit 1004 as a power conversion unit; and the first power conversion unit 2 having the same configuration as in embodiment 1; the capacitor 1; and the capacitor 5. The transformer 1030 has a transformer coil 1031 as a coil.

The transformer coil 1031 includes: the first transformer coil 31a which is the same as in embodiment 1; and a second transformer coil 1031b as a secondary coil, which has a center tap. In the second power conversion unit 1004, the drain of the switching element 4a is connected to one end of the second transformer coil 1031b, and the drain of the switching element 4b is connected to the other end. The sources of the switching element 4a and the switching element 4b are connected in common. The capacitor 5 is connected between the center tap of the second transformer coil 1031b and the sources of the switching element 4a and the switching element 4b. A load (not shown) is connected to both ends of the capacitor 5.

The first power conversion unit 2, the transformer 1030, and the second power conversion unit 1004 are mounted on the same substrate as the substrate 6 shown in FIG. 3, to form a main body of the power conversion device 1000. The other configurations are the same as in the embodiment shown in FIG. 1 to FIG. 3.

Even in the case where the circuit configuration is different as described above, by adopting the same arrangement as in the power conversion device 100 shown in embodiment 1, heat generated at the main body of the power conversion device 1000 can be effectively dissipated.

Embodiment 11

Hereinafter, with reference to the drawings, embodiment 11 of the present invention will be described, focusing on difference from the above embodiment 1. The same parts as those in the above embodiment 1 are denoted by the same reference characters and the description thereof is omitted.

Figure 13:
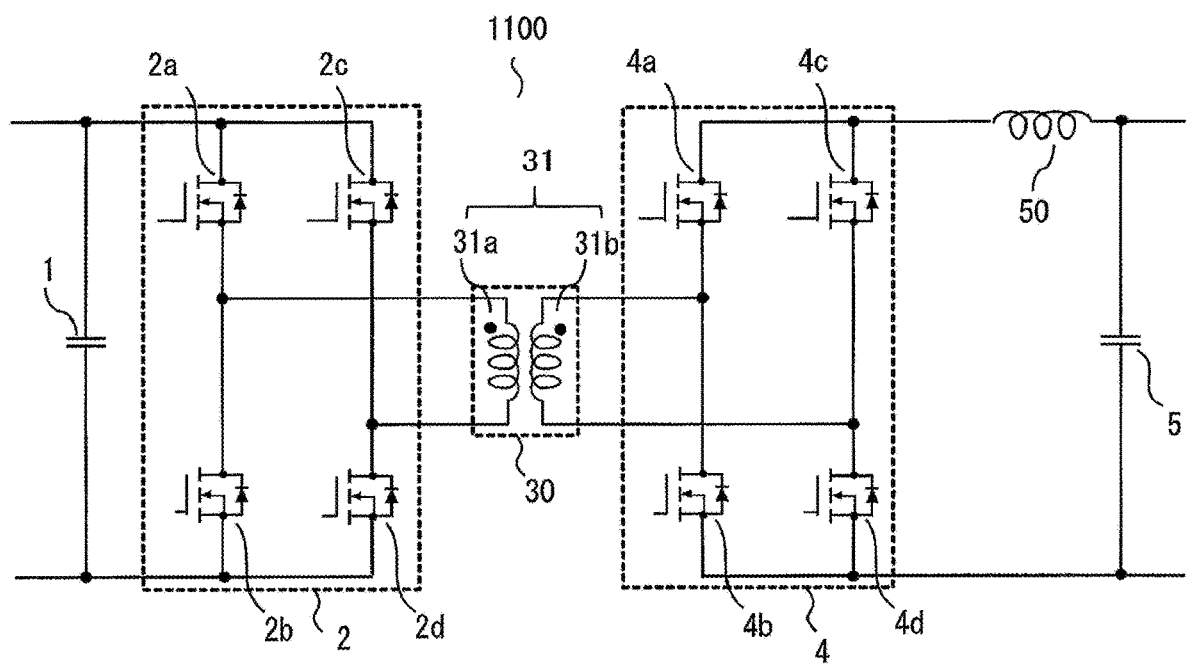
FIG. 13 is a circuit diagram showing a circuit configuration of a power conversion device according to embodiment 11 of the present invention.
Figure 14:
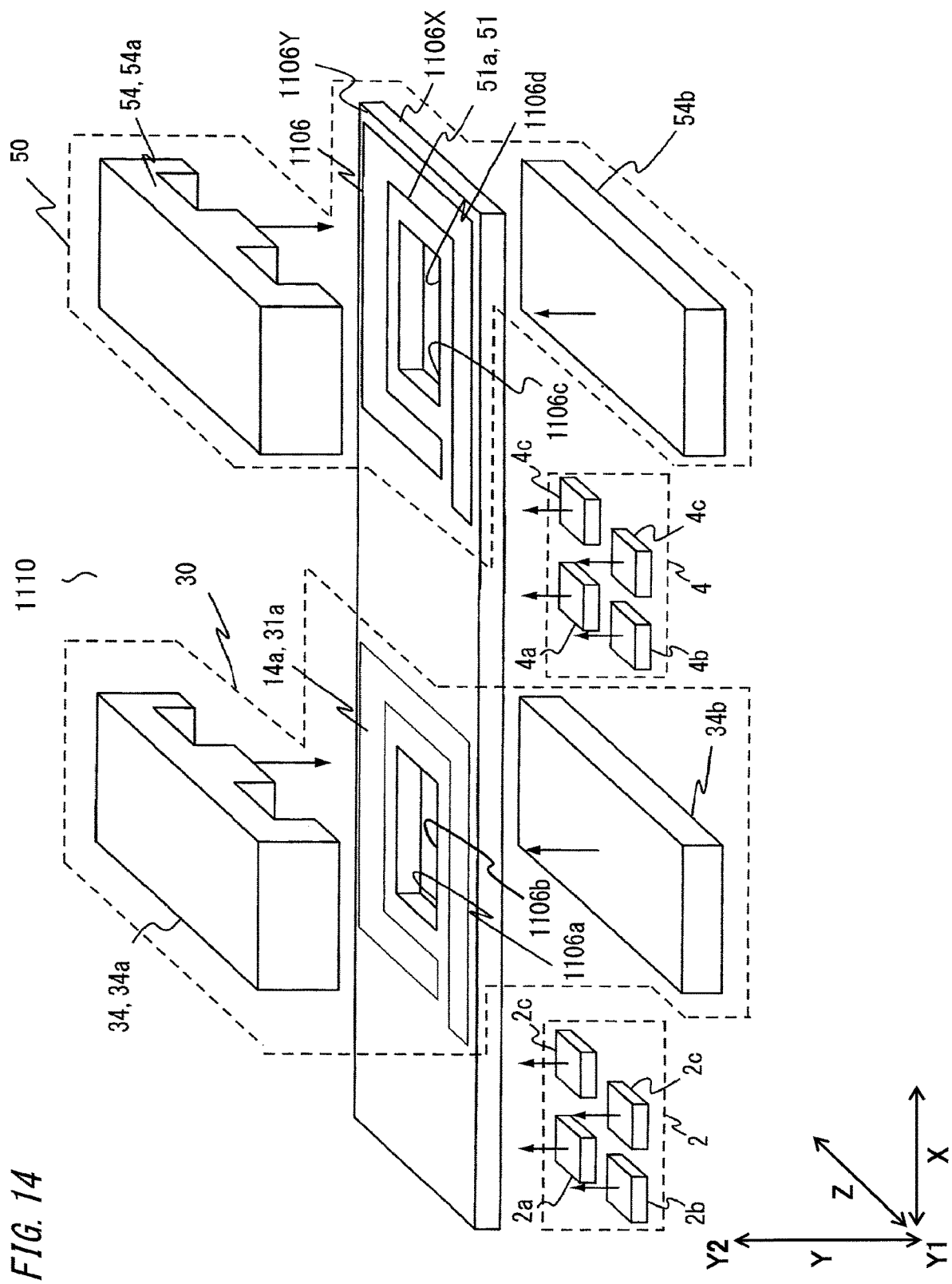
FIG. 14 is a perspective view showing a major part of a power conversion device according to embodiment 11 of the present invention.
Figure 15:
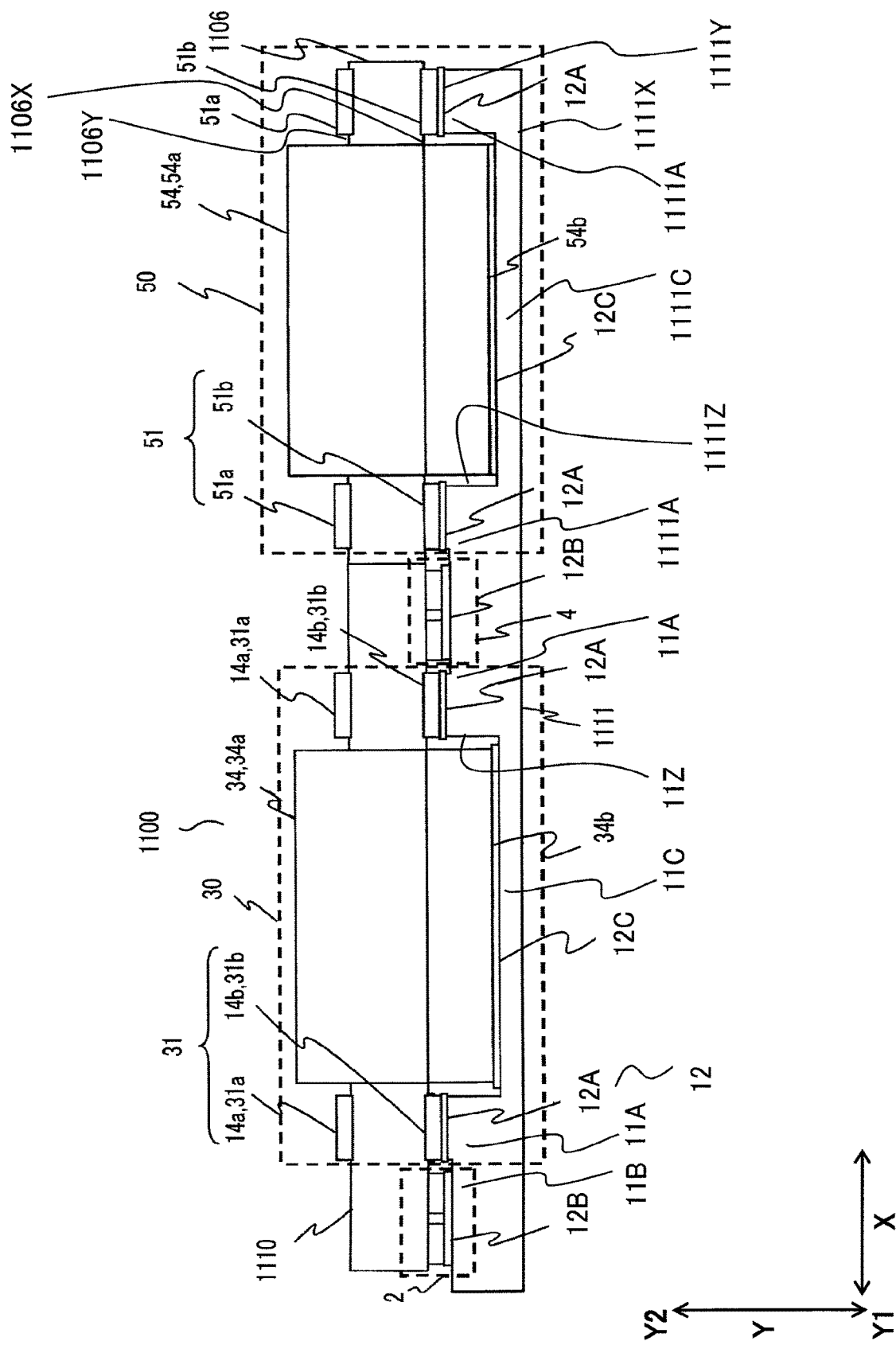
FIG. 15 is a sectional view showing the structure of the power conversion device according to embodiment 11 of the present invention.

FIG. 13 to FIG. 15 show the configuration of a power conversion device of embodiment 11.

FIG. 13 is a circuit diagram showing a circuit of the power conversion device.

FIG. 14 is a perspective view showing a main body 1110 forming the power conversion device.

FIG. 15 is a sectional view showing the structure of the power conversion device.

First, the circuit configuration of a power conversion device 1100 will be described with reference to FIG. 13.

In FIG. 13, the power conversion device 1100 is obtained by connecting a separately provided capacitor 5 via a reactor 50 on the second power conversion unit 4 side of the power conversion device 100 shown in FIG. 1.

The first power conversion unit 2 converts DC voltage applied to the capacitor 1 by a DC power supply (not shown), to high-frequency AC voltage, and applies the high-frequency AC voltage, between both ends of the first transformer coil 31a composing the transformer 30. Between both ends of the second transformer coil 31b, AC voltage according to the turns ratio of the first transformer coil 31a and the second transformer coil 31b is induced. The second power conversion unit 4 rectifies the AC voltage induced between both ends of the second transformer coil 31b, and outputs the resultant voltage to the capacitor 5 via the reactor 50. A load such as a battery (not shown) is connected to the capacitor 5, whereby power is transmitted from the DC power supply to the load.

Next, the structure of the power conversion device 1100 will be described with reference to FIG. 14 and FIG. 15. The main body 1110 of the power conversion device 1100 includes a substrate 1106 made of an insulating material and having a flat plate shape, the transformer 30, the first power conversion unit 2, the second power conversion unit 4, and the reactor 50.

The main body 1110 of the present embodiment is obtained by providing the reactor 50 integrally with the power conversion device 100 shown in FIG. 2 and FIG. 3 in embodiment 1.

The substrate 1106 is formed by extending the substrate 6 of embodiment 1 in the width direction X. The reactor 50 is mounted on the part extended from the substrate 6.

The reactor 50 includes a reactor coil 51 and a reactor core 54.

The substrate 1106 has a through hole 1106b and a through hole 1106d as openings that open in the thickness direction Y of the substrate 1106. The through hole 1106b and the through hole 1106d have the same structure as the through hole 6b shown in embodiment 1, and are formed by a hole forming portion 1106a and a hole forming portion 1106c, respectively.

On a substrate second surface 1106Y on the second direction side Y2 of the substrate 1106, the transformer coil pattern 14a serving as the first transformer coil 31a wound by one turn is formed in a spiral shape by a conductor pattern concentrically with the hole forming portion 1106a.

On a substrate first surface 1106X of the substrate 1106, the transformer coil pattern 14b serving as the second transformer coil 31b wound by one turn is formed in a spiral shape by a conductor pattern. The transformer coil pattern 14b is formed concentrically with the hole forming portion 1106a, i.e., concentrically with the transformer coil pattern 14a, and so as to be opposed to the first transformer coil 31a in the thickness direction Y via the substrate 1106. Thus, the transformer coil pattern 14a and the transformer coil pattern 14b are formed integrally with the substrate 1106.

At the right in the width direction X in the drawing on the substrate second surface 1106Y side of the substrate 1106, a reactor coil 51a wound by one turn is formed in a spiral shape by a conductor pattern concentrically with the hole forming portion 1106c.

On the substrate first surface 1106X side of the substrate 1106, a reactor coil 51b wound by one turn is formed in a spiral shape by a conductor pattern.

The reactor coil 51b is formed concentrically with the hole forming portion 1106c, i.e., concentrically with the reactor coil 51a, and so as to be opposed to the reactor coil 51a in the thickness direction Y via the substrate 1106. The reactor coil 51a and the reactor coil 51b formed on the substrate first surface 1106X side and the substrate second surface 1106Y side of the substrate 1106 are connected in series to form the reactor coil 51 wound by two turns.

The reactor core 54 is a three-leg reactor core, and includes a first reactor core member 54a having an E-shaped cross section in the depth direction Z of the substrate 1106, and a second reactor core member 54b having a flat plate shape. The first reactor core member 54a and the second reactor core member 54b are formed by molding soft magnetic ferrite.

As shown in FIG. 14, the first reactor core member 54a of the reactor core 54 is provided such that the center leg thereof penetrates the through hole 1106d and both side legs thereof are located on outer sides of the substrate 1106. The second reactor core member 54b is combined from below with the first reactor core member 54a, to form the reactor core 54, which is thus mounted to the substrate 1106.

The power conversion device 1100 includes the main body 1110 shown in FIG. 14, a first heat dissipation portion 1111, and the thermal resistance reduction portion 12.

A heat dissipation second surface 1111Y of the first heat dissipation portion 1111 has a coil cooling portion 1111A formed so as to be opposed to the part where the reactor coils 51a, 51b are formed on the substrate 1106. The part where the reactor coils 51a, 51b are formed on the substrate 1106, and the coil cooling portion 1111A, abut on each other with the first thermal resistance reduction portion 12A therebetween.

The heat dissipation second surface 1111Y of the first heat dissipation portion 1111 has a first recessed portion 11112 recessed toward the first direction side Y1 and storing the first direction side Y1 of the reactor core 54. The heat dissipation second surface 1111Y has, in the first recessed portion 1111Z, a core cooling portion 1111C formed so as to be opposed to an end on the first direction side Y1 of the reactor core 54. The reactor core 54 and the core cooling portion 1111C abut on each other with the third thermal resistance reduction portion 12C therebetween.

Also in the case of providing the reactor 50 as described above, the same effects as in embodiment 1 are provided. Further, since the coil cooling portion 1111A and the core cooling portion 1111C are provided to the substrate 1106, heat generated at the reactor coil 51 and the reactor core 54 is efficiently transferred to the first heat dissipation portion 1111, and thus can be cooled. Therefore, increase in the temperature of the power conversion device 1100 can be further suppressed.

Embodiment 12

Hereinafter, with reference to the drawings, embodiment 12 of the present invention will be described, focusing on difference from the above embodiment 11. The same parts as those in the above embodiment 11 are denoted by the same reference characters and the description thereof is omitted.

Figure 16:
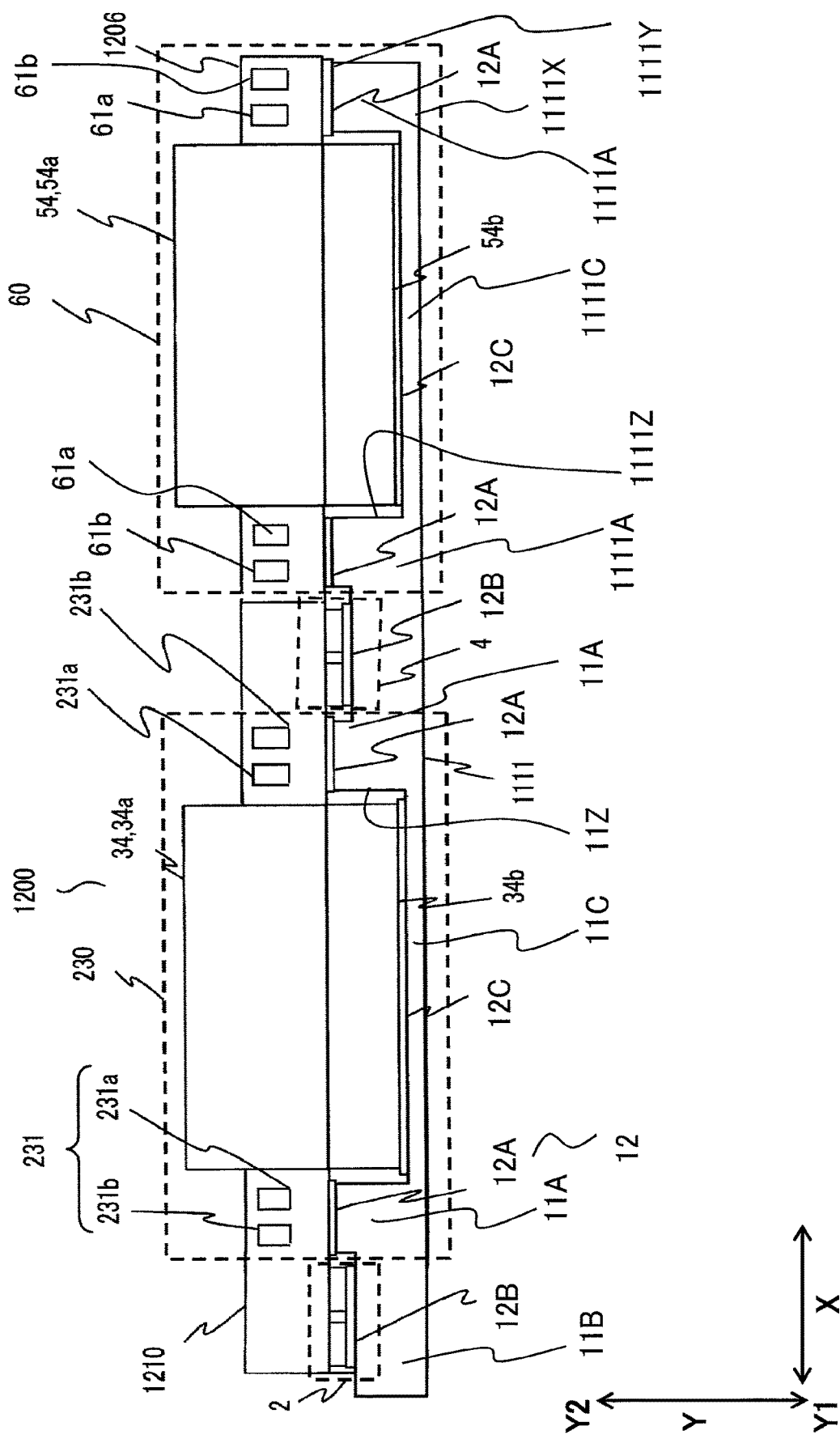
FIG. 16 is a sectional view showing the structure of a power conversion device according to embodiment 12 of the present invention.

FIG. 16 is a sectional view showing the structure of a power conversion device 1200 according to embodiment 12.

In a main body 1210 of the present embodiment, the first transformer coil 231a and the second transformer coil 231b of the transformer coil 231 are concentrically formed in a spiral shape so as to be arranged in the width direction X, and a reactor coil 61*a* and a reactor coil 61*b* of a reactor 60 are concentrically formed in a spiral shape so as to be arranged in the width direction X. The other configurations are the same as those of the power conversion device 1100 of embodiment 11.

In the power conversion device 1200 of the present embodiment, the structure on the left side in the width direction X is the same as that of the power conversion device 200 shown in FIG. 4 in embodiment 2.

The coil cooling portion 1111A of the first heat dissipation portion 1111 abuts on the part where the reactor coil 61*a* and the reactor coil 61*b* are formed.

Such an arrangement structure of the reactor coils 61*a*, 61*b* also enables effective heat dissipation as in embodiment 11.

Embodiment 13

Hereinafter, with reference to the drawings, embodiment 13 of the present invention will be described, focusing on difference from the above embodiment 11. The same parts as those in the above embodiment 11 are denoted by the same reference characters and the description thereof is omitted.

Figure 17:
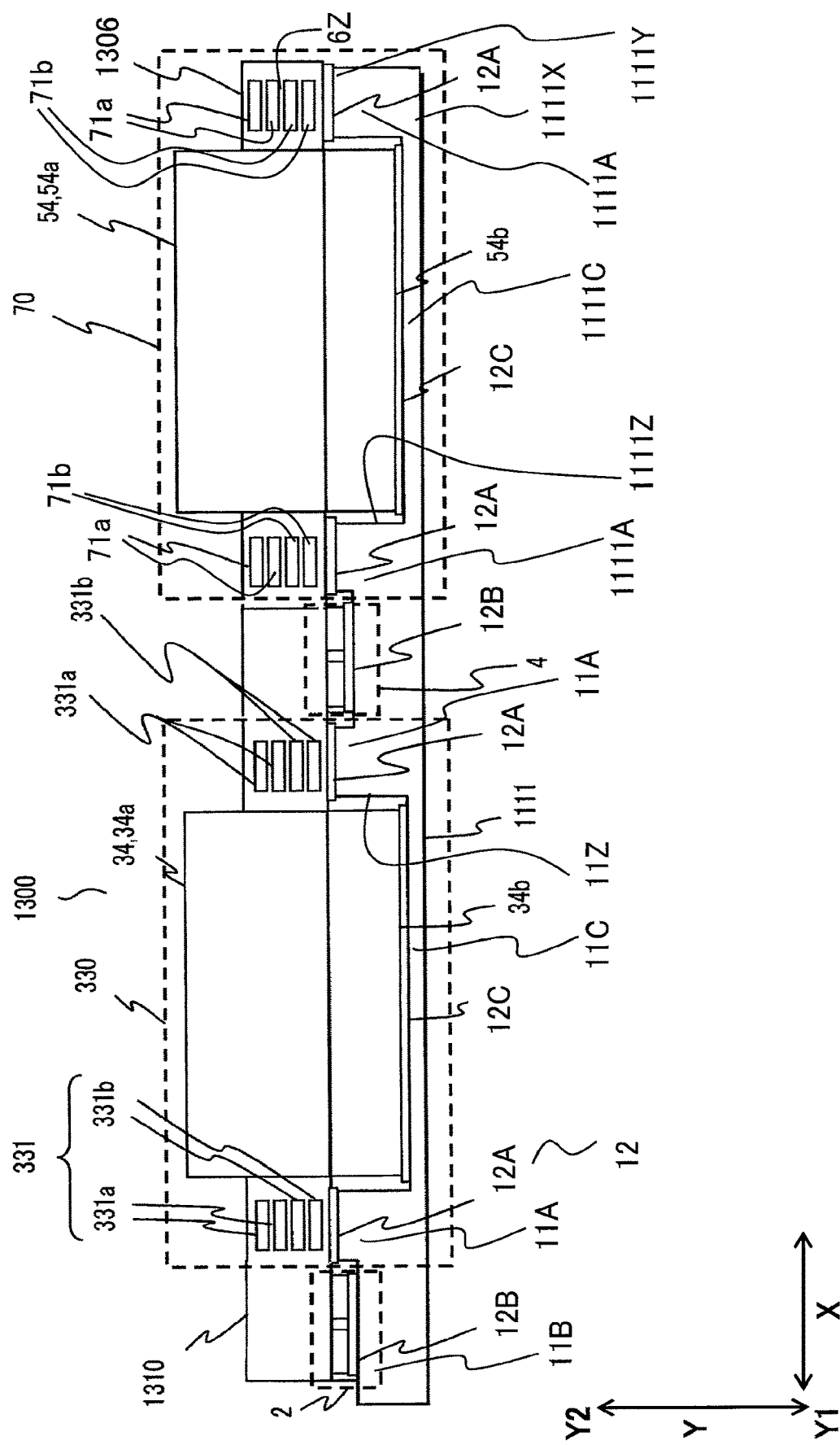
FIG. 17 is a sectional view showing the structure of a power conversion device according to embodiment 13 of the present invention.

FIG. 17 is a sectional view showing the structure of a power conversion device 1300 according to embodiment 13.

A substrate 1306 of a main body 1310 of the present embodiment is a four-layer substrate having four wiring layers laminated with insulating layers 6Z therebetween.

In the main body 1310, the first transformer coil 331*a* and the second transformer coil 331*b* of the transformer coil 331 are each wound by two turns, and these turns are respectively formed in different wiring layers. The first transformer coil 331*a* and the second transformer coil 331*b* are formed concentrically in a spiral shape so as to be opposed to each other in the thickness direction Y of the substrate 1306.

In addition, in the main body 1310, a reactor coil 71*a* and a reactor coil 71*b* of a reactor 70 are each wound by two turns, and these turns are respectively formed in different wiring layers. The reactor coil 71*a* and the reactor coil 71*b* are formed concentrically in a spiral shape so as to be opposed to each other in the thickness direction Y of the substrate 1306.

In the power conversion device 1300 of the present embodiment, the structure on the left side in the width direction X is the same as that of the power conversion device 300 shown in FIG. 5 in embodiment 3.

The coil cooling portion 1111A of the first heat dissipation portion 1111 abuts on the part where the reactor coil 71*a* and the reactor coil 71*b* are formed in the substrate 1306.

Such an arrangement structure of the reactor coils 71*a*, 71*b* also enables effective heat dissipation as in embodiment 11.

Embodiment 14

Hereinafter, with reference to the drawings, embodiment 14 of the present invention will be described, focusing on difference from the above embodiment 11. The same parts as those in the above embodiment 11 are denoted by the same reference characters and the description thereof is omitted.

Figure 18:
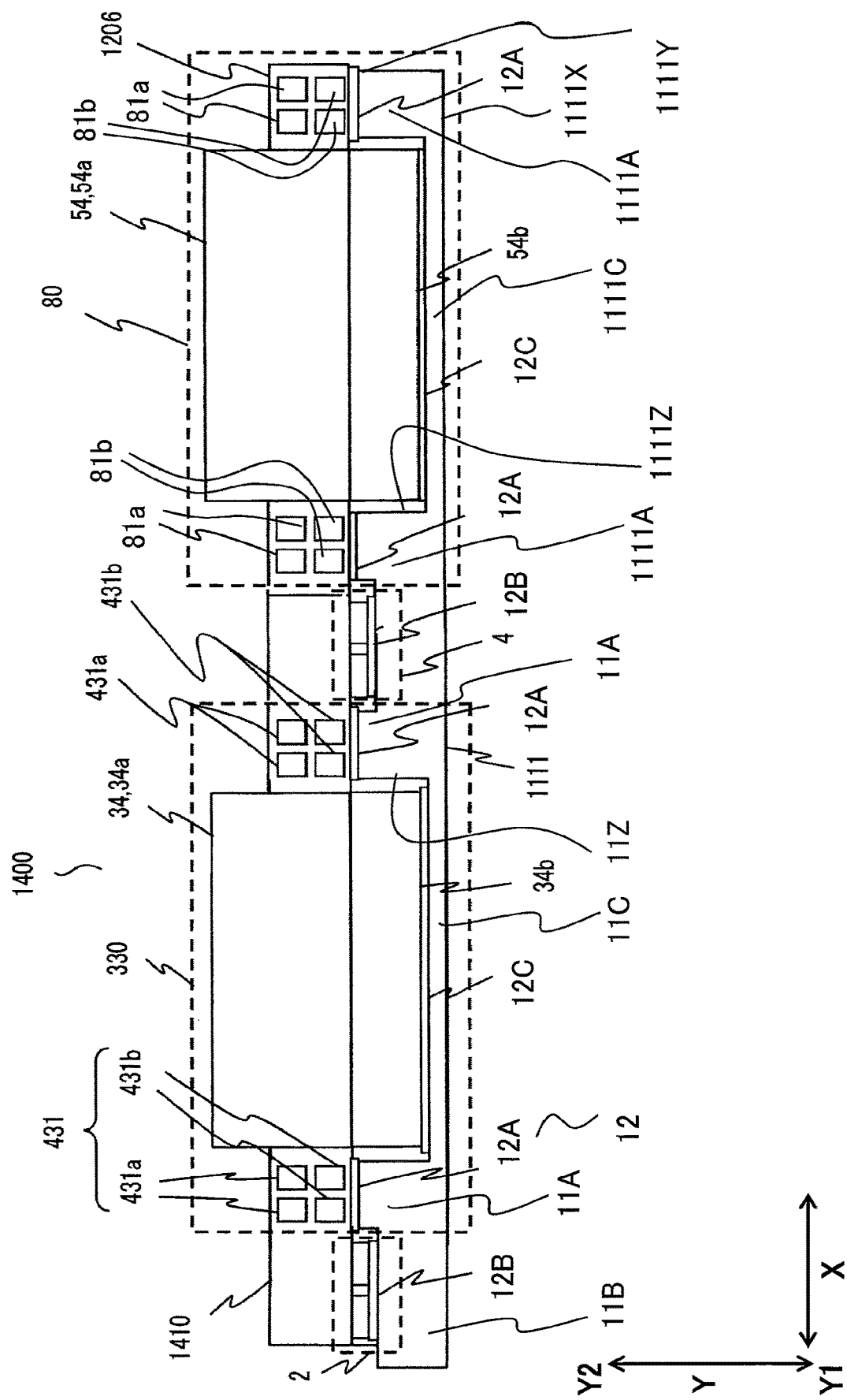
FIG. 18 is a sectional view showing the structure of a power conversion device according to embodiment 14 of the present invention.

FIG. 18 is a sectional view showing the structure of a power conversion device 1400 according to embodiment 14.

In a main body 1410, the first transformer coil 431*a* and the second transformer coil 431*b* are each wound by two turns. A reactor coil 81*a* and a reactor coil 81*b* of a reactor 80 are each wound by two turns.

The turns of the first transformer coil 431*a* are formed concentrically in a spiral shape in an identical wiring layer so as to be arranged in the width direction X. The turns of the second transformer coil 431*b* are formed concentrically in a spiral shape in an identical wiring layer so as to be arranged in the width direction X. The first transformer coil 431*a* and the second transformer coil 431*b* are formed concentrically so as to be opposed to each other in the thickness direction Y of a substrate 1206.

The turns of the reactor coil 81*a* are formed concentrically in a spiral shape in an identical wiring layer so as to be arranged in the width direction X. The turns of the reactor coil 81*b* are formed concentrically in a spiral shape in an identical wiring layer so as to be arranged in the width direction X. The reactor coil 81*a* and the reactor coil 81*b* are formed concentrically so as to be opposed to each other in the thickness direction Y of the substrate 1206. In the power conversion device 1400 of the present embodiment, the structure on the left side in the width direction X is the same as that of the power conversion device 400 shown in FIG. 6 in embodiment 4.

The coil cooling portion 1111A of the first heat dissipation portion 1111 abuts on the part where the reactor coil 81*a* and the reactor coil 81*b* are formed in the substrate 1206.

Such an arrangement structure of the reactor coils 81*a*, 81*b* also enables effective heat dissipation as in embodiment 11.

Embodiment 15

Hereinafter, with reference to the drawings, embodiment 15 of the present invention will be described, focusing on difference from the above embodiment 11. The same parts as those in the above embodiment 11 are denoted by the same reference characters and the description thereof is omitted.

Figure 19:
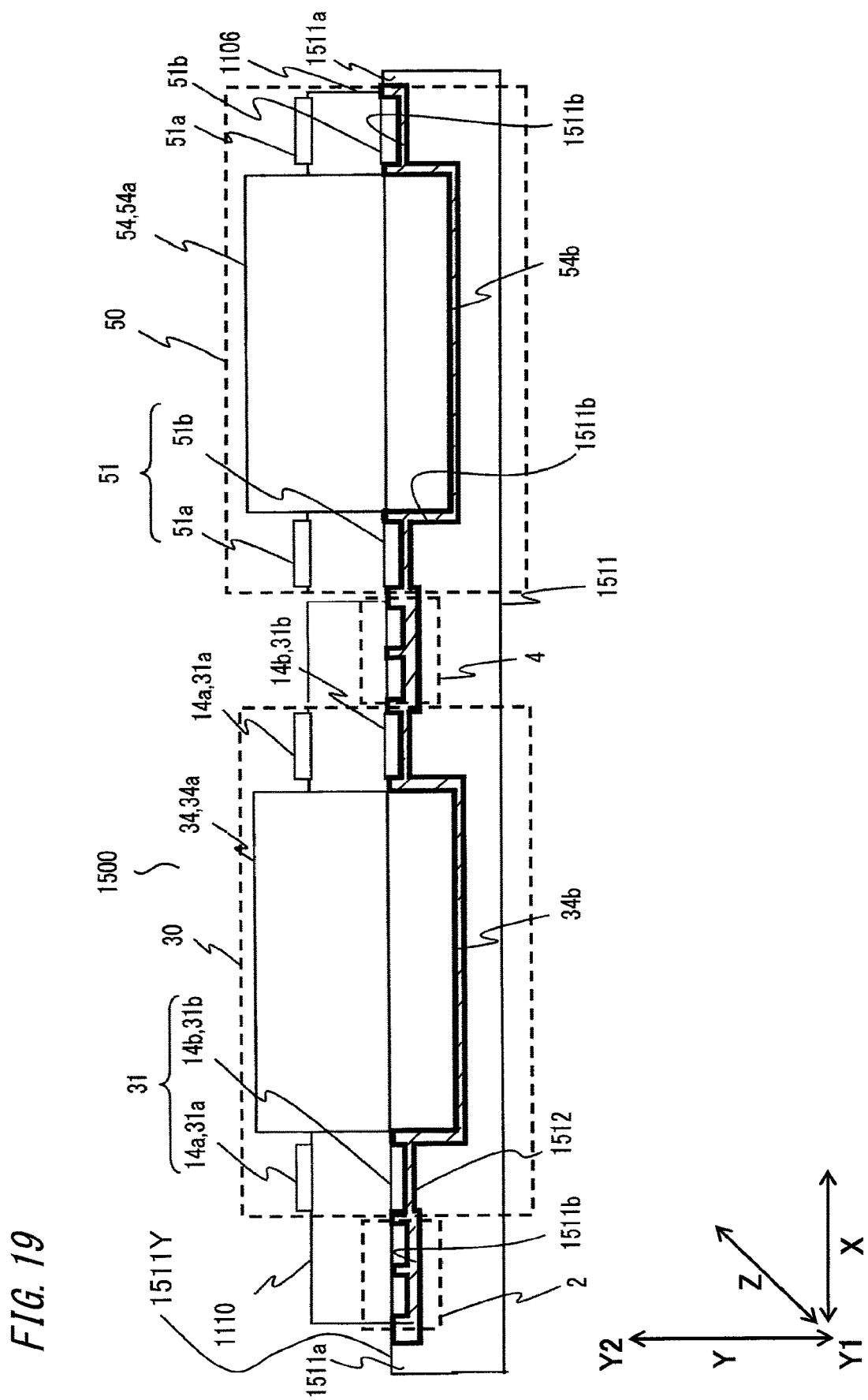
FIG. 19 is a sectional view showing the structure of a power conversion device according to embodiment 15 of the present invention.

FIG. 19 is a sectional view showing the structure of a power conversion device according to embodiment 15.

A first heat dissipation portion 1511 has protruding portions 1511*a* protruding toward the second direction side Y2 and formed at end portions on four sides in the width direction X and the depth direction Z on a heat dissipation second surface 1511Y on the second direction side Y2. Thus, a storage portion 1511*b* surrounded by the protruding portions 1511*a* is formed.

The first direction side Y1 of the main body 1110 of a power conversion device 1500 is stored in the storage portion 1511*b* of the first heat dissipation portion 1511.

Resin as a thermal resistance reduction member is filled between the main body 1110 and the first heat dissipation portion 1511. The filled resin forms a thermal resistance reduction portion 1512.

In FIG. 19, the area of the thermal resistance reduction portion 1512 is indicated by hatching with oblique lines. As shown in FIG. 19, the thermal resistance reduction portion 1512 is formed over the entire area between the first heat dissipation portion 1511 and the main body 1110.

The power conversion device 1500 of the present embodiment configured as described above provides the same effects as in embodiment 11. Further, it is not necessary to provide thermal resistance reduction portions individually, and therefore the structure of the power conversion device 1500 can be simplified and the manufacturing process can be simplified.

In addition, the contact area between the main body 1110 and the first heat dissipation portion 1511 increases, whereby heat generated at the main body 1110 can be effectively transferred to the first heat dissipation portion 1511.

Embodiment 16

Hereinafter, with reference to the drawings, embodiment 16 of the present invention will be described, focusing on difference from the above embodiment 11. The same parts as those in the above embodiment 11 are denoted by the same reference characters and the description thereof is omitted.

Figure 20:
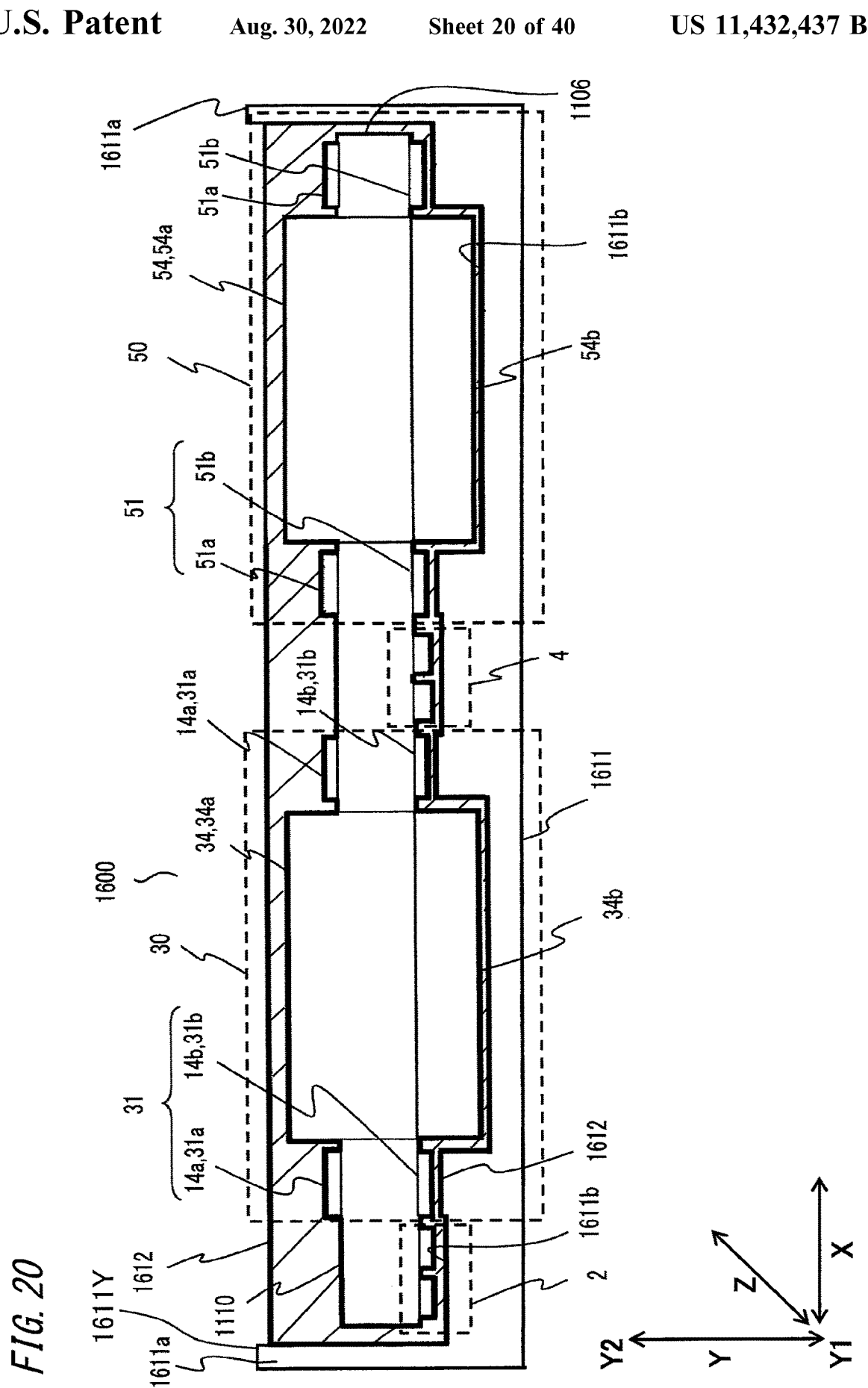
FIG. 20 is a sectional view showing the structure of a power conversion device according to embodiment 16 of the present invention.

FIG. 20 is a sectional view showing the structure of a power conversion device 1600 according to embodiment 16.

A first heat dissipation portion 1611 has protruding portions 1611*a* which protrude toward the second direction side Y2 so as to be higher than the main body 1110 by a predetermined dimension and which are formed at end portions on four sides in the width direction X and the depth direction Z in FIG. 20 on a heat dissipation second surface 1611Y on the second direction side Y2. Thus, a storage portion 1611*b* surrounded by the protruding portions 1611*a* is formed.

The first heat dissipation portion 1611 of the present embodiment is formed such that the height on the second direction side Y2 of the protruding portions 1611*a* is greater than the height of the protruding portions 1511*a* of embodiment 15. The other configurations of the first heat dissipation portion 1611 are the same as those of the first heat dissipation portion 1511 of embodiment 5.

The entire main body 1110 of the power conversion device 1600 is stored in the storage portion 1611*b*.

Resin as a thermal resistance reduction member is filled between the main body 1110 and the first heat dissipation portion 1611. The filled resin forms a thermal resistance reduction portion 1612.

In FIG. 20, the area of the thermal resistance reduction portion 1612 is indicated by hatching with oblique lines. As shown in FIG. 20, the thermal resistance reduction portion 1612 is formed over the entire area between the first heat dissipation portion 1611 and the main body 1110. Further, the thermal resistance reduction portion 1612 is formed to such a height as to cover the first transformer core member 34*a* and the first reactor core member 54*a* which are the upper end on the second direction side Y2 of the main body 1110, thus sealing the entire main body 1110.

The power conversion device 1600 of the present embodiment configured as described above provides the same effects as in embodiment 11. Further, it is not necessary to provide thermal resistance reduction portions individually, and therefore the structure of the power conversion device 1600 can be simplified and the manufacturing process can be simplified.

Further, in the power conversion device 1600, the thermal resistance reduction portion 1612 formed by filling the thermal resistance reduction member in the storage portion 1611*b* seals the entire main body 1110. Thus, more heat dissipation routes in multiple directions are ensured, whereby heat generated at the main body 1110 can be further effectively transferred to the first heat dissipation portion 1611.

In addition, the first power conversion unit 2, the transformer 30, the second power conversion unit 4, and the reactor 50 are molded with the thermal resistance reduction portion 1612, whereby vibration resistance and dust resistance can be improved.

Embodiment 17

Hereinafter, with reference to the drawings, embodiment 17 of the present invention will be described, focusing on difference from the above embodiment 11. The same parts as those in the above embodiment 11 are denoted by the same reference characters and the description thereof is omitted.

Figure 21:
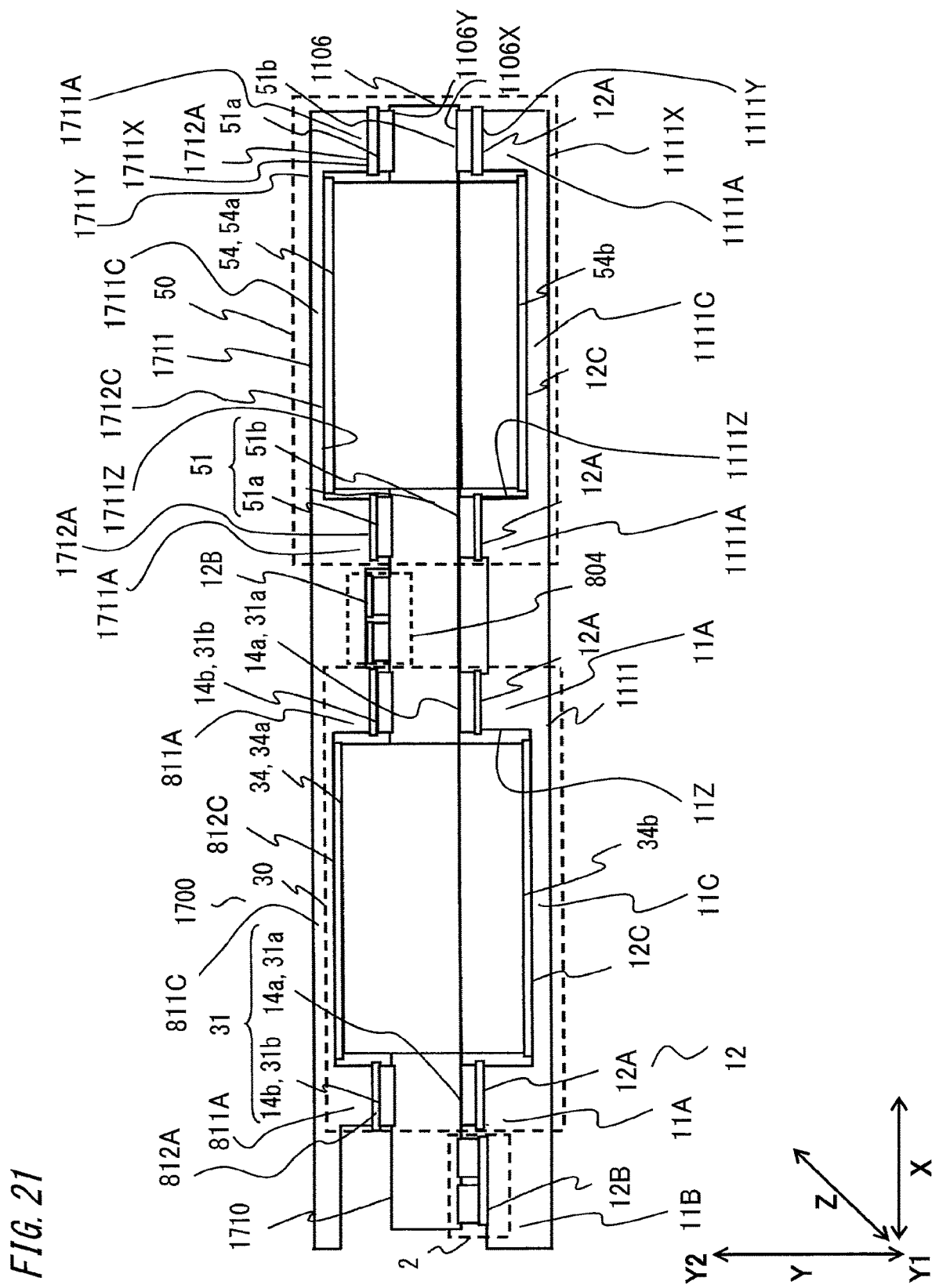
FIG. 21 is a sectional view showing the structure of a power conversion device according to embodiment 17 of the present invention.

FIG. 21 is a sectional view showing the structure of a power conversion device 1700 according to embodiment 17.

The second power conversion unit 804 of a main body 1710 in the present embodiment is provided on the substrate second surface 1106Y side of the substrate 1106. In addition, in the present embodiment, for the purpose of facilitating mutual connections, the first power conversion unit 2 and the first transformer coil 31*a* are provided on the substrate first surface 1106X side, and the second transformer coil 31*b* and the second power conversion unit 804 are provided on the substrate second surface 1106Y side.

The second power conversion unit 804 is the same as the second power conversion unit 4 shown in FIG. 15 in embodiment 11, except that the second power conversion unit 804 is provided on the substrate second surface 1106Y side.

A second heat dissipation portion 1711 is the same as the first heat dissipation portion 1111, and holds the substrate 1106 and dissipates heat generated at the substrate 1106 (main body 1710), from the surface to the air. The second heat dissipation portion 1711 is fixed on the substrate second surface 1106Y side of the substrate 1106, and is located to be plane-symmetric with the first heat dissipation portion 1111, on the second direction side Y2 of the main body 1710.

A heat dissipation first surface 1711X of the second heat dissipation portion 1711 has a first recessed portion 17112 recessed toward the second direction side Y2 and storing the second direction side Y2 of the reactor core 54. The heat dissipation first surface 1711X of the second heat dissipation portion 1711 has, in the first recessed portion 17112, a core cooling portion 1711C formed so as to be opposed to an end on the second direction side Y2 of the reactor 50. The reactor core 54 and the core cooling portion 1711C of the second heat dissipation portion 1711 abut on each other with a third thermal resistance reduction portion 1712C therebetween.

Thus, of the reactor core 54, an end on the first direction side Y1 side abuts on the core cooling portion 1111C of the first heat dissipation portion 1111, and an end on the second direction side Y2 abuts on the core cooling portion 1711C of the second heat dissipation portion 1711.

The second heat dissipation portion 1711 serves as a housing holding the main body 1710, as in the first heat dissipation portion 1111. Therefore, a heat dissipation second surface 1711Y of the second heat dissipation portion 1711 is formed to be an outermost peripheral surface on the second direction side Y2 of the power conversion device 1700.

In the drawing, the heat dissipation second surface 1711Y of the second heat dissipation portion 1711 is shown as a flat shape. However, the heat dissipation second surface 1711Y may be a protrusion/recess shape. The second heat dissipation portion 1711 may have a cooling water channel through which cooling water flows in order to improve heat dissipation property.

The heat dissipation first surface 1711X of the second heat dissipation portion 1711 has a coil cooling portion 1711A formed so as to be opposed to the part where the reactor coils 51*a*, 51*b* are formed on the substrate 1106. The part where the reactor coils 51*a*, 51*b* are formed on the substrate 1106, and the coil cooling portion 1711A, abut on each other with a first thermal resistance reduction portion 1712A therebetween.

Thus, the part where the reactor coils 51*a*, 51*b* are formed on the substrate 1106 abuts on the coil cooling portion 1111A of the first heat dissipation portion 1111, at the substrate first surface 1106X, and abuts on the coil cooling portion 1711A of the second heat dissipation portion 1711, at the substrate second surface 1106Y.

In the power conversion device 1700 of the present embodiment, the structure on the left side in the width direction X is the same as that of the power conversion device 800 shown in FIG. 10 in embodiment 8.

The power conversion device 1700 of the present embodiment configured as described above provides the same effects as in embodiment 11. Further, the part where the reactor coils 51a, 51b are formed on the substrate 1106 abuts on the coil cooling portion 1111A of the first heat dissipation portion 1111, at the substrate first surface 1106X, and abuts on the coil cooling portion 1711A of the second heat dissipation portion 1711, at the substrate second surface 1106Y.

Thus, heat generated at the reactor coils 51a, 51b during operation of the power conversion device 1700 is dissipated from both of the substrate first surface 1106X and the substrate second surface 1106Y via the first heat dissipation portion 1111 and the second heat dissipation portion 1711.

Therefore, the heat dissipation volume with respect to the part where the reactor coils 51a, 51b are formed increases, whereby increase in the temperature of the power conversion device 1700 can be further suppressed.

The heat dissipation second surface 1711Y of the second heat dissipation portion 1711 is formed to be an outermost peripheral surface on the second direction side Y2 of the power conversion device 1700, and thus can be used as a mounting surface for fixing the power conversion device 1700 to another electric apparatus. Also, the shape of the heat dissipation second surface 1711Y can be formed to be a shape corresponding to a protrusion/recess shape of the electric apparatus to which the power conversion device 1700 is mounted. Thus, both of a heat dissipation first surface 1111X of the first heat dissipation portion 1111 and the heat dissipation second surface 1711Y of the second heat dissipation portion 1711 can be used as mounting surfaces, and therefore it becomes possible to adapt to various shapes of electric apparatuses to which the power conversion device 1700 is mounted.

When the power conversion device 1700 is mounted to another electric apparatus, it is not necessary to use a separate housing for storing the second direction side Y2 of the power conversion device 1700. As a result, it is not necessary to use silicone grease or the like which has high thermal resistance and which is to be applied between such a separate housing and the second heat dissipation portion 1711 of the power conversion device 1700. Thus, heat dissipation property of the power conversion device 1700 can be improved.

Of the reactor core 54, an end on the first direction side Y1 of the first heat dissipation portion 1111 abuts on the core cooling portion 1111C, and an end on the second direction side Y2 abuts on the core cooling portion 1711C of the second heat dissipation portion 1711. Thus, heat generated at the reactor core 54 is dissipated from both of the end on the first direction side Y1 and the end on the second direction side Y2 of the reactor core 54, via the first heat dissipation portion 1111 and the second heat dissipation portion 1711. Thus, the heat dissipation volume with respect to the reactor core 54 increases, whereby increase in the temperature of the power conversion device 1700 can be further suppressed.

The second heat dissipation portion 1711 has the first recessed portion 1711Z storing the second direction side Y2 of the reactor core 54. Thus, the height of the power conversion device 1700 is reduced, whereby a further thin power conversion device 1700 can be provided.

Embodiment 18

Hereinafter, with reference to the drawings, embodiment 18 of the present invention will be described, focusing on difference from the above embodiment 11. The same parts as those in the above embodiment 11 are denoted by the same reference characters and the description thereof is omitted.

Figure 22:
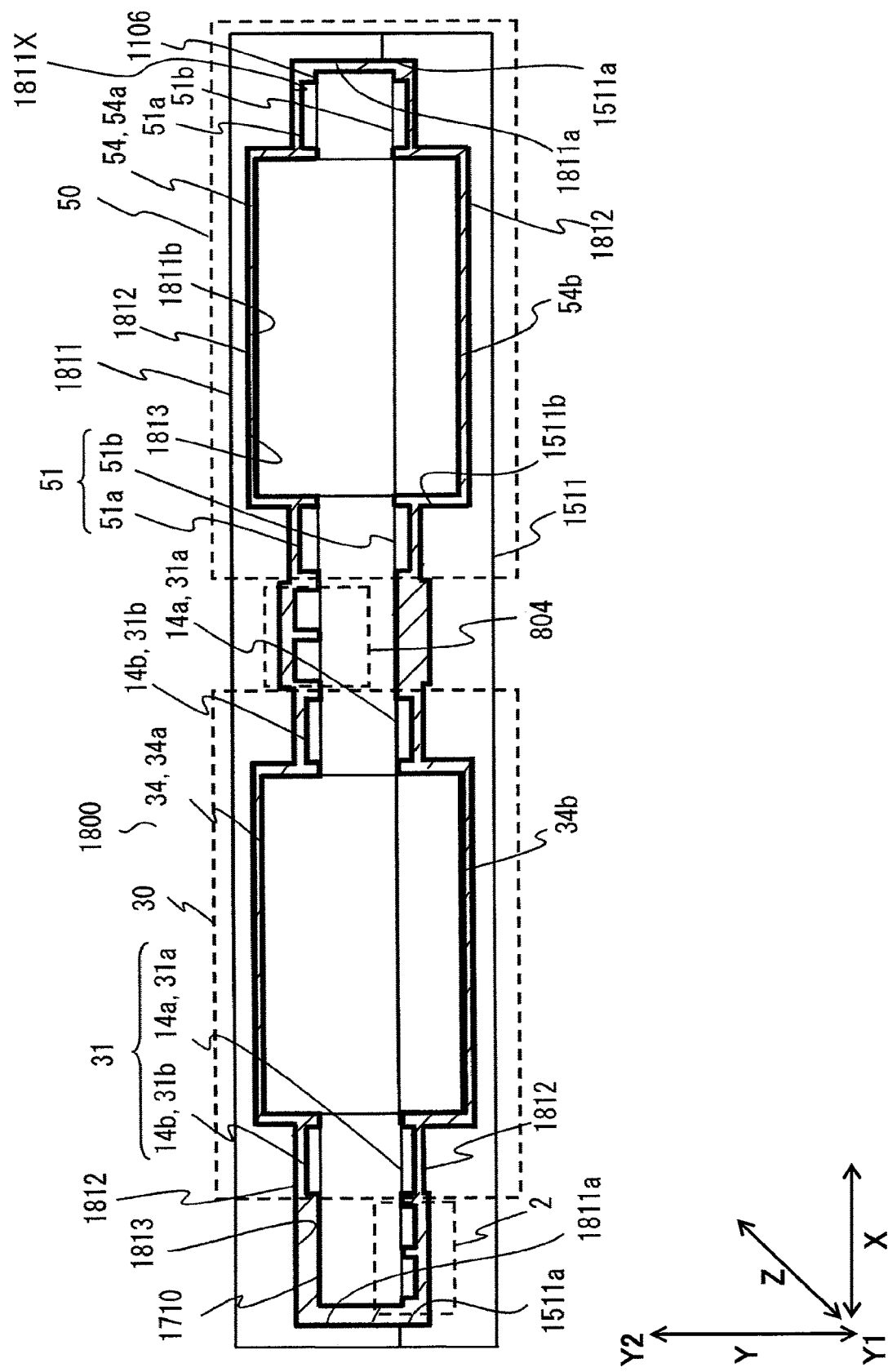
FIG. 22 is a sectional view showing the structure of a power conversion device according to embodiment 18 of the present invention.

FIG. 22 is a sectional view showing the structure of a power conversion device 1800 according to embodiment 18.

A second heat dissipation portion 1811 of the main body 1710 has protruding portions 1811a protruding toward the first direction side Y1 and formed at end portions on four sides in the width direction X and the depth direction Z on a heat dissipation first surface 1811X on the first direction side Y1. Thus, a storage portion 1811b is formed which is surrounded by the protruding portions 1811a and opens toward the first direction side Y1. The second heat dissipation portion 1811 has the same configuration as the first heat dissipation portion 1511 shown in FIG. 19 in embodiment 15, except for the above configuration.

As shown in FIG. 22, the protruding portions 1511a of the first heat dissipation portion 1511 and the protruding portions 1811a of the second heat dissipation portion 1811 abut on each other so as to be opposed to each other in the thickness direction Y. Thus, the storage portion 1511b of the first heat dissipation portion 1511 and the storage portion 1811b of the second heat dissipation portion 1811 form a storage portion 1813.

The main body 1710 of the power conversion device 1800 is stored in the storage portion 1813.

Resin as a thermal resistance reduction member, which has high thermal conductivity and high insulation property, is filled between the main body 1710 and the first heat dissipation portion 1511, and between the main body 1710 and the second heat dissipation portion 1811. The filled resin forms a thermal resistance reduction portion 1812.

In FIG. 22, the area of the thermal resistance reduction portion 1812 is indicated by hatching with oblique lines.

As shown in the drawing, the entire main body 1710 is sealed by the thermal resistance reduction portion 1812.

The power conversion device 1800 of the present embodiment configured as described above provides the same effects as in embodiment 11. Further, the first heat dissipation portion 1511 and the second heat dissipation portion 1811 are provided on the first direction side Y1 and the second direction side Y2 of the main body 1710, and the thermal resistance reduction portion 1812 having high thermal conductivity and high insulation property is provided therebetween.

Thus, it is possible to ensure a great heat dissipation volume and many heat dissipation routes in multiple directions. Therefore, the structure of the power conversion device 1800 can be simplified and increase in the temperature of the power conversion device 1800 can be further suppressed.

Embodiment 19

Figure 23:
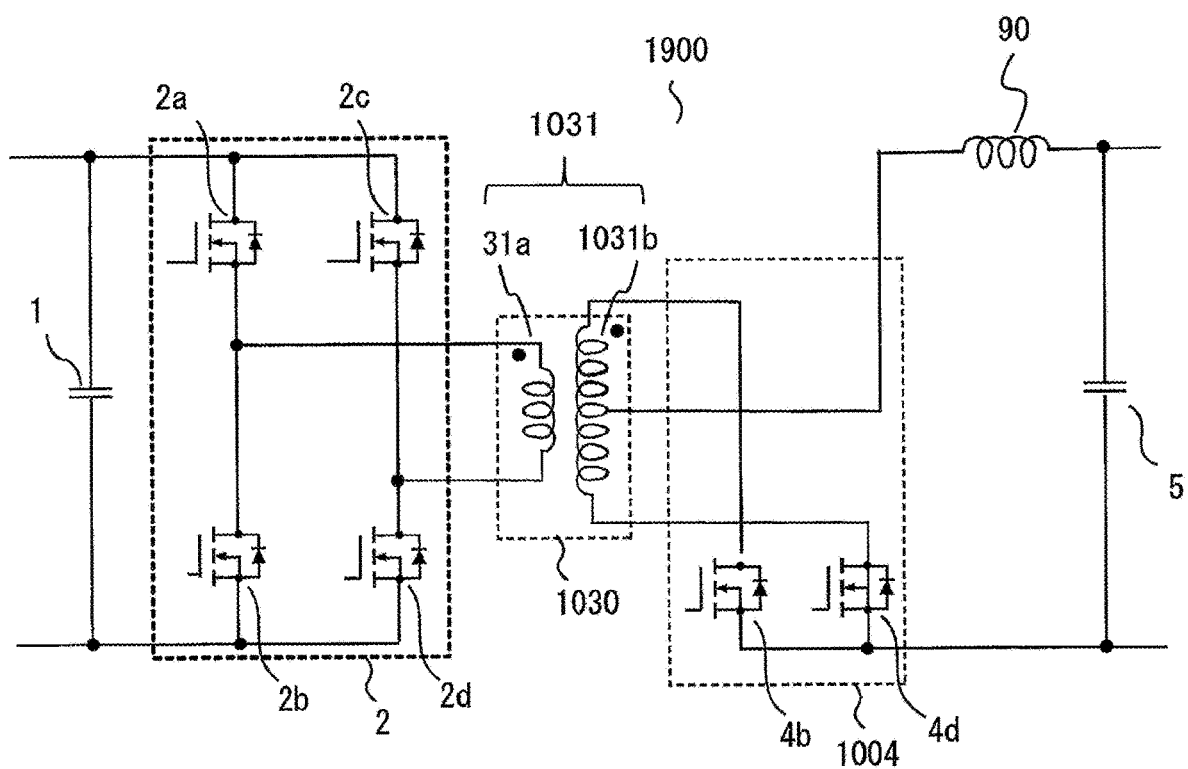
FIG. 23 is a circuit diagram showing a circuit configuration of a power conversion device according to embodiment 19 of the present invention.

FIG. 23 is a circuit diagram showing a circuit of a power conversion device according to embodiment 19.

In FIG. 23, a power conversion device 1900 includes a reactor 90.

The reactor 90 includes a reactor coil and a reactor core (not shown).

The reactor coil of the reactor 90 has the same configuration as the reactor coil 51a and the reactor coil 51b shown in FIG. 14 and FIG. 15 in embodiment 11.

The reactor 90 is provided in series between the center tap of the second transformer coil 1031b and the capacitor 5. A load (not shown) is connected to both ends of the capacitor 5.

The first power conversion unit 2, the transformer 1030, the second power conversion unit 1004, and the reactor 90 are mounted on the same substrate as the substrate 1106 shown in FIG. 15 in embodiment 11, to form a main body of the power conversion device 1900. The other configurations are the same as in the embodiment shown in FIG. 12, and therefore the corresponding components are denoted by the same reference characters and the description thereof is omitted.

Even in the case where the circuit configuration of the second power conversion unit is different as described above, by adopting the same arrangement, heat generated at the main body of the power conversion device 1900 can be effectively dissipated.

Embodiment 20

FIG. 24 to FIG. 32 show the configuration of a power conversion device according to embodiment 20.

Figure 24:
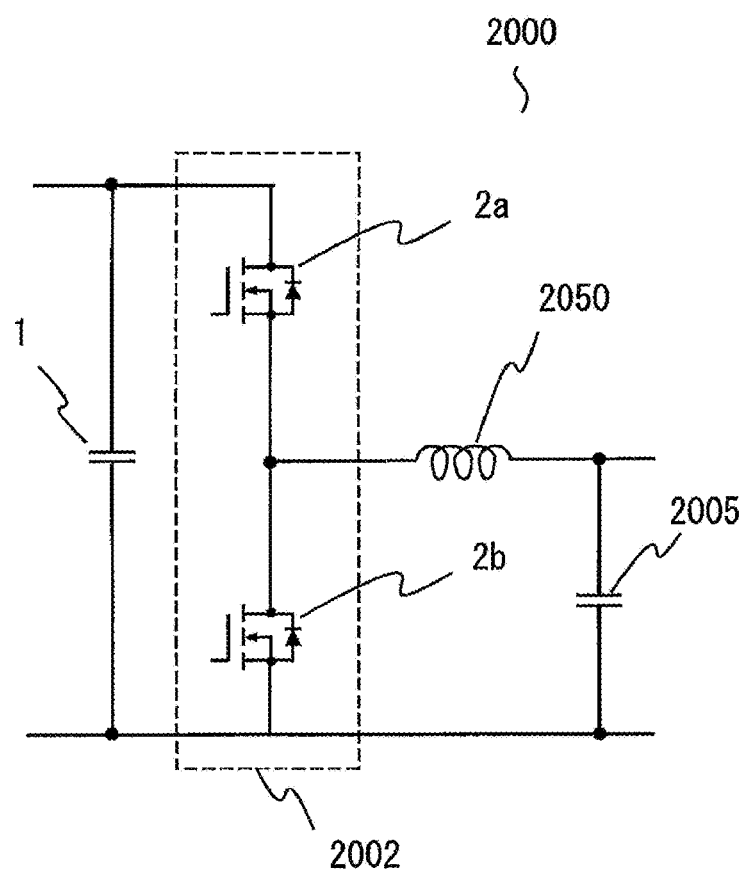
FIG. 24 is a circuit diagram showing a circuit configuration of a power conversion device according to embodiment 20 of the present invention.

FIG. 24 is a circuit diagram showing a circuit of the power conversion device.

Figure 25:
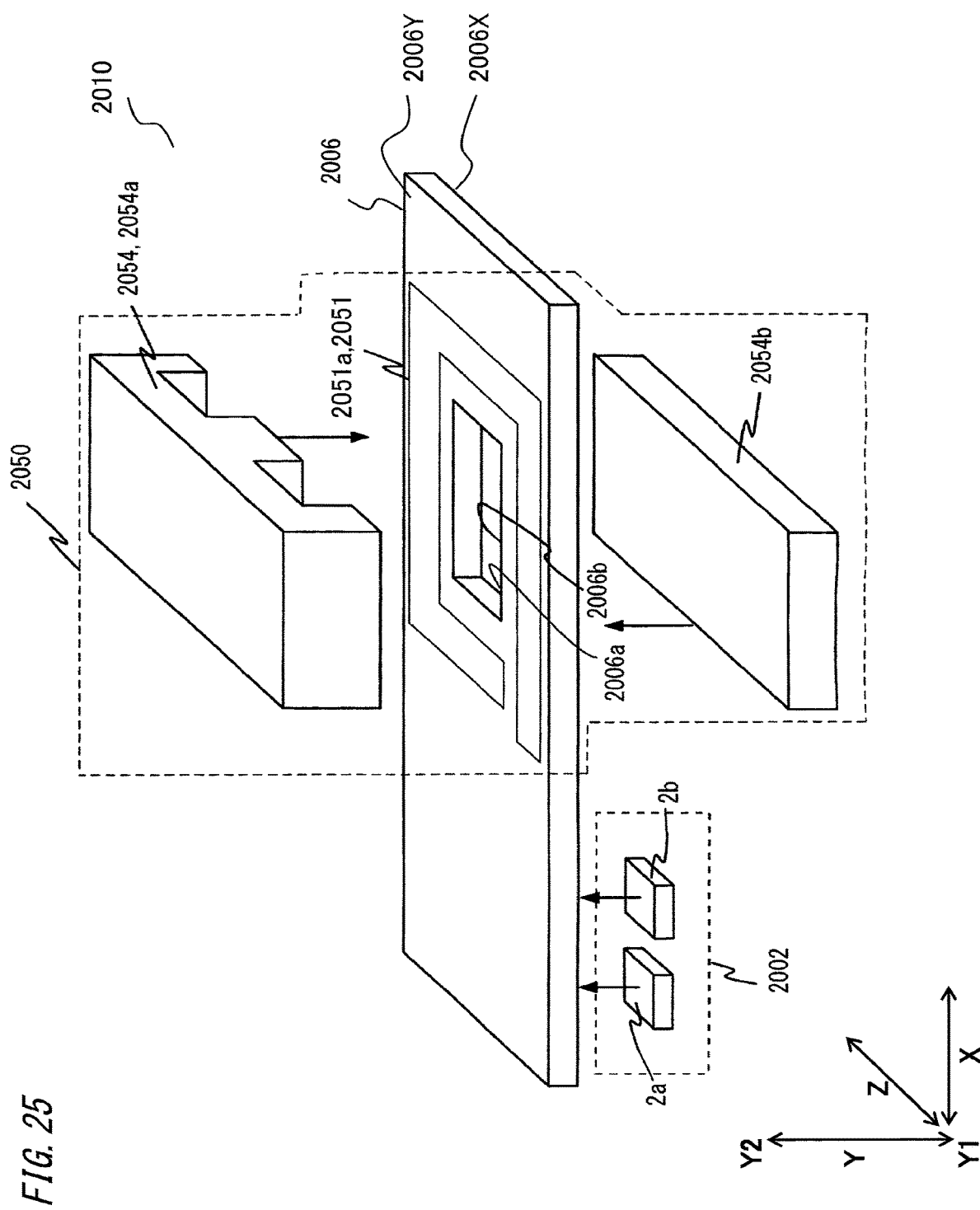
FIG. 25 is a perspective view showing a major part of the power conversion device according to embodiment 20 of the present invention.

FIG. 25 is a perspective view showing a main body forming the power conversion device.

Figure 26:
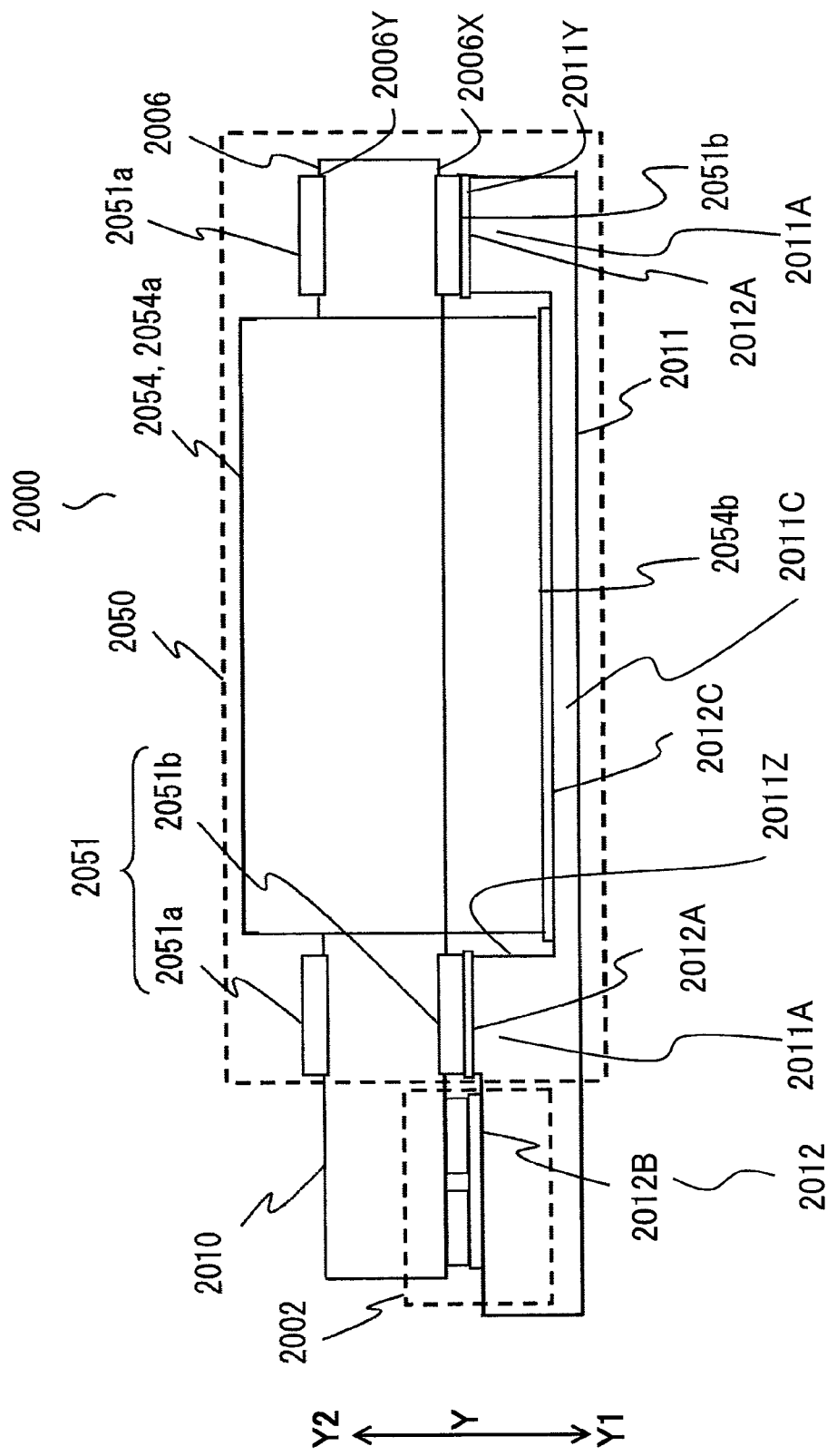
FIG. 26 is a sectional view showing the structure of the power conversion device according to embodiment 20 of the present invention.

FIG. 26 is a sectional view showing the structure of the power conversion device.

FIG. 27 to FIG. 32 show power conversion devices having structures different from that shown in FIG. 26.

First, the circuit configuration of a power conversion device 2000 will be described with reference to FIG. 24.

In FIG. 24, the power conversion device 2000 includes the capacitor 1, a first power conversion unit 2002 as a power conversion unit, and a reactor 2050.

The first power conversion unit 2002 includes the switching element 2a as a power conversion element and a first switching element, and the switching element 2b as a power conversion element and a second switching element, which are connected in series to each other.

The switching element 2a and the switching element 2b connected in series to each other are connected in parallel to the capacitor 1. One end of the reactor 2050 is connected to the connection point between the switching element 2a and the switching element 2b connected in series to each other. A capacitor 2005 is connected between the other end of the reactor 2050 and the source of the switching element 2b. A load (not shown) is connected in parallel to the capacitor 2005.

In the case where the first power conversion unit 2002 operates as, for example, a step-down DC-DC converter, the first power conversion unit 2002 converts DC voltage applied to the capacitor 1 by a DC power supply (not shown), to another DC voltage, and supplies the resultant DC voltage to a load such as a battery (not shown).

Next, the structure of the power conversion device 2000 will be described with reference to FIG. 25 and FIG. 26. A main body 2010 of the power conversion device 2000 includes the first power conversion unit 2002, a substrate 2006 made of an insulating material and having a flat plate shape, and the reactor 2050.

It is noted that the capacitor 1 and the capacitor 2005 are provided separately from the main body 2010 and therefore are not shown in FIG. 25.

The reactor 2050 includes a reactor coil 2051 as a coil, and a reactor core 2054 as a core.

The substrate 2006 has a through hole 2006b as an opening which opens in the thickness direction Y of the substrate 2006. The through hole 2006b has the same structure as the through hole 6b shown in embodiment 1 and is formed by a hole forming portion 2006a.

On a substrate second surface 2006Y on the second direction side Y2 of the substrate 2006, a reactor coil 2051a wound by one turn is formed in a spiral shape by a conductor pattern concentrically with the hole forming portion 2006a. On a substrate first surface 2006X of the substrate 2006, a reactor coil 2051b wound by one turn is formed in a spiral shape by a conductor pattern.

The two reactor coils 2051a and 2051b formed on the substrate first surface 2006X side and the substrate second surface 2006Y side of the substrate 2006 are connected in series to form the reactor coil 2051 wound by two turns. One end of the reactor coil 2051 is connected to the connection point between the switching element 2a and the switching element 2b, and the other end is connected to one terminal of the capacitor 5.

The reactor core 2054 is a three-leg reactor core, and includes a first reactor core member 2054a having an E-shaped cross section in the depth direction Z of the substrate 2006, and a second reactor core member 2054b having a flat plate shape. The first reactor core member 2054a and the second reactor core member 2054b are formed by molding soft magnetic ferrite.

As shown in FIG. 25, the reactor core 2054 is provided such that the center leg of the first reactor core member 2054a penetrates the through hole 2006b and both side legs thereof are located on outer sides of the substrate 2006. The second reactor core member 2054b is combined from below with the first reactor core member 2054a, to form the reactor core 2054, which is thus mounted to the substrate 2006.

The power conversion device 2000 includes the main body 2010 shown in FIG. 25, a first heat dissipation portion 2011, and a thermal resistance reduction portion 2012 (2012A, 2012B, 2012C).

A heat dissipation second surface 2011Y of the first heat dissipation portion 2011 has a coil cooling portion 2011A formed so as to be opposed to the part where the reactor coil 2051 is formed on the substrate 2006. The part where the reactor coils 2051a, 2051b are formed on the substrate 2006, and the coil cooling portion 2011A, abut on each other with a first thermal resistance reduction portion 2012A therebetween.

The heat dissipation second surface 2011Y of the first heat dissipation portion 2011 has a first recessed portion 20112 recessed toward the first direction side Y1 and storing the first direction side Y1 of the reactor core 2054. The heat dissipation second surface 2011Y has, in the first recessed portion 2011Z, a core cooling portion 2011C formed so as to be opposed to an end on the first direction side Y1 of the reactor core 2054. The reactor core 2054 and the core cooling portion 2011C abut on each other with a third thermal resistance reduction portion 2012C therebetween.

Even in the case where the circuit configuration is different from those in the above embodiments as described above, by adopting the same arrangement, heat generated at the main body 2010 of the power conversion device 2000 can be effectively dissipated.

Hereinafter, other configuration examples of the power conversion device will be described with reference to FIG. 27 to FIG. 32.

Figure 27:
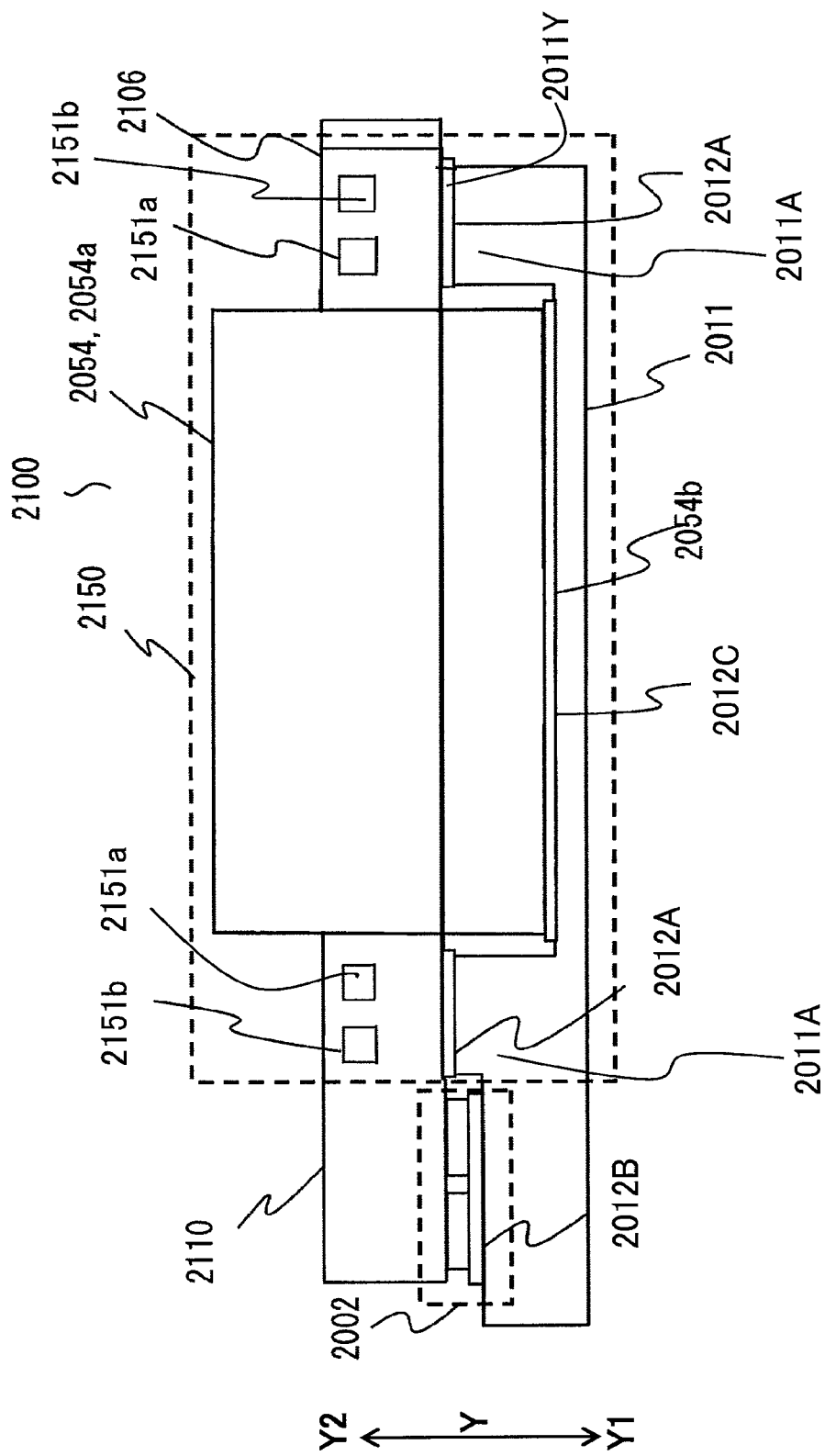
FIG. 27 is a sectional view showing the structure of the power conversion device according to embodiment 20 of the present invention.

In a main body 2110 of a power conversion device 2100 shown in FIG. 27, a reactor 2150 includes a reactor coil 2151a and a reactor coil 2151b.

The reactor coil 2151a and the reactor coil 2151b are formed concentrically in a spiral shape so as to be arranged in the width direction X.

The coil cooling portion 2011A of the first heat dissipation portion 2011 abuts on the part where the reactor coil 2151a and the reactor coil 2151b are formed.

Figure 28:
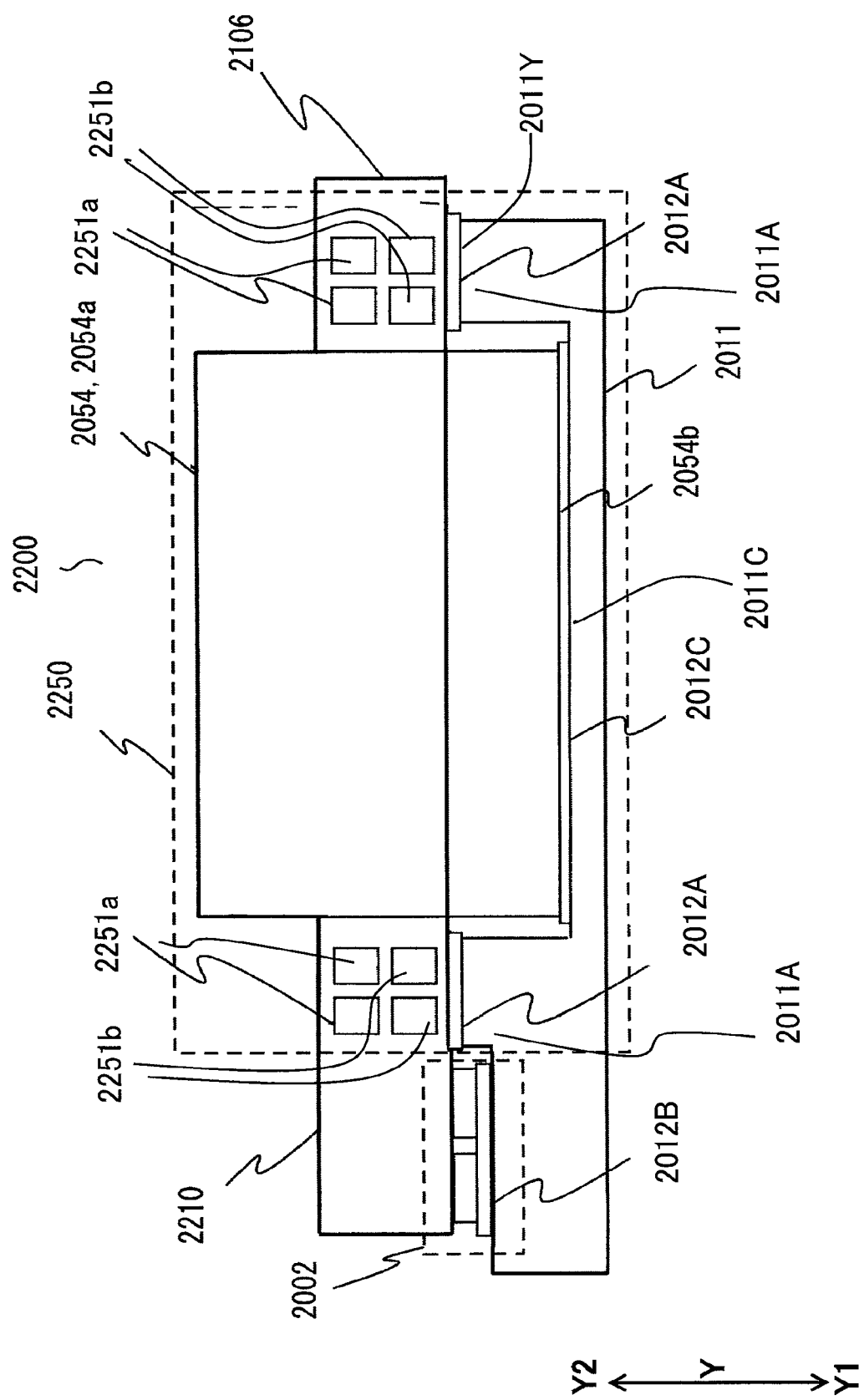
FIG. 28 is a sectional view showing the structure of the power conversion device according to embodiment 20 of the present invention.

In a main body 2210 of a power conversion device 2200 shown in FIG. 28, a reactor 2250 includes a reactor coil 2251a and a reactor coil 2251b.

The reactor coil 2251a and the reactor coil 2251b are wound by two turns.

The turns of the reactor coil 2251a are formed concentrically in a spiral shape in an identical wiring layer so as to be arranged in the width direction X. The turns of the reactor coil 2251b are formed concentrically in a spiral shape in an identical wiring layer so as to be arranged in the width direction X. The reactor coil 2251a and the reactor coil 2251b are formed concentrically so as to be opposed to each other in the thickness direction Y of a substrate 2106.

The coil cooling portion 2011A of the first heat dissipation portion 2011 abuts on the part where the reactor coil 2251a and the reactor coil 2251b are formed.

Figure 29:
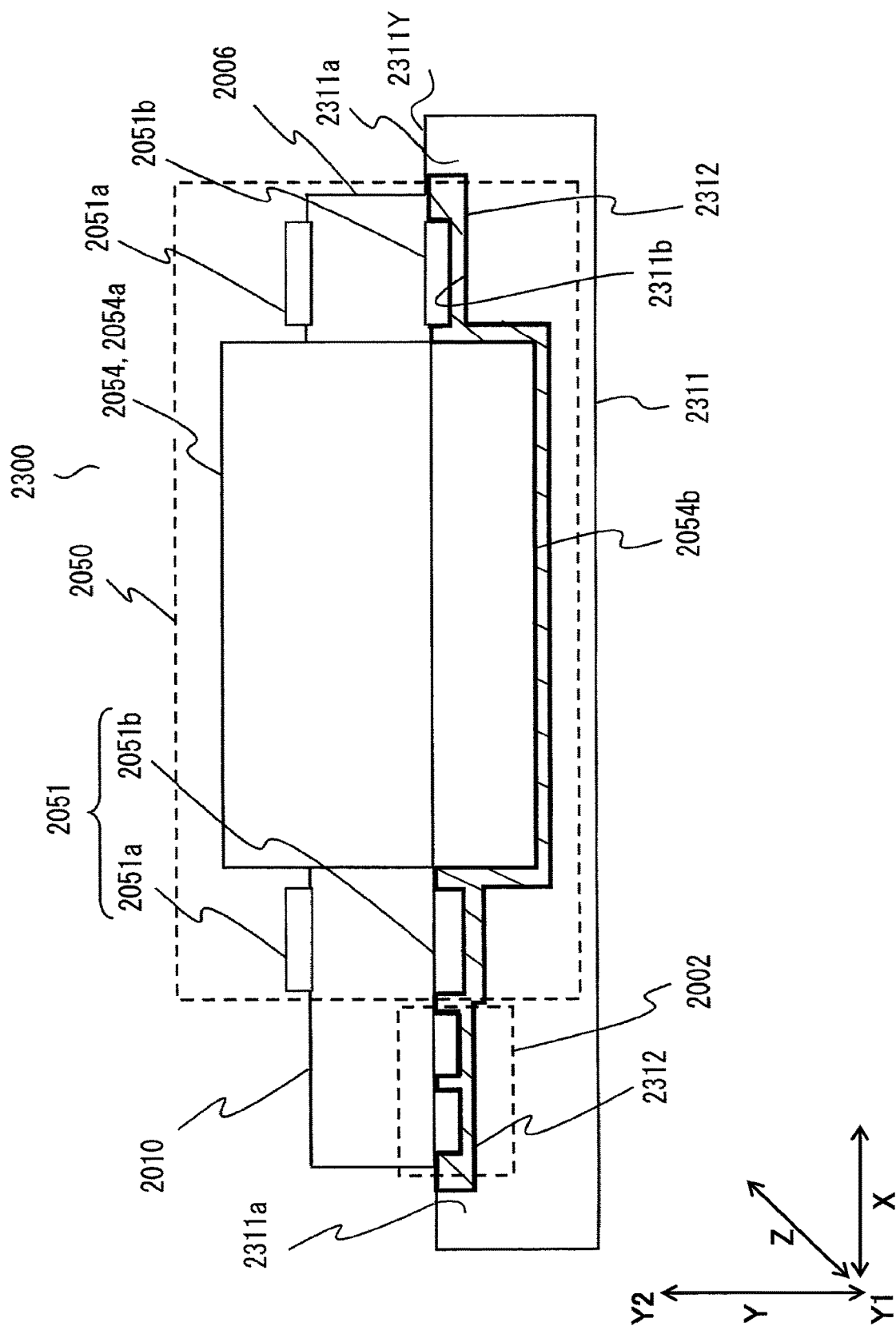
FIG. 29 is a sectional view showing the structure of the power conversion device according to embodiment 20 of the present invention.

In a power conversion device 2300 shown in FIG. 29, a first heat dissipation portion 2311 thereof has protruding portions 2311a protruding toward the second direction side Y2 and formed at end portions on four sides in the width direction X and the depth direction Z on a heat dissipation second surface 2311Y on the second direction side Y2. Thus, a storage portion 2311b surrounded by the protruding portions 2311a is formed.

The first direction side Y1 of the main body 2010 of the power conversion device 2300 is stored in the storage portion 2311b of the first heat dissipation portion 2311.

Resin as a thermal resistance reduction member is filled between the main body 2010 and the first heat dissipation portion 2311. The filled resin forms a thermal resistance reduction portion 2312 indicated by hatching with oblique lines.

Figure 30:
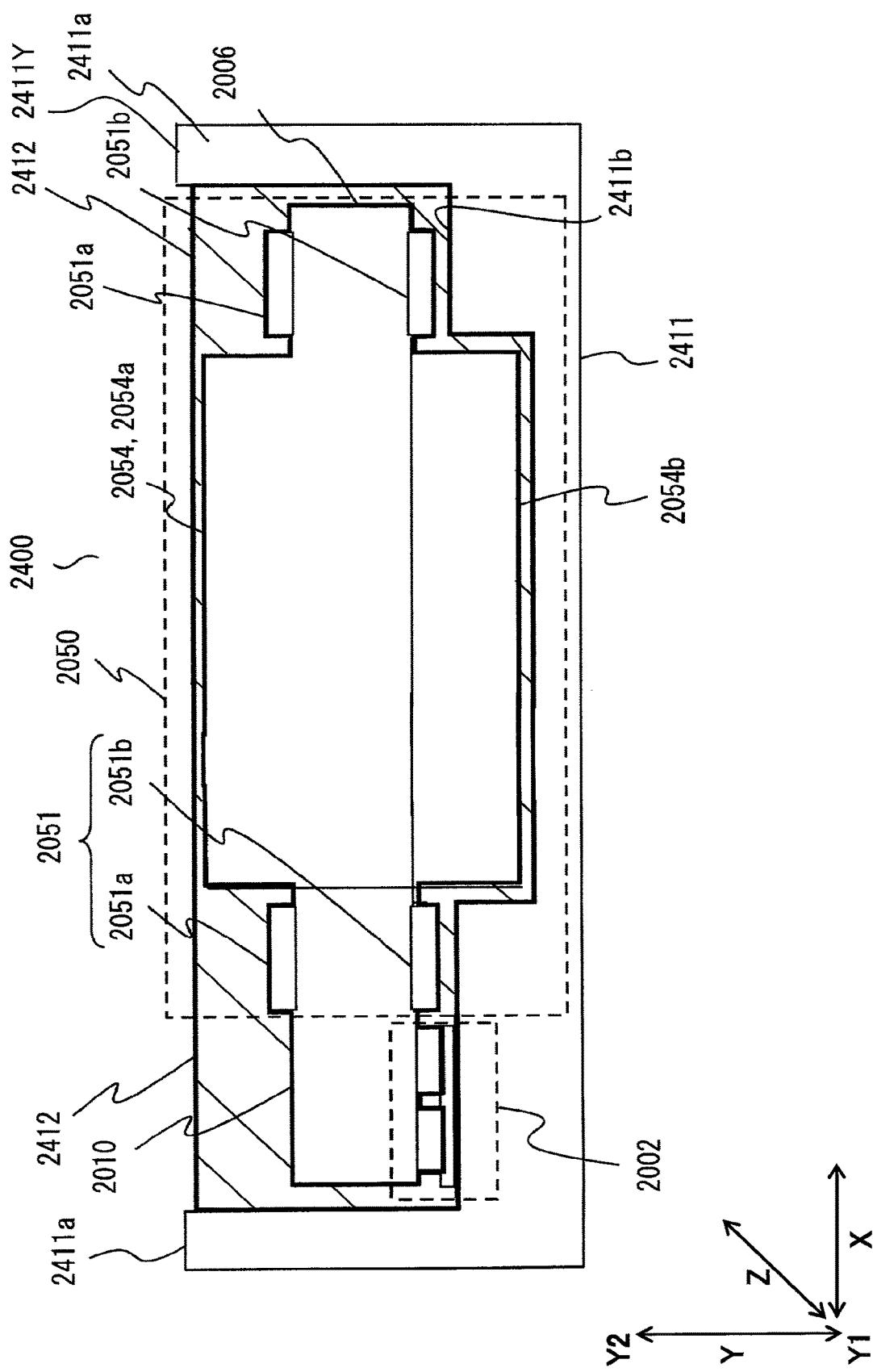
FIG. 30 is a sectional view showing the structure of the power conversion device according to embodiment 20 of the present invention.

In a power conversion device 2400 shown in FIG. 30, a first heat dissipation portion 2411 thereof has protruding portions 2411a which protrude toward the second direction side Y2 so as to be higher than the main body 2010 by a predetermined dimension and which are formed at end portions on four sides in the width direction X and the depth direction Z in FIG. 30 on a heat dissipation second surface 2411Y on the second direction side Y2. Thus, a storage portion 2411b surrounded by the protruding portions 2411a is formed.

The entire main body 2010 of the power conversion device 2400 is stored in the storage portion 2411b.

Resin as a thermal resistance reduction member is filled between the main body 2010 and the first heat dissipation portion 2411. The filled resin forms a thermal resistance reduction portion 2412.

The thermal resistance reduction portion 2412 is formed to such a height as to cover the first reactor core member 2054a which is the upper end on the second direction side Y2 of the main body 2010, thus sealing the entire main body 2010.

Figure 31:
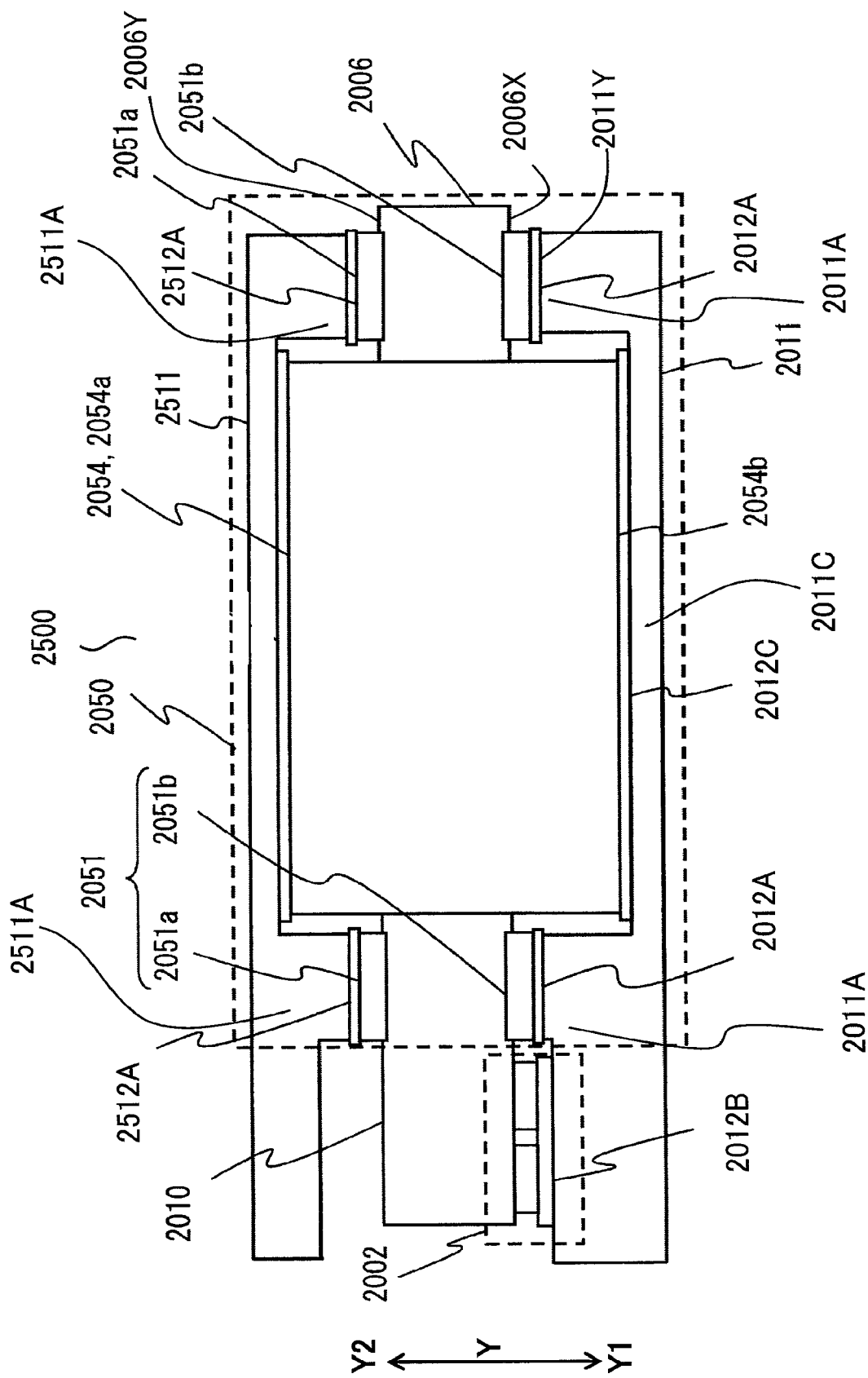
FIG. 31 is a sectional view showing the structure of the power conversion device according to embodiment 20 of the present invention.

In a power conversion device 2500 shown in FIG. 31, a second heat dissipation portion 2511 thereof is fixed on the substrate second surface 2006Y side of a substrate 2006, and is located to be plane-symmetric with the first heat dissipation portion 2011, on the second direction side Y2 of the main body 2010.

The part where the reactor coil 2051a and the reactor coil 2051b of the reactor 2050 are formed abuts on a coil cooling portion 2511A of the second heat dissipation portion 2511 with a first thermal resistance reduction portion 2512A therebetween.

Figure 32:
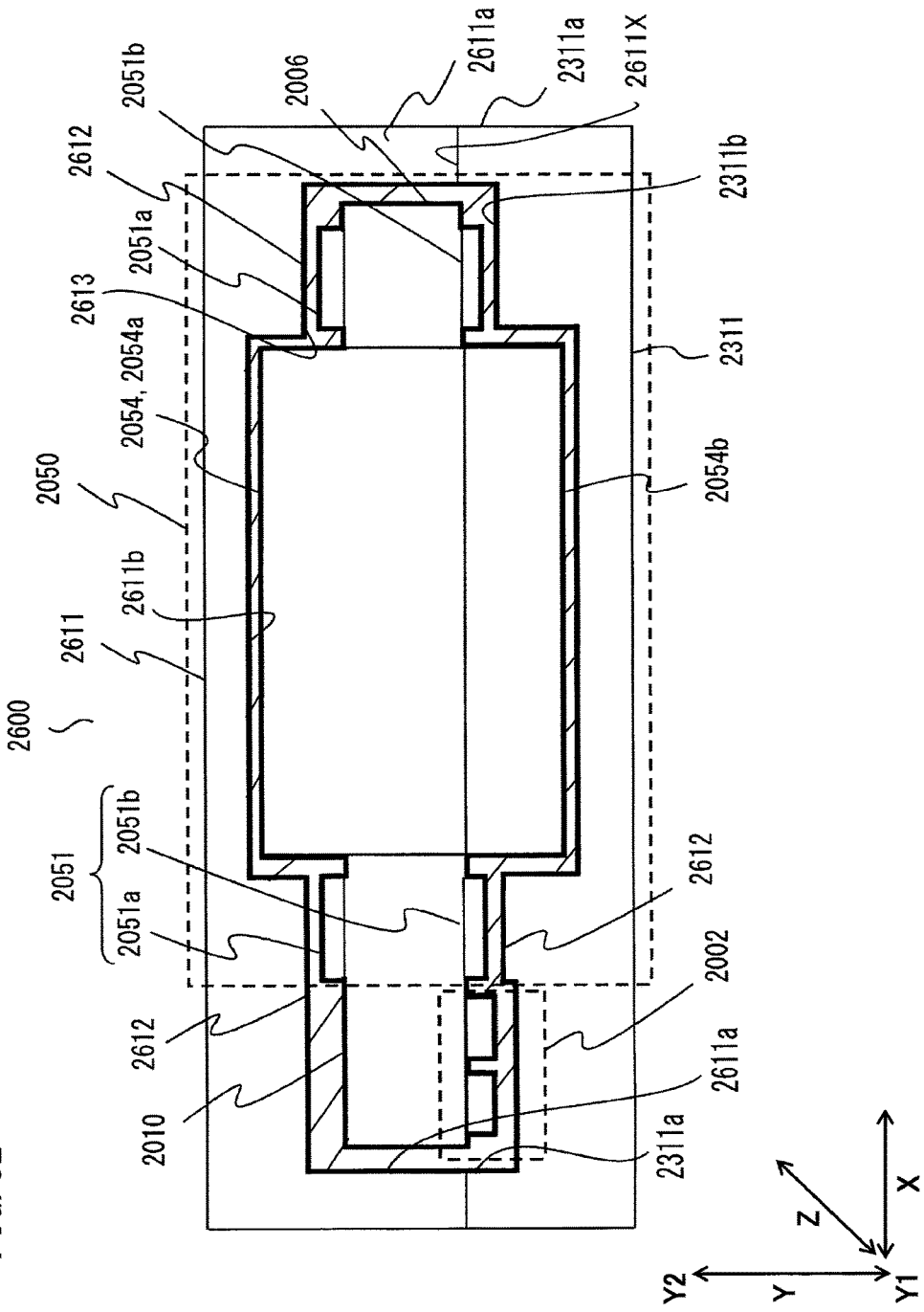
FIG. 32 is a sectional view showing the structure of the power conversion device according to embodiment 20 of the present invention.

In a power conversion device 2600 shown in FIG. 32, a second heat dissipation portion 2611 thereof has protruding portions 2611a protruding toward the first direction side Y1 and formed at end portions on four sides in the width direction X and the depth direction Z on a heat dissipation first surface 2611X on the first direction side Y1. Thus, a storage portion 2611b is formed which is surrounded by the protruding portions 2611a and opens toward the first direction side Y1.

As shown in FIG. 32, the protruding portions 2311a of the first heat dissipation portion 2311 and the protruding portions 2611a of the second heat dissipation portion 2611 abut on each other so as to be opposed to each other in the thickness direction Y. Thus, the storage portion 2311b of the first heat dissipation portion 2311 and the storage portion 2611b of the second heat dissipation portion 2611 form a storage portion 2613.

The main body 2010 of the power conversion device 2600 is stored in the storage portion 2613.

Resin as a thermal resistance reduction member is filled between the main body 2010 and the first heat dissipation portion 2311, and between the main body 2010 and the second heat dissipation portion 2611. The filled resin forms a thermal resistance reduction portion 2612.

Even in the case where the circuit configuration is different from those in the above embodiments or the arrangement structure of the reactor coils is different as described above, by adopting the same arrangement, heat generated at the main body of the power conversion device can be effectively dissipated.

Embodiment 21

Figure 33:
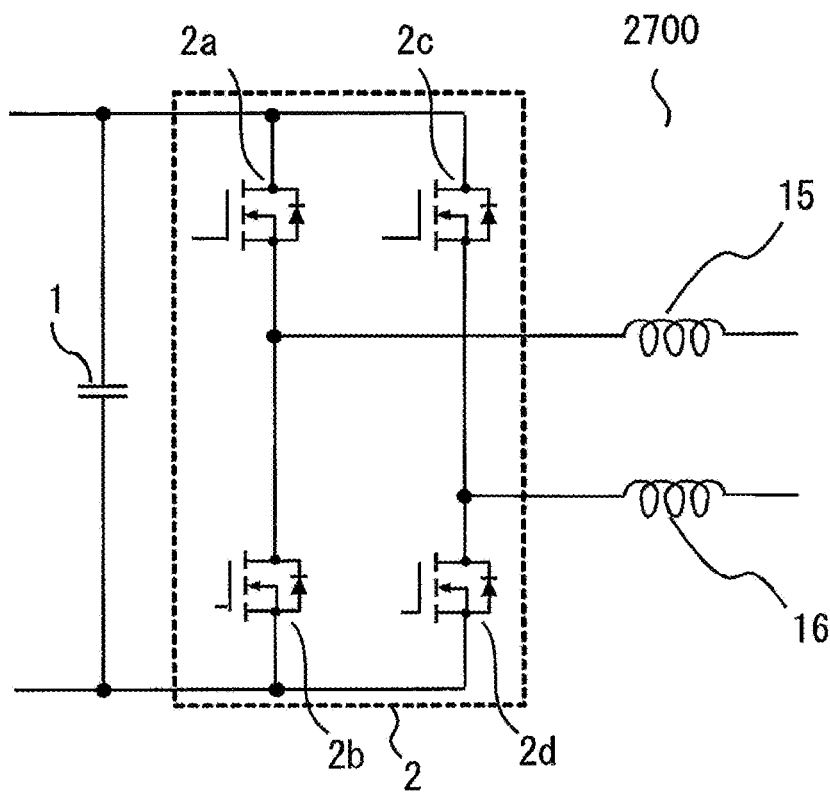
FIG. 33 is a circuit diagram showing a circuit configuration of a power conversion device according to embodiment 21 of the present invention.

FIG. 33 is a circuit diagram showing a circuit of a power conversion device according to embodiment 21.

A power conversion device 2700 includes a reactor 15 and a reactor 16.

One end of the reactor 15 is connected to the connection point between the switching element 2a and the switching element 2b, and the other end is connected to one end of a load (not shown). One end of the reactor 16 is connected to the connection point between the switching element 2b and the switching element 2c, and the other end is connected to the other end of the load (not shown).

The first power conversion unit 2, the reactor 15, and the reactor 16 are mounted on the same substrate as the substrate 6 shown in FIG. 2 and FIG. 3, to form a main body of the power conversion device. The other configurations are the same as in the embodiment shown in FIG. 2 and FIG. 3, and therefore the corresponding components are denoted by the same reference characters and the description thereof is omitted.

Even in the case of configuring a single-phase inverter as described above, by adopting the same arrangement, heat generated at the main body of the power conversion device can be effectively dissipated.

Embodiment 22

Figure 34:
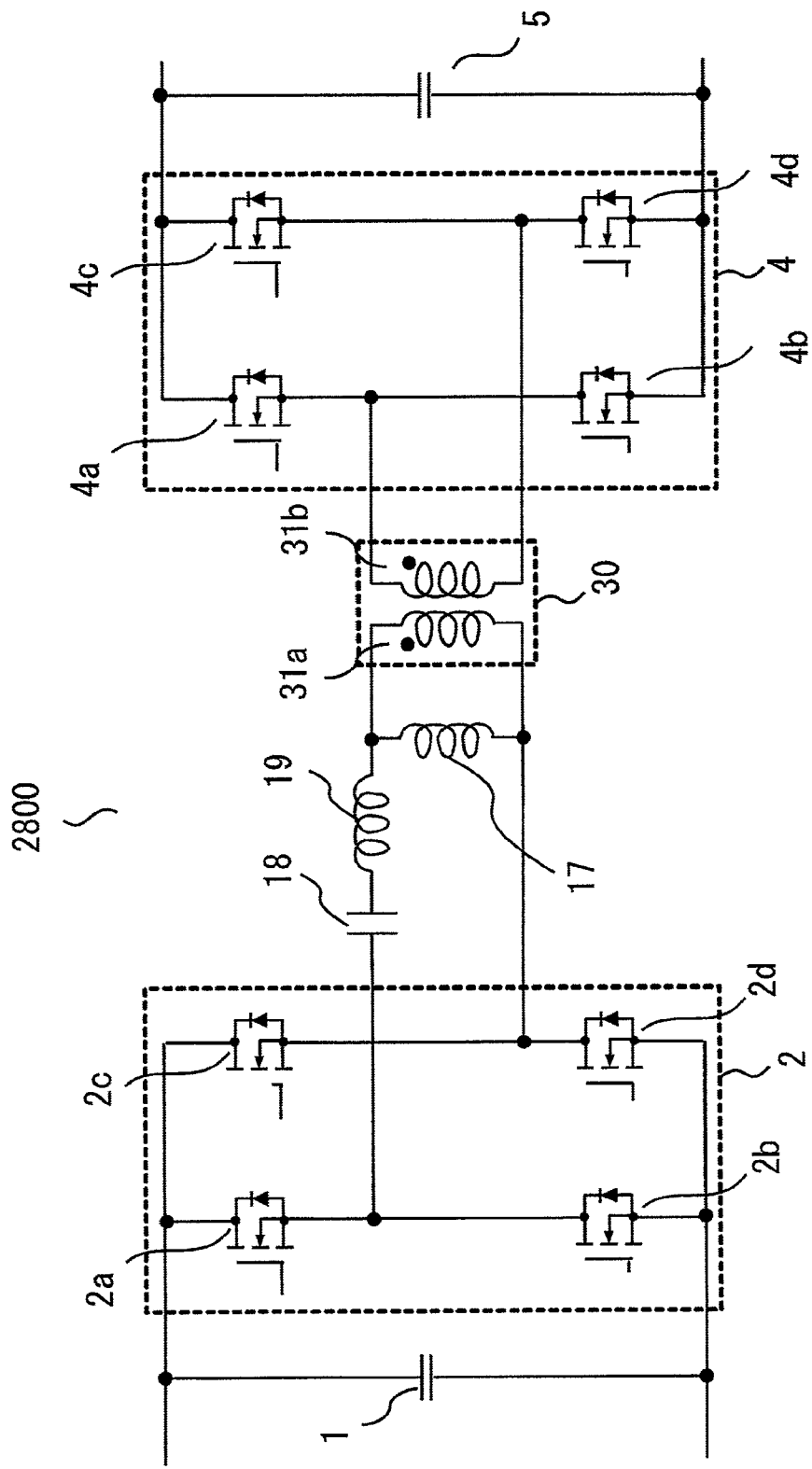
FIG. 34 is a circuit diagram showing a circuit configuration of a power conversion device according to embodiment 22 of the present invention.

FIG. 34 is a circuit diagram showing a circuit of a power conversion device according to embodiment 22.

A power conversion device 2800 includes a reactor 17, a capacitor 18, and a reactor 19. In addition to the circuit shown in FIG. 1, the reactor 17 is connected in parallel to the first transformer coil 31a, and a series circuit of the capacitor 18 and the reactor 19 is connected in series to the first transformer coil 31a.

Thus, it is possible to configure an LLC-type DC-DC converter which performs soft switching operation using exciting current.

The first power conversion unit 2, the reactor 17, the reactor 19, the transformer 30, and the second power conversion unit 4 are mounted on the same substrate as the substrate 6 shown in FIG. 2 and FIG. 3, to form a main body of the power conversion device.

It is noted that the capacitor 1, the capacitor 5, and the capacitor 18 are provided separately from the main body of the power conversion device. The other configurations are the same as in the embodiment shown in FIG. 2 and FIG. 3, and therefore the corresponding components are denoted by the same reference characters and the description thereof is omitted.

Even in the case where the circuit configuration is different from those in the above embodiments as described above, by adopting the same arrangement, heat generated at the main body of the power conversion device can be effectively dissipated.

Embodiment 23

Hereinafter, with reference to the drawings, embodiment 23 of the present invention will be described, focusing on difference from the above embodiment 3. The same parts as those in the above embodiment 3 are denoted by the same reference characters and the description thereof is omitted.

FIG. 35 is an enlarged sectional view showing the part where the first transformer coil 331a and the second transformer coil 331b are formed in a substrate 3006, in a power conversion device according to the present embodiment 23.

The substrate 3006 is a six-layer substrate having six wiring layers 6V laminated in a multilayer form with insulating layers 6Z therebetween.

The first heat dissipation portion 11 is fixed on the substrate first surface 3006X side on the first direction side Y1 of the substrate 3006. The coil cooling portion 11A of the first heat dissipation portion 11 abuts on the part where the first transformer coil 331a and the second transformer coil 331b are formed in the substrate 3006.

As shown in the drawing, in the substrate 3006, the first transformer coil 331a and the second transformer coil 331b are formed in the wiring layers 6V that are near the coil cooling portion 11A, among the six wiring layers 6V.

FIG. 36 shows another configuration example of the power conversion device shown in FIG. 35.

The second heat dissipation portion 811 is fixed on the substrate second surface 3006Y side on the second direction side Y2 of the substrate 3006. Thus, the coil cooling portion 11A of the first heat dissipation portion 11 and the coil cooling portion 811A of the second heat dissipation portion 811 abut on the part where the first transformer coil 331a and the second transformer coil 331b are formed in the substrate 3006, from the first direction side Y1 and the second direction side Y2, respectively.

As shown in the drawing, in the substrate 3006, the first transformer coil 331a is formed in the wiring layers 6V that are near the coil cooling portion 811A. The second transformer coil 331b is formed in the wiring layers 6V that are near the coil cooling portion 11A.

In the power conversion device of the present embodiment configured as described above, the first transformer coil 331a and the second transformer coil 331b are formed in wiring layers that are near the coil cooling portions 11A, 811A, among the plurality of wiring layers. Thus, in the substrate 3006, the distance between the first transformer coil 331a and the coil cooling portion 811A, and the distance between the second transformer coil 331b and the coil cooling portion 11A, are shortened. As a result, thermal resistance due to the substrate 3006 is reduced, whereby heat dissipation property can be improved. Thus, increase in the temperature of the power conversion device can be further suppressed.

In the above description, the six-layer substrate having six wiring layers 6V has been shown. However, without limitation thereto, a substrate having two or more layers is applicable in the same manner. For example, in the case of two-layer substrate, the first transformer coil 331a and the coil cooling portion 811A may be arranged side by side at the wiring layer that is near the coil cooling portion, among the two wiring layers 6V.

Embodiment 24

Hereinafter, with reference to FIG. 37 to FIG. 42, embodiment 24 of the present invention will be described, focusing on difference from the above embodiments. The same parts as those in the above embodiments are denoted by the same reference characters and the description thereof is omitted.

For example, a power conversion device using comparatively large power such as an on-vehicle charger for charging an on-vehicle high-voltage battery used in an electric car or an on-vehicle step-down converter for charging an on-vehicle lead battery, has a problem in vibration resistance of the power conversion device, in addition to dissipation of heat generated at the main body of the power conversion device as shown in the above embodiments.

The power conversion device of the present embodiment enables improvement in vibration resistance of the power conversion devices shown in the above embodiments and enables application to an electric car or the like that requires vibration resistance.

Figure 37:
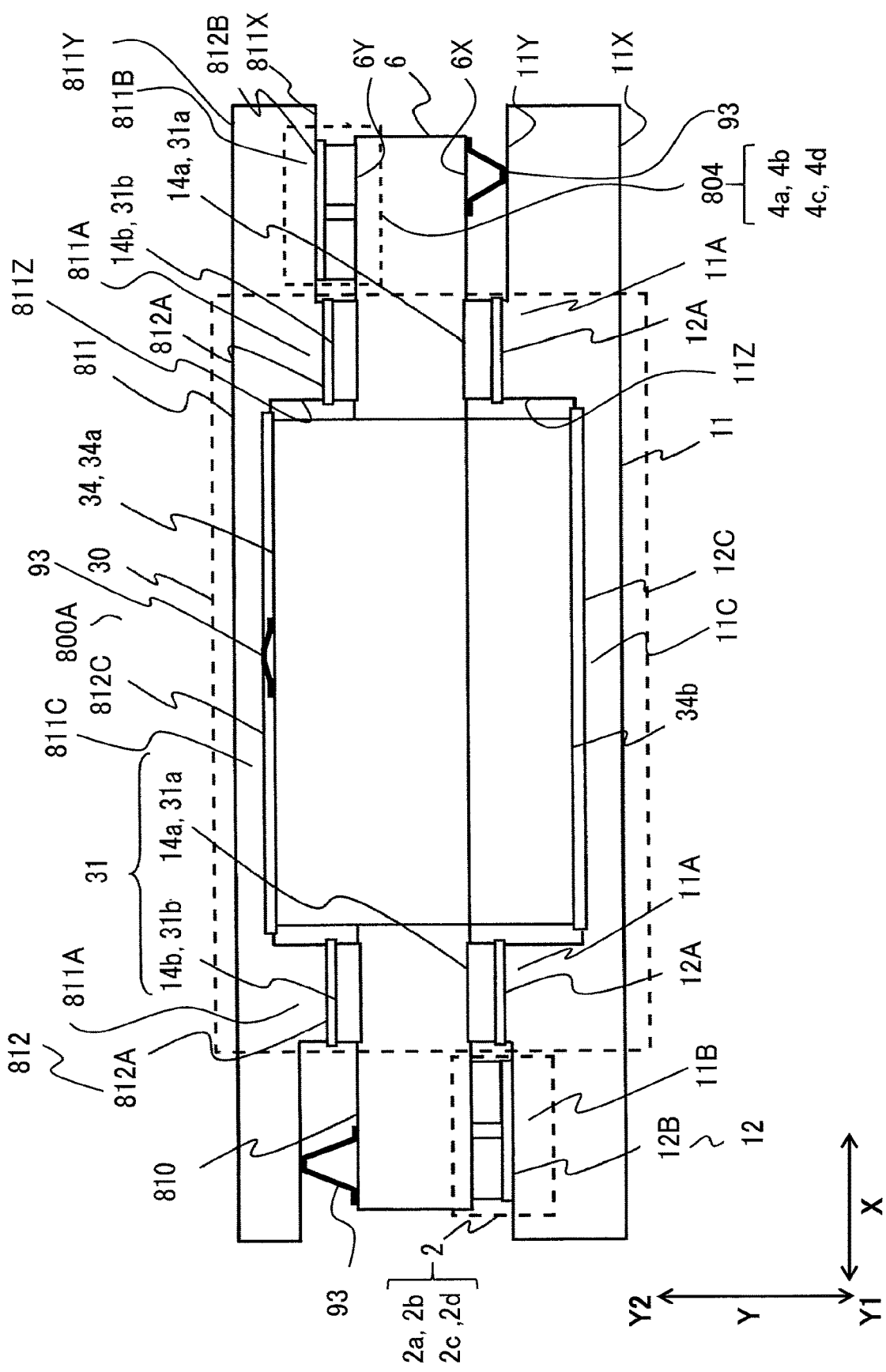
FIG. 37 is a sectional view showing the structure of a power conversion device according to embodiment 24 of the present invention.

FIG. 37 is a sectional view showing the structure of a power conversion device 800A according to embodiment 24.

The power conversion device 800A is obtained by providing a damping spring 93 to the power conversion device 800 shown in FIG. 10 in embodiment 8.

As shown in FIG. 37, in the power conversion device 800A of the present embodiment, damping springs 93 are provided in a gap between the heat dissipation first surface 811X of the second heat dissipation portion 811 and the substrate second surface 6Y of the substrate 6, and a gap between the heat dissipation first surface 811X of the second heat dissipation portion 811 and the end on the second direction side Y2 of the first transformer core member 34a. The substrate 6 and the transformer core 34 are fixed to the second heat dissipation portion 811 via these damping springs 93.

Further, in the power conversion device 800A of the present embodiment, a damping spring 93 is provided in a gap between the heat dissipation second surface 11Y of the first heat dissipation portion 11 and the substrate first surface 6X of the substrate 6. The substrate 6 is fixed to the first heat dissipation portion 11 via this damping spring 93.

For example, in the case of using the second heat dissipation portion not having an element cooling portion, a gap is formed between the main body and the second heat dissipation portion, on the second direction side Y2 of the main body. The damping spring 93 is provided in the gap formed as described above, to fix the main body and the second heat dissipation portion with each other, thereby improving vibration resistance.

Further, also in the case where a gap is formed between the first heat dissipation portion and the main body, the damping spring 93 is provided in the gap, to fix the main body and the first heat dissipation portion with each other, thereby improving vibration resistance.

As described above, the damping springs 93 are provided between the main body 810 and at least one of the first heat dissipation portion 11 and the second heat dissipation portion 811, whereby the main body 810 is protected from vibration and vibration resistance of the power conversion device 800A can be improved.

Figure 38:
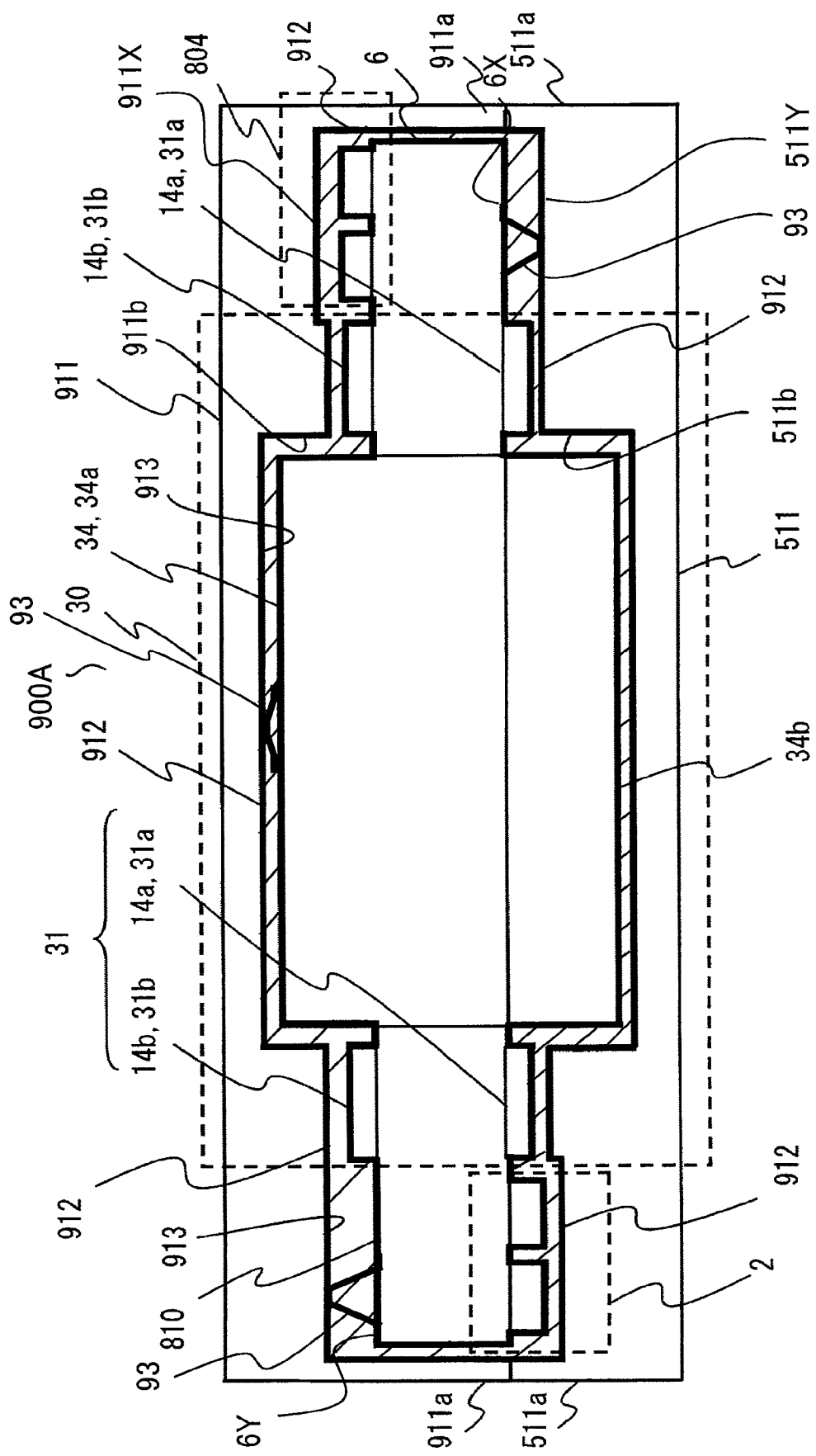
FIG. 38 is a sectional view showing the structure of the power conversion device according to embodiment 24 of the present invention.

FIG. 38 is a sectional view showing the structure of a power conversion device 900A different from that shown in FIG. 37.

The power conversion device 900A is obtained by providing a damping spring 93 to the power conversion device 900 shown in FIG. 11 in embodiment 9.

In the thermal resistance reduction portion 912, damping springs 93 are provided in a gap between the heat dissipation first surface 911X of the second heat dissipation portion 911 and the substrate second surface 6Y of the substrate 6, and a gap between the heat dissipation first surface 911X of the second heat dissipation portion 911 and the end on the second direction side Y2 of the first transformer core member 34a.

Further, a damping spring 93 is provided in a gap between the heat dissipation second surface 511Y of the first heat dissipation portion 11 and the substrate first surface 6X of the substrate 6. Then, a thermal resistance reduction member is filled in the storage portion 511b, whereby the thermal resistance reduction portion 912 is formed in the gaps between the main body 810, and the first heat dissipation portion 11 and the second heat dissipation portion 911.

As described above, the damping springs 93 are provided in the thermal resistance reduction portion 912 formed by resin, whereby the elasticity characteristic of the thermal resistance reduction portion 912 can be assisted and the main body 810 can be protected. Thus, vibration resistance of the power conversion device can be improved.

In the following FIG. 39 to FIG. 42, examples in which damping springs are provided to the power conversion devices including the second heat dissipation portion as shown in embodiments 17, 18, 25, and 26, will be described.

Figure 39:
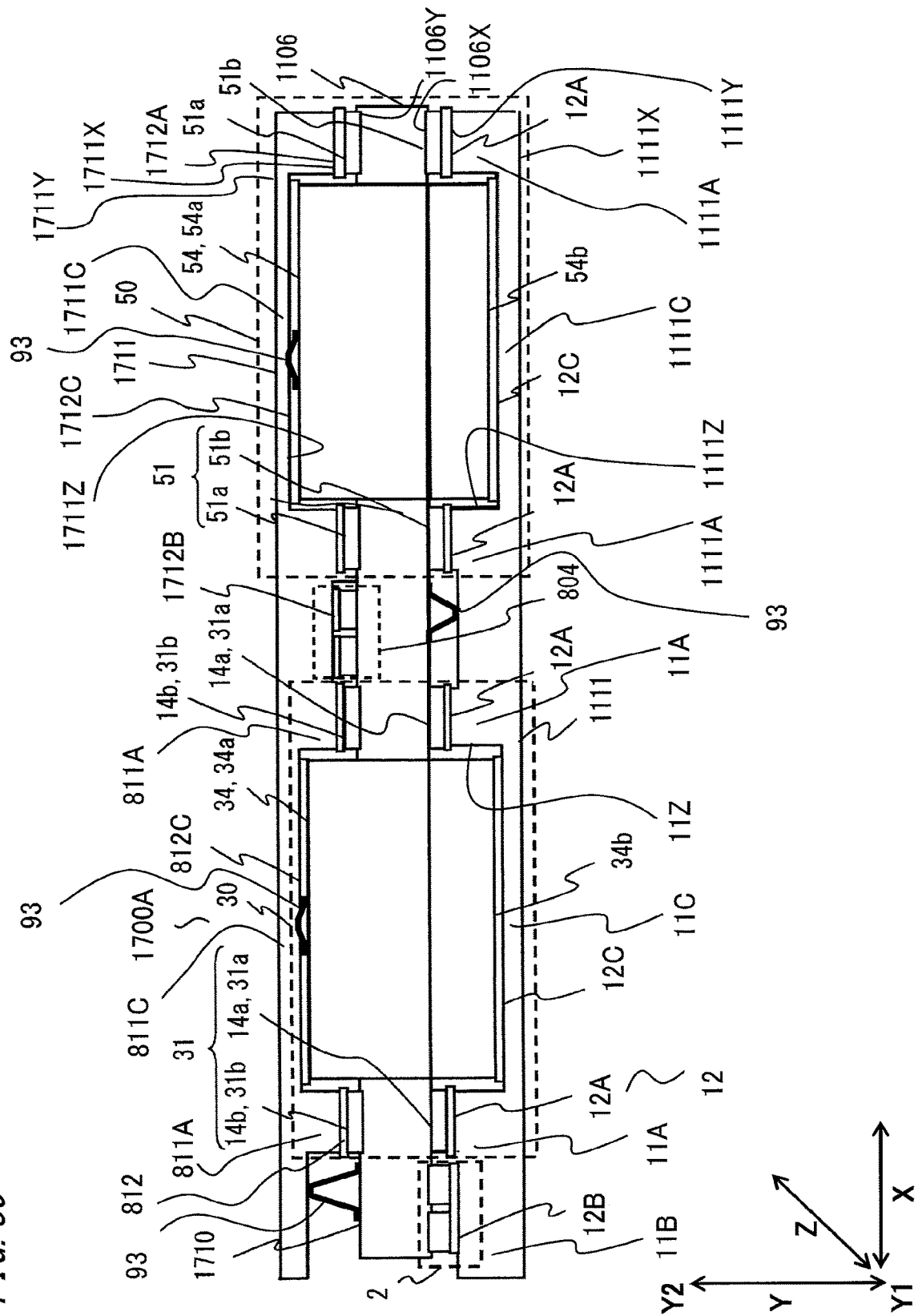
FIG. 39 is a sectional view showing the structure of the power conversion device according to embodiment 24 of the present invention.

FIG. 39 is a sectional view showing the structure of a power conversion device 1700A of the present embodiment, which is obtained by providing a damping spring to the power conversion device 1700 of embodiment 17.

Figure 40:
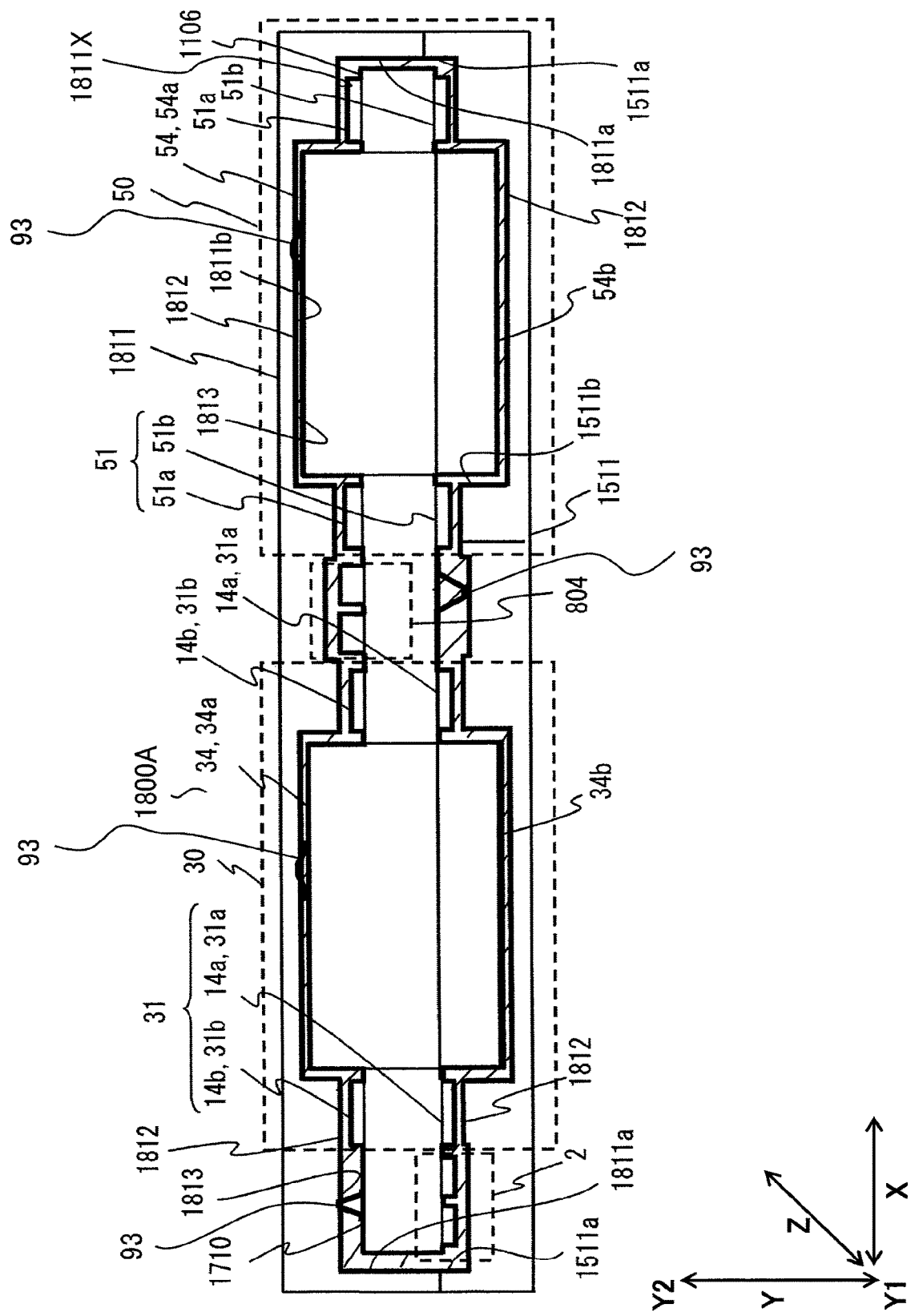
FIG. 40 is a sectional view showing the structure of the power conversion device according to embodiment 24 of the present invention.

FIG. 40 is a sectional view showing the structure of a power conversion device 1800A of the present embodiment, which is obtained by providing a damping spring to the power conversion device 1800 of embodiment 18.

As shown in the power conversion devices 1700A and 1800A in FIG. 39 and FIG. 40, the damping springs 93 are provided in the gap between the main body 1710 and the second heat dissipation portion 1711, 1811 in the power conversion device including the second heat dissipation portion, whereby the main body 1710 can be fixed to the second heat dissipation portion 1711, 1811.

Further, in the case where a gap is formed between the main body 1710 and the first heat dissipation portion 1111, 1511, the damping spring 93 is provided in the gap, whereby the main body 1710 can be fixed to the first heat dissipation portion 1111, 1511. Thus, vibration resistance of the power conversion device can be improved.

Figure 41:
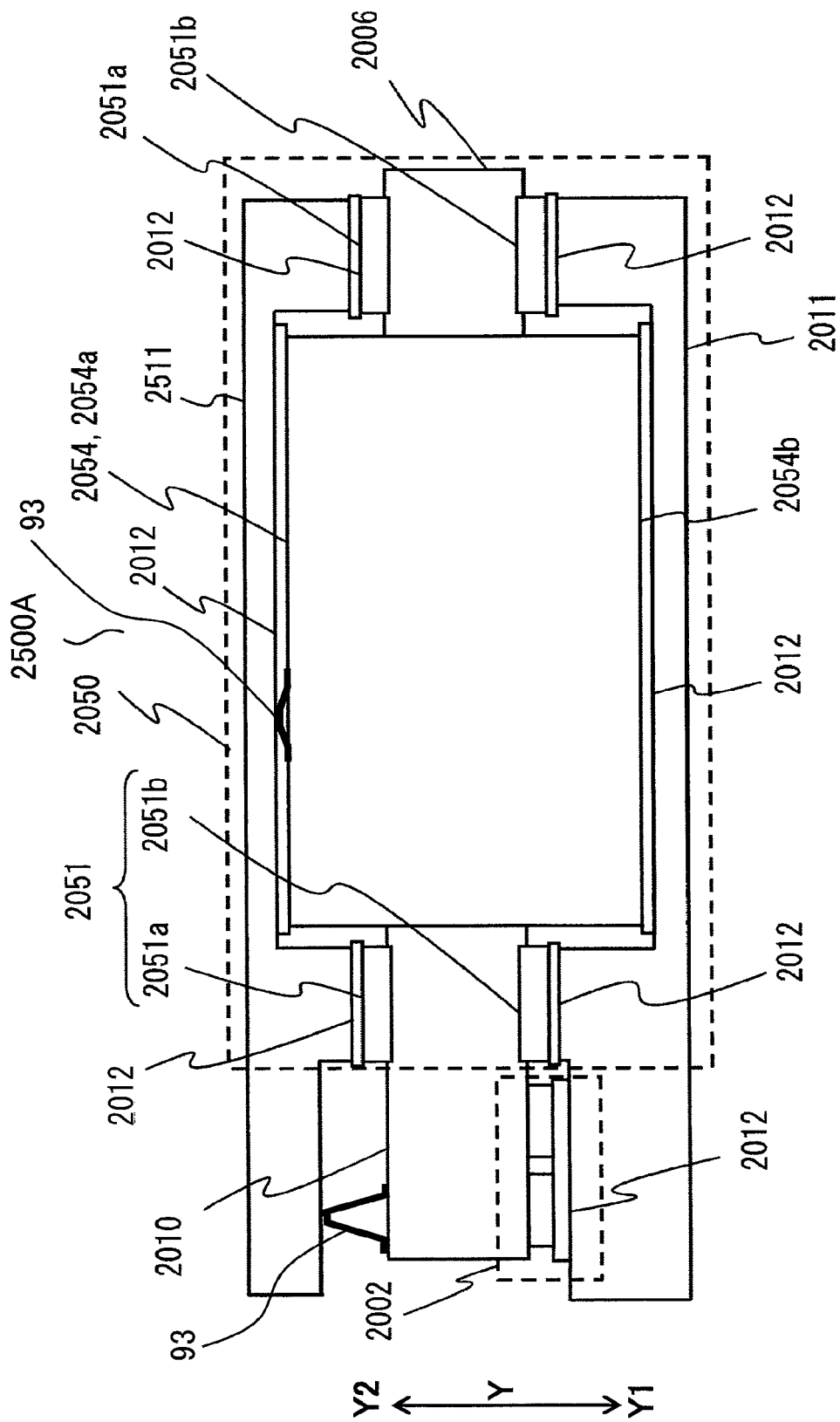
FIG. 41 is a sectional view showing the structure of the power conversion device according to embodiment 24 of the present invention.

FIG. 41 is a sectional view showing the structure of a power conversion device 2500A of the present embodiment, which is obtained by providing a damping spring to the power conversion device 2500 of embodiment 25.

Figure 42:
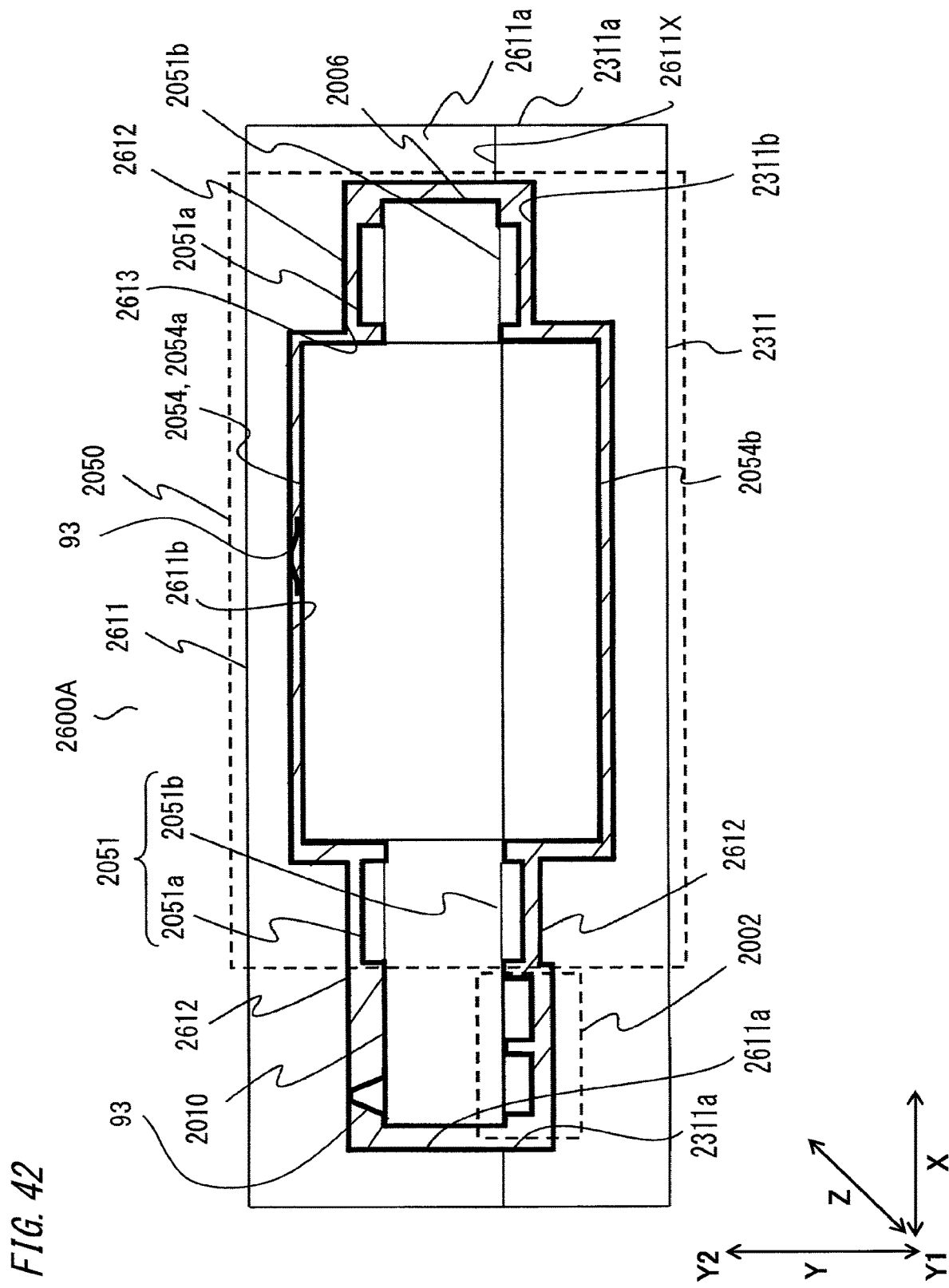
FIG. 42 is a sectional view showing the structure of the power conversion device according to embodiment 24 of the present invention.

FIG. 42 is a sectional view showing the structure of a power conversion device 2600A of the present embodiment, which is obtained by providing a damping spring to the power conversion device 2600 of embodiment 26.

In the power conversion devices 2500A and 2600A shown in FIG. 41 and FIG. 42, damping springs 93 are provided only in a gap between a second heat dissipation portion 2511, 2611 and the main body 2010, while no damping spring 93 is provided in a gap between the first heat dissipation portion 2011, 2311 and the main body 2010. In the case where the first heat dissipation portion has an element cooling portion, the gap between the first heat dissipation portion and the main body is small, and thus the main body can be held so as to be protected from vibration, by the first heat dissipation portion alone. Therefore, it is possible to ensure vibration resistance by providing damping springs only between the main body and the second heat dissipation portion. Thus, the number of used damping springs can be decreased.

The positions where the damping springs 93 are provided and the number of the damping springs 93 are not limited to the above examples. The damping spring 93 may be provided between the main body and at least one of the first heat dissipation portion and the second heat dissipation portion, so as to protect the main body of the power conversion device and improve the vibration damping performance of the power conversion device.

In the above embodiments, the switching elements and the diode elements are formed from silicon. However, they may be formed from a wide bandgap semiconductor having a greater bandgap than silicon. Examples of wide bandgap semiconductors include silicon carbide, gallium-nitride-based material, and diamond.

The switching elements and the diode elements formed from such a wide bandgap semiconductor have a high withstand voltage and a high permissible current density. Therefore, the switching elements and the diode elements can be downsized, and by using the downsized switching elements and diode elements, it is possible to reduce the size of a semiconductor module in which these elements are incorporated.

In addition, since the heat resistance thereof is also high, a heat dissipation fin of a heatsink can be downsized and a water-cooling unit can be changed into an air-cooling type, whereby it is possible to further reduce the size of the semiconductor module.

Further, since the power loss is also low, the efficiency of the switching elements and the diode elements can be enhanced, leading to enhancement of the efficiency of the semiconductor module.

It is desirable that both of the switching element and the diode element are formed from a wide bandgap semiconductor, but either one of the switching element and the diode element may be formed from a wide bandgap semiconductor, and also in this case, the same effect is provided.

It is noted that, within the scope of the present invention, the above embodiments may be freely combined with each other, or each of the above embodiments may be modified or simplified as appropriate.

The invention claimed is:

1. A power conversion device comprising:
   a main body including a substrate to which a power conversion unit and a coil are provided; and a first heat dissipation portion which holds the substrate and dissipates heat of the substrate, wherein
the substrate is formed by one sheet,
the power conversion unit includes a first power conversion unit and a second power conversion unit,
the power conversion unit includes a plurality of power conversion elements,
the plurality of power conversion elements include first power conversion elements and second power conversion elements,
the first power conversion unit includes the first power conversion elements, and performs DC-to-AC power conversion,
the second power conversion unit includes the second power conversion elements, and performs AC-to-DC power conversion,
at least one of the power conversion elements is fixed to a substrate first surface, of the substrate, which is on a first direction side in a thickness direction of the substrate,
the coil includes a first transformer coil and a second transformer coil and is formed integrally with the substrate,
the first transformer coil is connected to the first power conversion unit,
the second transformer coil is connected to the second power conversion unit,
energy is passed and received between the first transformer coil and the second transformer coil,
at the main body, the first transformer coil and the second transformer coil are formed concentrically with each other,
the main body includes a reactor having a reactor coil which is formed integrally with the substrate and which is connected to the second power conversion unit,
the first heat dissipation portion is fixed to the substrate first surface,
a heat dissipation second surface, of the first heat dissipation portion, which is on a second direction side opposite to the first direction side has: an element cooling portion opposed to and abutting on the power conversion element fixed to the substrate first surface; and a coil cooling portion opposed to and abutting on a part where the coil is formed, of the substrate, and opposed to and abutting on the part where the reactor coil is formed, of the substrate.

2. The power conversion device according to claim 1, wherein
the substrate has an opening which opens in the thickness direction of the substrate, at a center of the coil,
the main body has a core provided to the opening and serving as a magnetic core for the coil, and
the heat dissipation second surface of the first heat dissipation portion has a core cooling portion opposed to and abutting on the core.

3. The power conversion device according to claim 1, further comprising a second heat dissipation portion which is fixed to a substrate second surface on the second direction side of the substrate and which dissipates heat of the substrate, wherein
a heat dissipation first surface on the first direction side of the second heat dissipation portion has a coil cooling portion opposed to and abutting on the part where the coil is formed, of the substrate.

4. The power conversion device according to claim 1, further comprising a second heat dissipation portion fixed to a substrate second surface on the second direction side of the substrate, wherein
at least one of the power conversion elements is fixed to the substrate second surface, and
a heat dissipation first surface on the first direction side of the second heat dissipation portion has: a coil cooling portion opposed to and abutting on the part where the coil is formed, of the substrate; and an element cooling portion opposed to and abutting on the at least one power conversion element at the substrate second surface.

5. The power conversion device according to claim 1, wherein
a first thermal resistance reduction portion having heat transfer property is provided between the coil cooling portion and the part where the coil is formed, of the substrate.

6. The power conversion device according to claim 1, wherein
a first thermal resistance reduction portion having heat transfer property is provided between the coil cooling portion and the part where the coil is formed, of the substrate, and
a second thermal resistance reduction portion having heat transfer property is provided between the element cooling portion and the power conversion element.

7. The power conversion device according to claim 5, wherein
the first heat dissipation portion has a protruding portion protruding toward the second direction side, on the heat dissipation second surface of the first heat dissipation portion, and has a storage portion surrounded by the protruding portion,
the main body is stored in the storage portion, and
the first thermal resistance reduction portion is formed by a thermal resistance reduction member filled in the storage portion.

8. The power conversion device according to claim 6, wherein
the first heat dissipation portion has a protruding portion protruding toward the second direction side, on a second surface side of the first heat dissipation portion, and has a storage portion surrounded by the protruding portion,
the main body is stored in the storage portion, and
the first thermal resistance reduction portion and the second thermal resistance reduction portion are integrally formed by a thermal resistance reduction member filled in the storage portion.

9. The power conversion device according to claim 7, wherein
an entirety of the main body is sealed by the thermal resistance reduction member filled in the storage portion.

10. The power conversion device according to claim 1, wherein
the substrate includes a wiring layer in which a conductor pattern is formed, and
the coil is formed by the conductor pattern.

11. The power conversion device according to claim 10, wherein
the substrate is a multilayer substrate having a plurality of the wiring layers laminated in a multilayer form with an insulating layer therebetween, and the coil is formed in the wiring layer that is near the coil cooling portion, among the plurality of wiring layers.

12. The power conversion device according to claim 10, wherein
the substrate has a resist-absent region on which no solder resist is applied, on the conductor pattern forming the coil.

13. The power conversion device according to claim 2, wherein
the first heat dissipation portion has, in the heat dissipation second surface, a first recessed portion recessed toward the first direction side and storing the core.

14. The power conversion device according to claim 1, wherein
the second power conversion elements are unidirectional conduction elements.

15. The power conversion device according to claim 1, wherein
the plurality of power conversion elements are a first switching element and a second switching element,
the power conversion unit is configured by connecting the first switching element and the second switching element in series to each other, and
one end of the coil is connected to a connection point betwen the first switching element and the second switching element.

16. The power conversion device according to claim 3, wherein
a damping spring is provided between the main body and at least one of the first heat dissipation portion and the second heat dissipation portion.

17. A power conversion device comprising:
a main body including a substrate to which a power conversion unit and a coil are provided; and
a first heat dissipation portion which holds the substrate and dissipates heat of the substrate, wherein
the substrate is formed by one sheet,
the coil is formed integrally with the substrate and connected to the power conversion unit,
the first heat dissipation portion is fixed to a substrate first surface, of the substrate, which is on a first direction side in a thickness direction of the substrate,
a heat dissipation second surface, of the first heat dissipation portion, which is on a second direction side opposite to the first direction side has a coil cooling portion opposed to and abutting on a part where the coil is formed, of the substrate,
the power conversion unit includes a plurality of power conversion elements,
at least one of the power conversion elements is fixed to the substrate first surface,
the heat dissipation second surface of the first heat dissipation portion has an element cooling portion opposed to and abutting on the power conversion element fixed to the substrate first surface, wherein
the coil is connected to the power conversion elements of the power conversion unit,
the power conversion element fixed to the substrate first surface has a heat dissipation route through which heat is dissipated from the power conversion element via the coil of the substrate to the coil cooling portion, and a heat dissipation route through which heat is dissipated from the power conversion element to the element cooling portion.

18. The power conversion device according to claim 2, wherein
the coil is connected to the power conversion elements of the power conversion unit,
the at least one power conversion element fixed to the substrate first surface has a heat dissipation route through which heat is dissipated from the at least one power conversion element via the coil of the substrate to the coil cooling portion, and a heat dissipation route through which heat is dissipated from the at least one power conversion element to the element cooling portion.

19. The power conversion device according to claim 3, wherein
the coil is connected to the power conversion elements of the power conversion unit,
the at least one power conversion element fixed to the substrate first surface has a heat dissipation route through which heat is dissipated from the at least one power conversion element via the coil of the substrate to the coil cooling portion, and a heat dissipation route through which heat is dissipated from the at least one power conversion element to the element cooling portion.

* * * * *